(12) United States Patent
Ichihara et al.

(10) Patent No.: US 7,455,951 B2
(45) Date of Patent: Nov. 25, 2008

(54) INFORMATION RECORDING MEDIUM AND ITS MANUFACTURING METHOD

(75) Inventors: Katsutaro Ichihara, Yokohama (JP); Sumio Ashida, Edogawa-ku (JP); Keiichiro Yusu, Yokohama (JP); Toshihiko Nagase, Shibuya-ku (JP); Naomasa Nakamura, Yokohama (JP)

(73) Assignee: Kabushiki Kaisha Toshiba, Kawasaki-shi (JP)

( * ) Notice: Subject to any disclaimer, the term of this patent is extended or adjusted under 35 U.S.C. 154(b) by 0 days.

(21) Appl. No.: 11/389,347

(22) Filed: Mar. 27, 2006

(65) Prior Publication Data
US 2006/0177769 A1    Aug. 10, 2006

Related U.S. Application Data

(63) Continuation of application No. 10/359,616, filed on Feb. 7, 2003, now abandoned, which is a continuation of application No. 09/340,011, filed on Jun. 28, 1999, now Pat. No. 6,554,972.

(30) Foreign Application Priority Data

Jun. 26, 1998  (JP) ............................... 1998-181156
Mar. 30, 1999  (JP) ................................. 1999-88010

(51) Int. Cl.
    *G11B 7/24* (2006.01)
(52) U.S. Cl. .................. 430/270.13; 430/945; 369/284; 428/64.4; 428/64.5

(58) Field of Classification Search ....................... None
See application file for complete search history.

(56) References Cited

U.S. PATENT DOCUMENTS

| 4,310,614 | A | 1/1982 | Connel et al. |
| 4,889,746 | A | 12/1989 | Utsumi et al. |
| 4,947,372 | A | 8/1990 | Koshino et al. |
| 4,954,379 | A | 9/1990 | Nishida et al. |
| 5,395,735 | A | 3/1995 | Nagata et al. |
| 5,431,978 | A | 7/1995 | Nakamura et al. |

(Continued)

FOREIGN PATENT DOCUMENTS

JP          63-058633          3/1988

(Continued)

OTHER PUBLICATIONS

Kato et al. Jap. J. Appl. Phys.Pt 1, vol. 38(3B) pp. 1707-1709 (Mar. 1999).*

(Continued)

*Primary Examiner*—Martin J Angebranndt
(74) *Attorney, Agent, or Firm*—Oblon, Spivak, McClelland, Maier & Neustadt, P.C.

(57) ABSTRACT

A phase change recording medium comprising an as-deposited first recording layer configured to undergo a reversible phase change between an amorphous state and a crystalline state due to light irradiation and thereby change an optical characteristic. The as-deposited first recording layer includes a plurality of fine nuclei having an average size of 0.5 nm to 4 nm in the amorphous state.

2 Claims, 26 Drawing Sheets

U.S. PATENT DOCUMENTS

| | | | |
|---|---|---|---|
| 5,505,835 | A | 4/1996 | Sakaue et al. |
| 5,688,574 | A | 11/1997 | Tamura et al. |
| 5,750,228 | A | 5/1998 | Sakaue et al. |
| 5,912,104 | A | 6/1999 | Hirotsune et al. |
| 6,071,587 | A | 6/2000 | Yoshinari et al. |
| 6,167,021 | A | 12/2000 | Yoshida et al. |
| 6,226,258 | B1 * | 5/2001 | Tominaga et al. ........... 369/283 |
| 6,554,972 | B1 | 4/2003 | Ichihara et al. |

FOREIGN PATENT DOCUMENTS

| | | |
|---|---|---|
| JP | 63-175242 | 7/1988 |
| JP | 05-094647 | 4/1993 |
| JP | 6-12670 | 1/1994 |
| JP | 07-093807 | 4/1995 |
| JP | 09-320135 | 12/1997 |
| JP | 11-096554 | 4/1999 |

OTHER PUBLICATIONS

Hirotsune et al., "New phase change rewritable optical reocriding film . . . " Appl. Phys. Lett., vol. 66(8) pp. 2312-2314 (May 1995).*

Ohshima, "Structural analysis and crystallization studies of germanium-antimony-tellurium,sputtered films on different underlayers", J. Appl. Phys., vol. 83(10) pp. 5244-5250 (May 1998).*

Yamada et al., "Rapid Phase Transitions of GeTe-Sb2Te3 Pseudobinary Amorphous Thin Films for Optical Disk Memory", J. Appl. Phys. vol. 69(5) pp. 2849-2856.

Hong et al., "Optical Properties and Lattice Images of Phase Change Optical Disks Laser Annealed at Dynamic Conditions", Proc. SPIE 3109 pp. 38-41 (047/1977).

Mao et al., "The Structure and Crystallization Characteristics of Phase Change Optical Recording Material Ge1Sb2Te4)", J. Appl. Phys. vol. 78(4) pp. 2338-2342 (Aug. 1995).

* cited by examiner

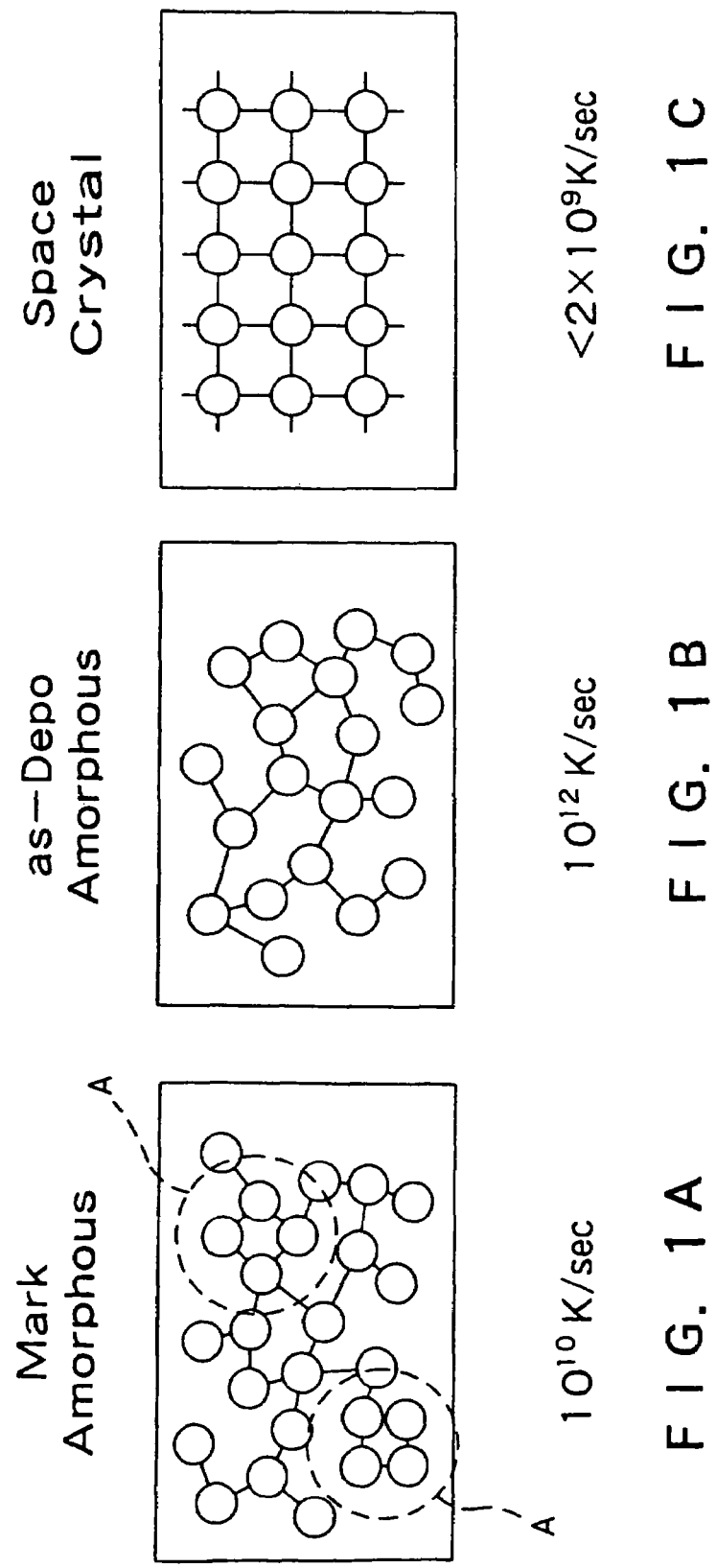

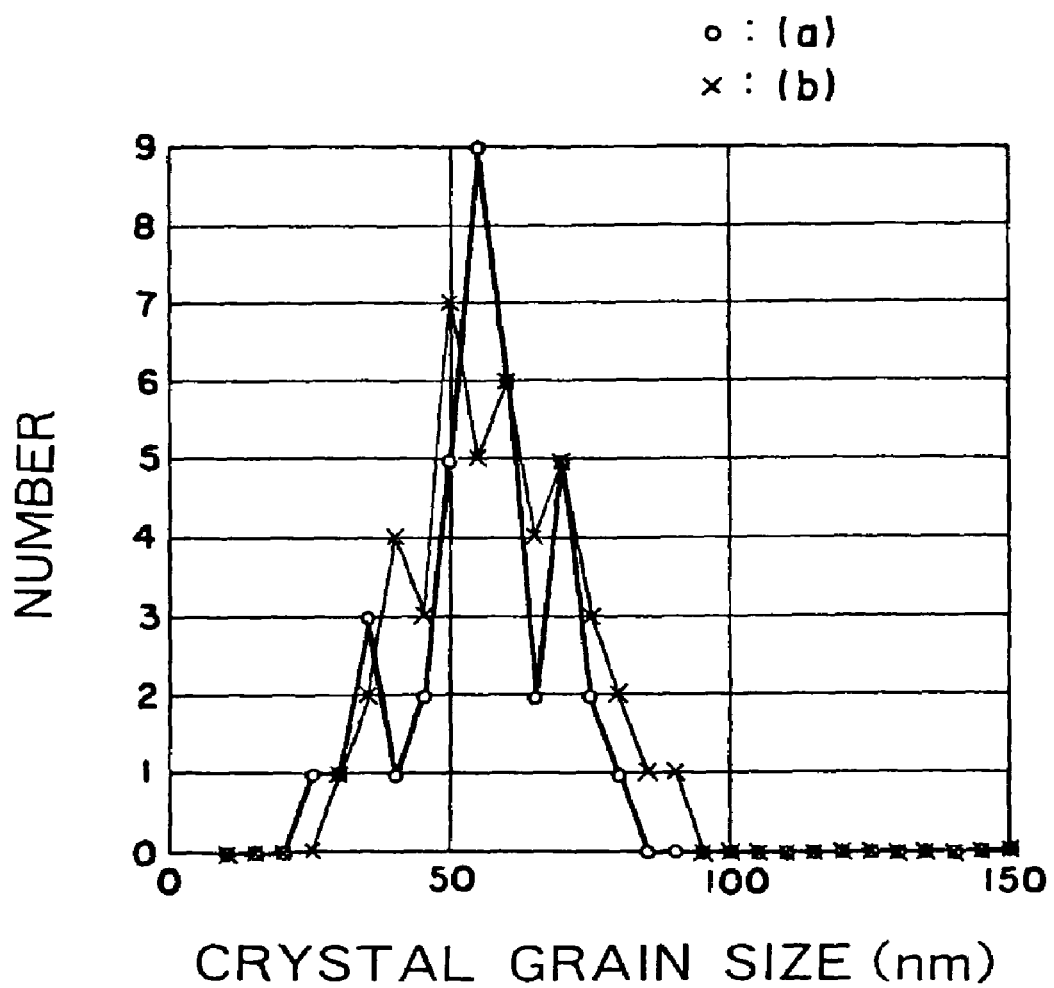
F I G. 5

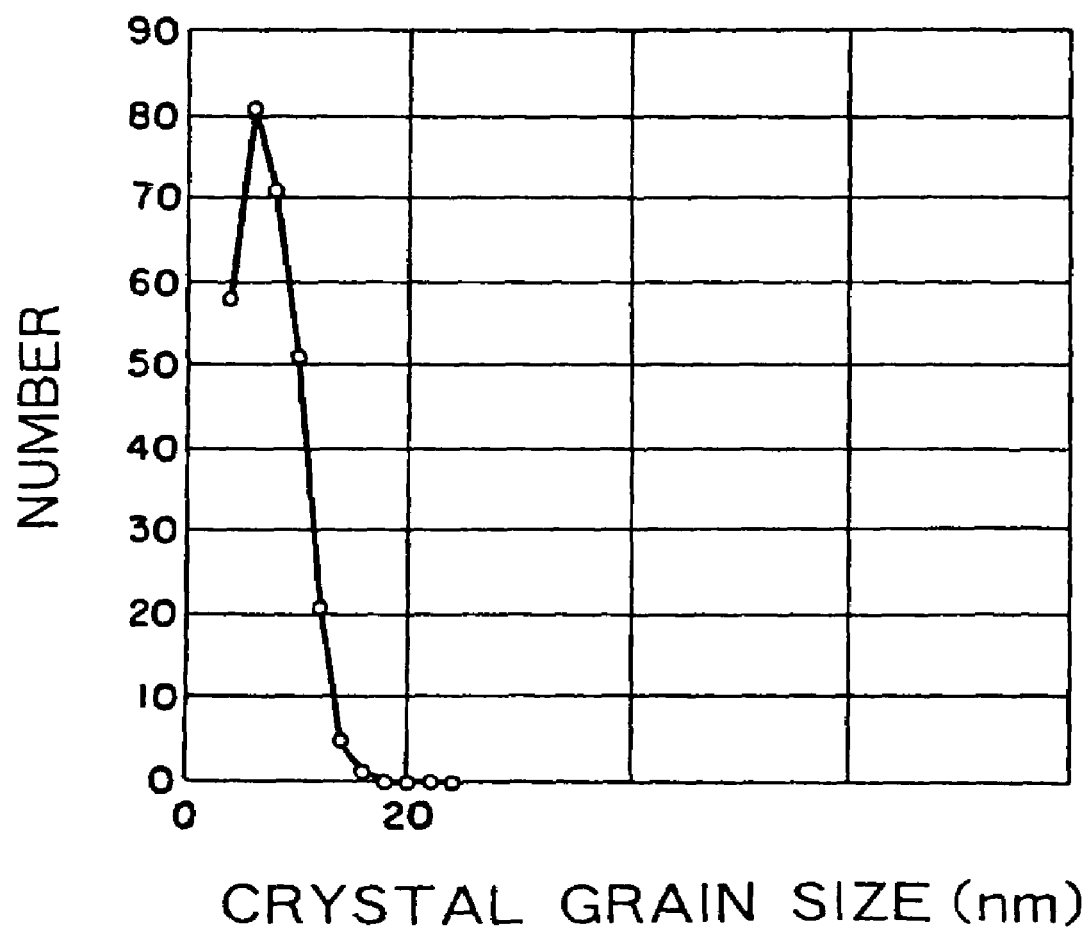
F I G. 6

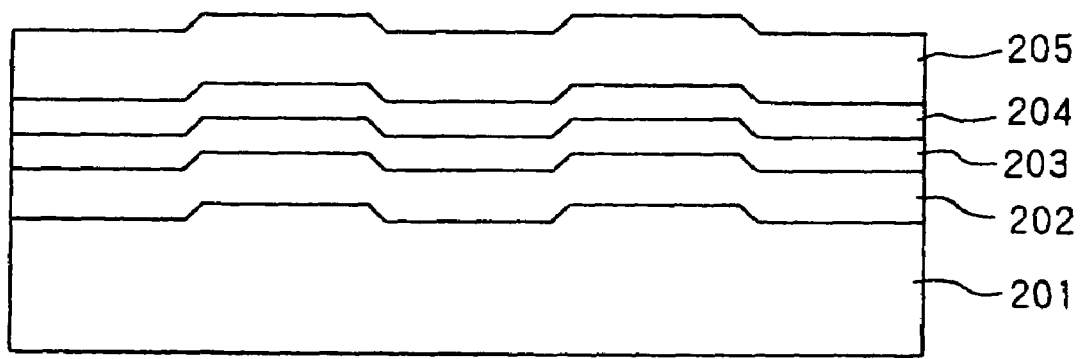
F I G. 7

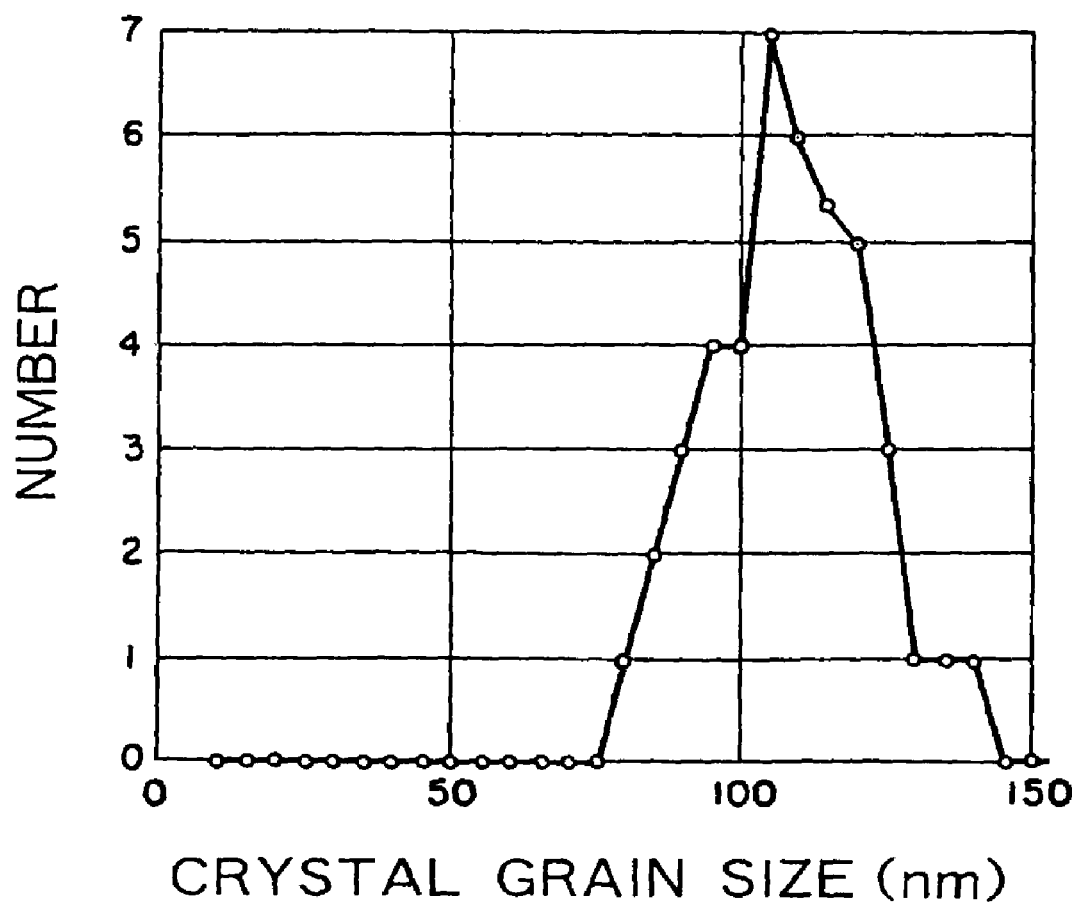
F I G. 8

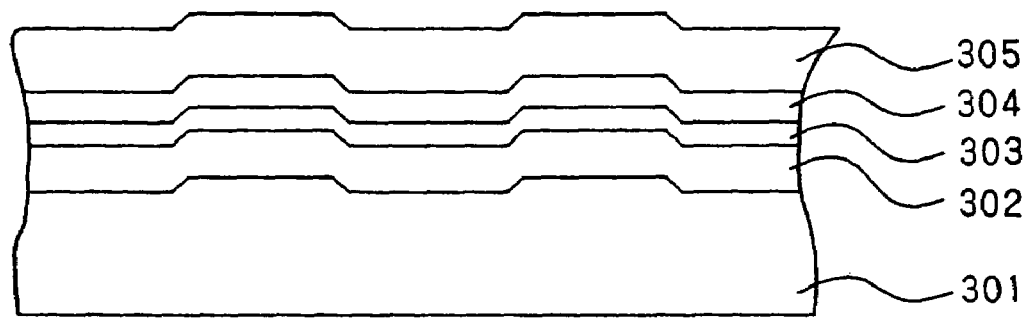
F I G. 9
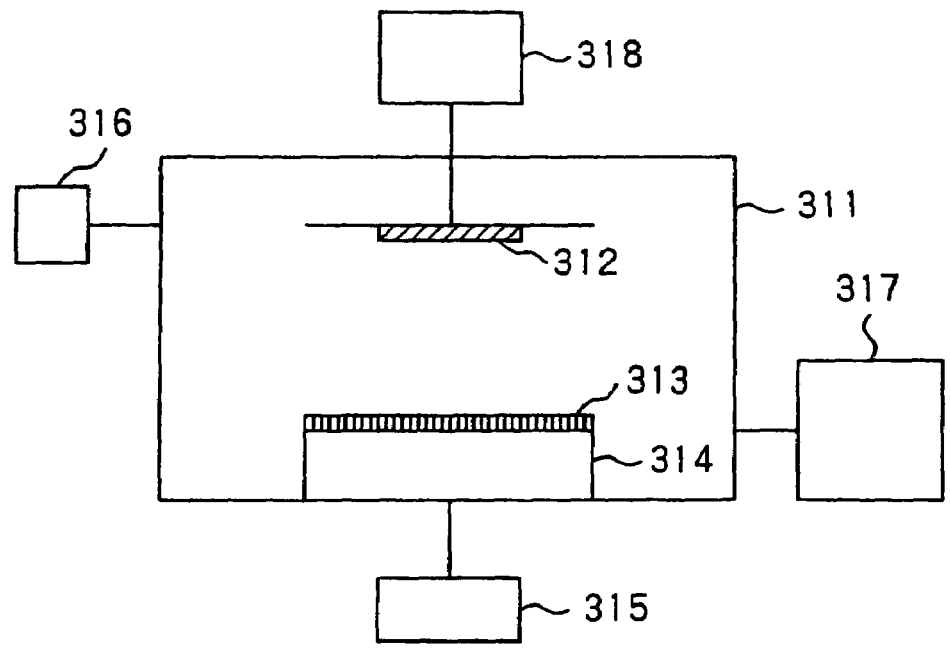
F I G. 10

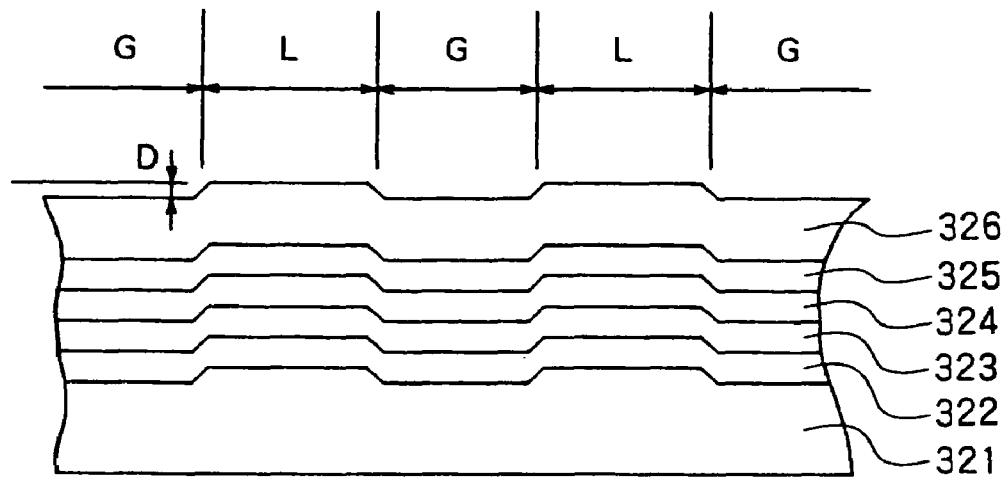
F I G. 1 2
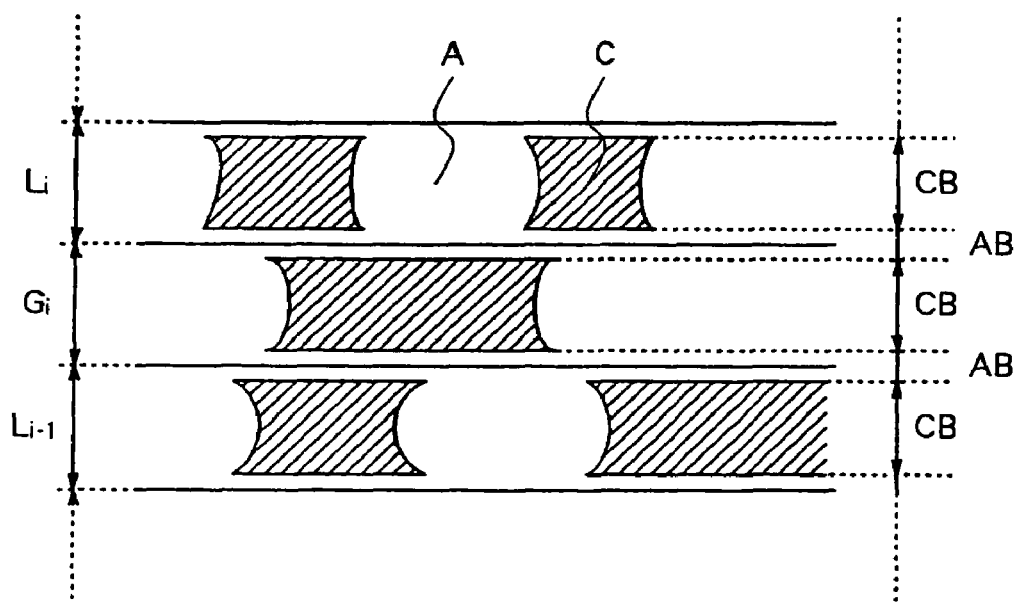
F I G. 1 3

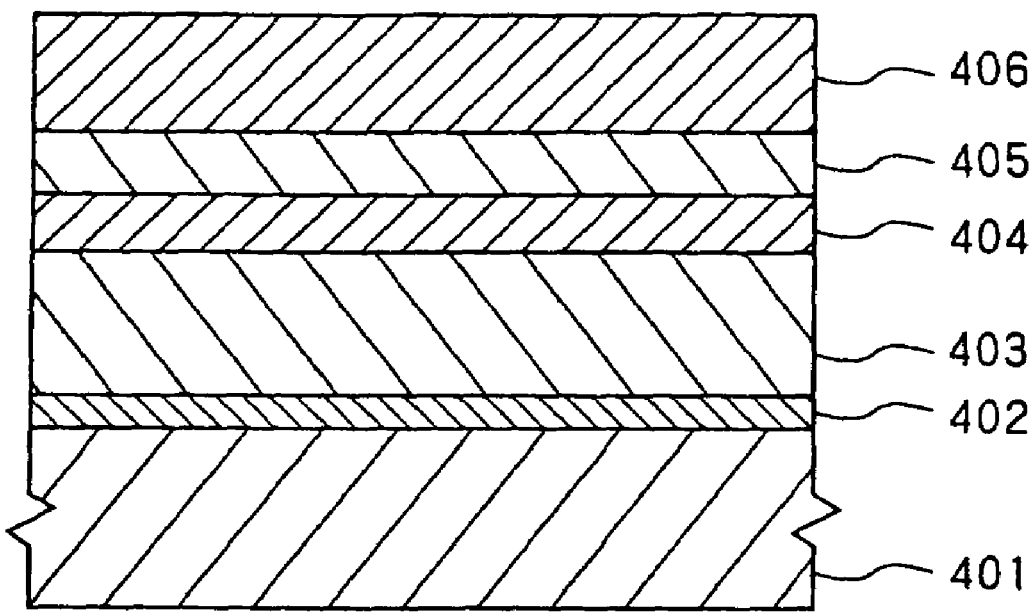
F I G. 15
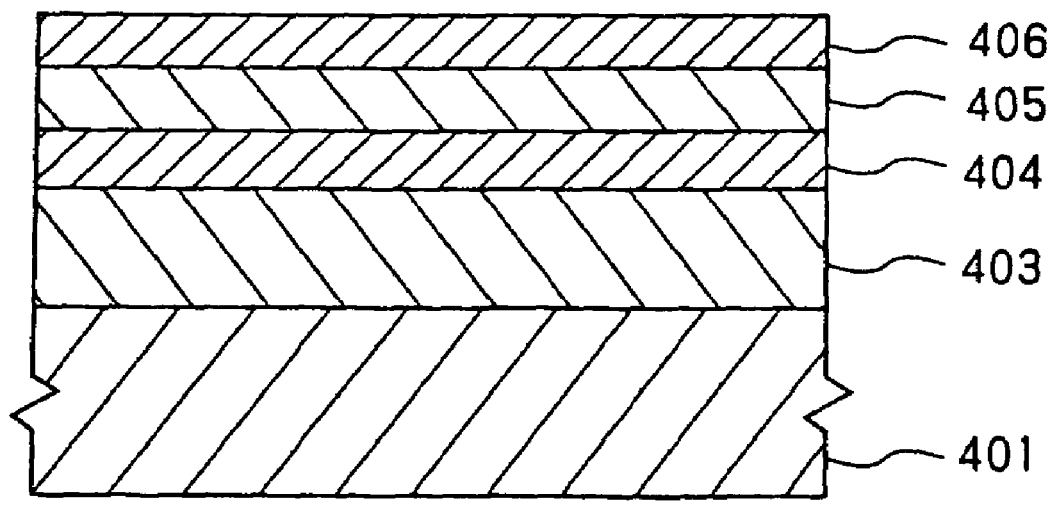
F I G. 16

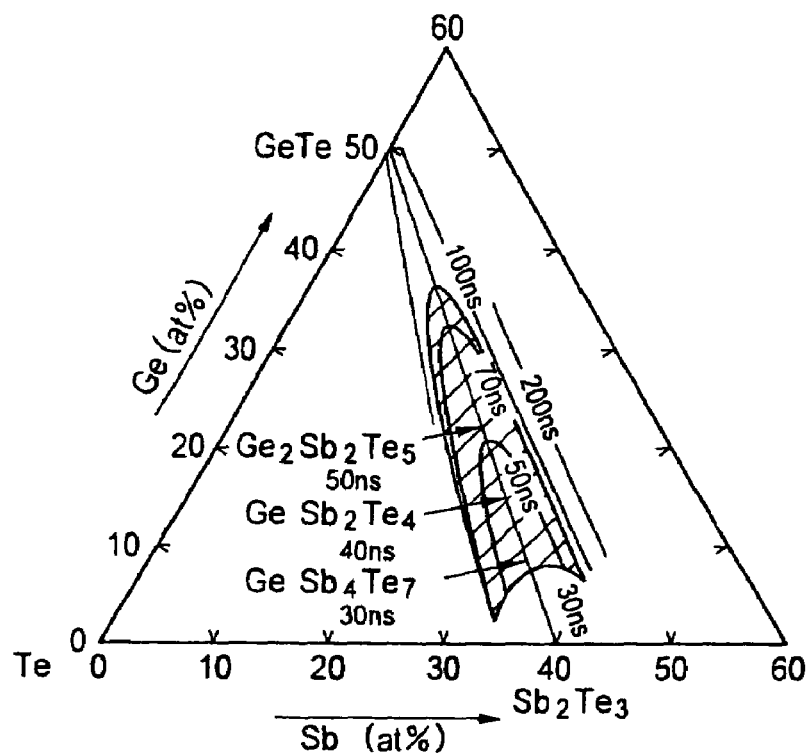
F I G. 20
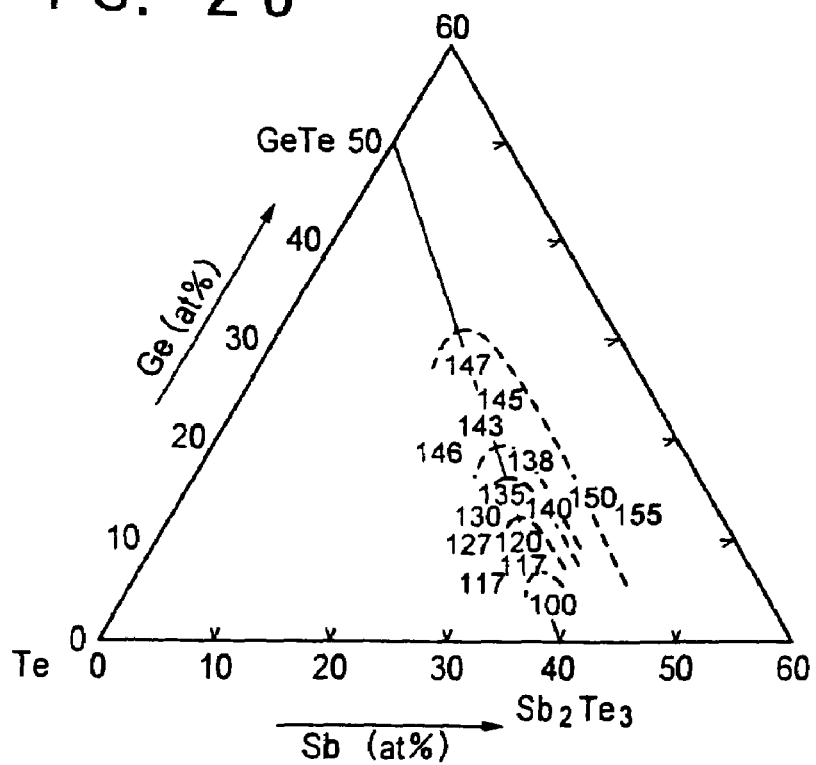
F I G. 21

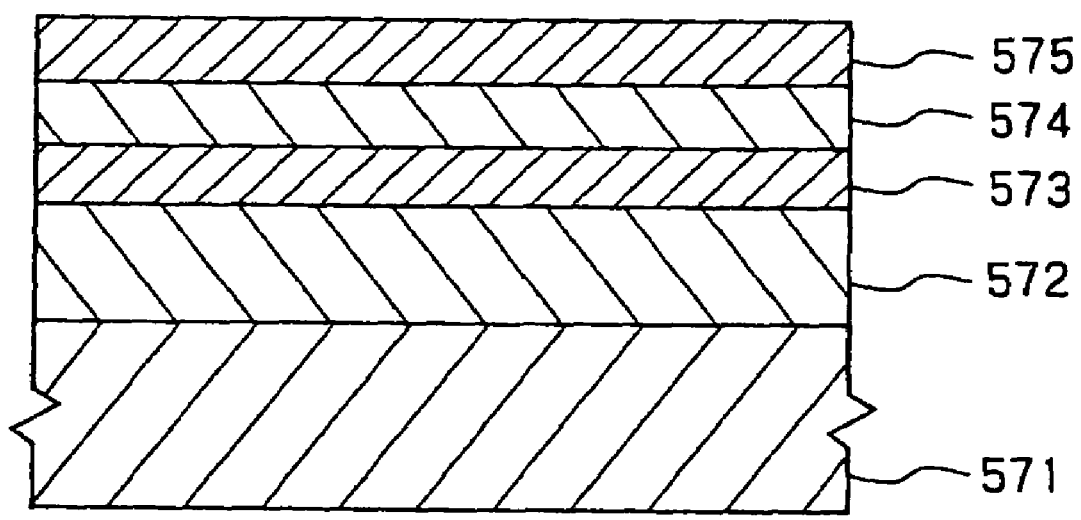
F I G. 26

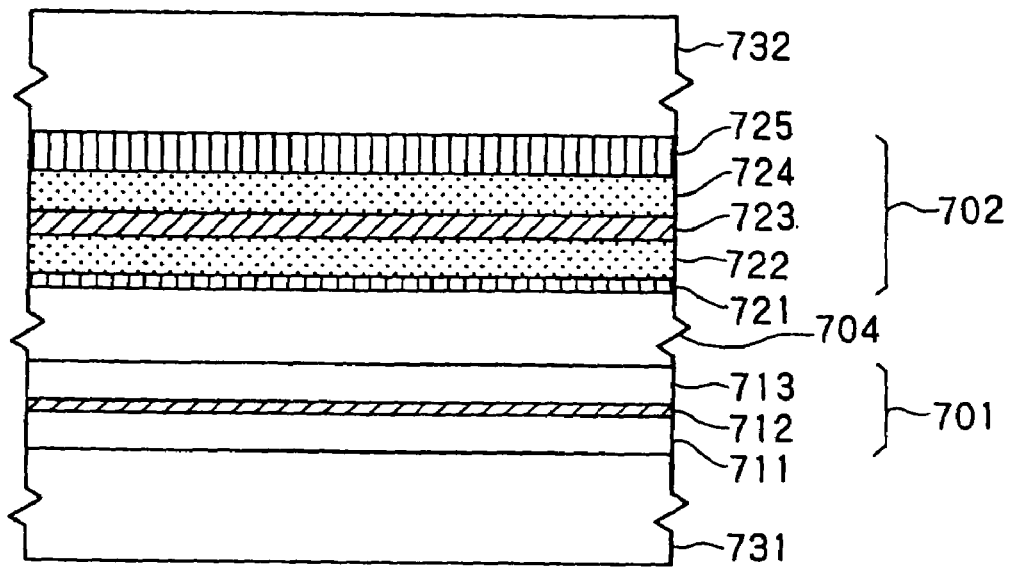
F I G. 3 1
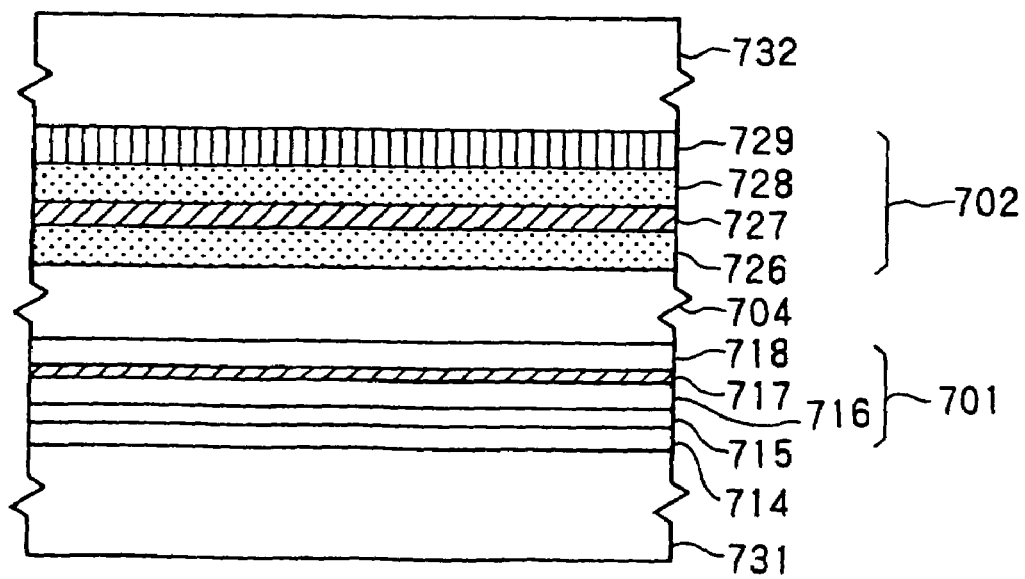
F I G. 3 2

INFORMATION RECORDING MEDIUM AND ITS MANUFACTURING METHOD

BACKGROUND OF THE INVENTION

The present invention relates generally to an information recording medium and its manufacturing method. More specifically, the invention relates to a phase change recording medium, which is an optical recording medium having a phase change type optical recording layer irradiated with light beams for recording and/or reproducing information and which does not need any initial crystallizing steps for crystallizing the recording layer after the recording layer is deposited.

In a phase change type optical recording medium irradiated with optical beams for recording and/or reproducing information, there are advantages in that the medium has a large capacity, high-speed accessibility and medium portability, and that it is possible to more inexpensively provide a CD interchangeable drive than competitive magneto-optical media since its reproduction principle is reflectance change type which is the same as those of CDs. In addition, there are advantages in that it is possible to easily increase the density of the medium since the medium has an excellent signal quality, and that the medium has a high recorded-data transfer rate.

The phase change recording medium is able to record information by forming a recording mark and to erase information by erasing the recording mark. The recording mark is formed by allowing a recording layer to be irradiated with a light beam of a recording level to be molten to be in a random state, and then, by cooling the recording layer in a shorter time than a recording-layer crystallizing time to quench the random state to room temperature to form an amorphous recording mark. On the other hand, the recording mark is erased by irradiating the recording layer with a light beam of an erase level to raise the temperature of the recording layer to a temperature of less than its melting point and not less than its crystallizing temperature in a longer temperature raising time than the recording-layer crystallizing time to crystallize the recording layer. In addition, the reproduction of information is carried out by utilizing the difference in reflectance between a crystal and an amorphous material.

Since the phase change recording medium can record whether its state is amorphous or crystalline before a recording operation, there is an advantage in that an overwrite operation can be carried out by one beam.

As an example of the phase change recording medium, there is an optical disc. A typical optical disc has a structure (a four-layer structure) wherein a lower dielectric layer, a recording layer, an upper dielectric layer and a reflective layer are sequentially laminated on a polycarbonate substrate, the header part of which is pre-formatted and the data part of which is pre-grooved. Moreover, a counter substrate is applied to the reflective layer via an adhesive layer, or a label is applied to the reflective layer.

As the recording layer, there is used a thin film of a chalcogen metal compound, e.g., GeSbTe, AgInSbTe or InSbTe, which suitably includes a very small amount of Cr, V, N or the like.

The dielectric layer and the reflective layer serve to prevent the oxidation of the recording layer, to prevent the deterioration of the recording layer due to accumulated overwrite, to adjust the thermal response of the recording layer during a recording operation, and to optically enhance the recording layer during a reproducing operation. In particular, with respect to the optical enhancement effect, the lower dielectric layer can increase the variation in reflectance by the multiple interference effect between the substrate and the recording layer, and the upper dielectric layer can increase the variation in reflectance by the multiple interference effect between the recording layer and the reflective layer, so that the optical enhancement effect can improve signal quality.

The phase change recording medium described above is applied to various information storage system, such as CD-RW (compact disc-rewritable) and DVD-RAM (digital versatile disc-random access memory). In future, it is expected to increase the storage capacity of the phase change recording medium, to accelerate the transfer rate thereof, and to lower the price thereof.

However, the inventor has recognized that there are various problems to be solved in phase change recording media, after having continued to make a unique study thereof. These problems will be enumerated below.

(Problem on Technique for Improving Transfer Rate)

First, the problem of transfer rates in the prior art will be described. The request for the acceleration of data transfer rates is high similar to other recording media. However, in the phase change recording media, it is required to shorten the time to crystallize a recording layer in order to improve the data transfer rate during a recording operation. Because the acceleration of the data transfer rate means the shortening of the time for an optical spot to pass. In order to shorten the crystallizing time, it has been proposed to add a very small amount of an element other than principal elements constituting the recording layer to the recording layer, and/or to provide a crystallization controlling seed layer underlying the recording layer. However, this is not sufficient for the shortening of the crystallizing time, so that the data transfer rate of the phase change recording medium is limited to tens Mbp (mega bit per second) or less.

(Problem on Reduction of Producing Costs)

Typically, a conventional method for producing a phase change recording medium comprises:
(1) Master Disc Mastering Process;
(2) Stamper Producing Process;
(3) Substrate Forming Process by Injection;
(4) Film Attaching Process by Sputtering;
(5) (Bonding process of a counter substrate if necessary);
(6) Initial Crystallizing Process; and
(7) Verifying Process.

Among a series of these processes, "(6) Initial Crystallizing Process" is a process for crystallizing an as-deposited phase change recording layer (in a state as deposited) on the whole surface of a disc. The reason why this process is provided is that the as-deposited amorphous recording layer takes a very long time required to recording unlike an amorphous mark formed by an optical recording operation. Therefore, the conventional phase change recording medium is not used as-deposited, so that it is required to crystallize the recording layer at the initial crystallizing step.

For example, in the case of an optical disc, at the "initial crystallizing step", there is adopted a system for rotating a disc at a relatively low speed while irradiating the disc with elliptical laser beams extending in radial directions of the disc at a high power to feed the beams in radial directions at a shorter pitch than the major axes of the elliptical beams to gradually anneal the recording layer to crystallize the recording layer. Although the time required for the crystallization depends on the diameter of the disc, the linear velocity during initialization, and the feed pitch, it takes at least several minutes including the focusing time, so that the productivity is very bad. Since an actual producing line is designed so that a tact per disc is several seconds, tens initializing systems must be arranged. Therefore, there are problems in that the costs for the systems are high, that it is required to ensure the area for installing the systems, that it is required to carry out the maintenance of the systems, that the productivity of the recording medium is low, and that the producing costs increase.

(Problem on Degree of Freedom for Selection of Structure of Recording Medium)

Another problem of conventional phase change recording media is that the degree of freedom for the selection of the structure of the medium is limited. That is, although most of conventional phase change recording media are set so that Rc (the light reflectance of a crystal part) is higher than Ra (the light reflectance of an amorphous recording mark), this results from the fact that it is required to carry out the initial crystallizing step as described above.

That is, when the initial state of the medium is crystalline, the Rc is set to be higher than the Ra, so that the reflectance before recording is high, the reflectance of address parts and data parts in the initial state is high, the qualities of header signals and servo signals are improved, and the stability of servo is good.

However, if the limitation that the initial state of the medium is crystalline is removed, the reflectance of the amorphous mark (Ra) can be freely designed so as to be higher or lower than the reflectance of the crystal part by selecting the thickness and material of each layer.

However, since the conventional phase change recording medium has a high Rc, there are disadvantages in that the absorptivity (Ac) of the crystalline state can not be so high, so that the recording sensitivity is bad, that it is difficult to adjust the absorptivity required to record the mark length, and that it is required to carry out the initializing process, so that the costs for the producing process are high. The "adjustment of absorptivity" means that the absorptivity Ac of the crystalline state is set to be higher than the absorptivity (Aa) of the amorphous state in order to allow the film temperature of the crystal part to be equal to that of the amorphous part during fusion in view of the latent heat of fusion, i.e., in order to reduce the overwrite jitter.

In a medium having a so-called high to low structure (which will be hereinafter briefly referred to as a "HtoL structure") wherein Rc>Ra, there is no optical layer other than at least the recording layer, and Ac<Aa is automatically established in the total reflection type film structure, so that it is not possible to adjust the absorptivity. As methods for adjusting the absorptivity in the HtoL structure wherein Rc>Ra, there are methods for causing a reflective film to be semitransparent (thin), for providing a light absorbing layer between the recording layer and the reflective layer, and so forth. However, there is a problem in that the ration Ac/Aa of the absorptivity is about 1.2 at the most even by these methods, so that these methods are not suitable for high linear velocity operations wherein it is required to adjust the absorptivity.

On the other hand, the LtoH (Low to High) medium, wherein the Rc is adjusted to be lower than the Ra, has the merits of having a high recording sensitivity and being easy to adjust the absorptivity, so that the LtoH medium is expected to be the main current of optical discs in the next generation. In particular, a medium having a five-layer film structure, wherein a thin semitransparent film of a metal is arranged between the above described substrate of the four-layer film structure and a lower dielectric layer, can be designed so as to have an Ac/Aa of 1.5 or more by suitably selecting the thickness of upper and lower interference films, and the crystal part thereof has a high recording sensitivity, so that such a medium is suitable for high linear velocity operations.

However, even in such an LtoH medium, the Rc decreases as the Ac/Aa is set to be higher and as the reproducing CNR is set to be higher, so that there are problems in that it is difficult to read address parts if the initial crystallizing step is carried out similar to the medium having Rc>Ra, and that it is difficult to read the servo signals of data parts in a state before recording.

(Problem on Increase of Storage Capacity)

As techniques for improving the recording density of a phase change medium, there are techniques for decreasing the wavelength of a light source, for increasing the NA of an objective lens, for applying a super resolution thin-film and so forth. On the other hand, as means for improving the storage capacity of the medium without the need of the improvement of the recording density of the medium, a single-sided double-layer disc is provided. The single-sided double-layer disc is designed to record and/or reproduce data by only adjusting the focal position of light beams on a double-layer recording layer apart from the plane of incidence for the same light beam by about tens μm. Since it is not required to turn a disc over, it is considered by the user that the single-sided double-layer disc has substantially the same performance as that of a single-sided single-layer disc having a recording density substantially twice as large as that of the single-sided double-layer disc. As a reproduction only DVD, there is known a single-sided double-layer disc which is known as a common name DVD-9. However, it has been considered that since the transmittance of a rewritable DVD is insufficient by one recording layer, light beams do not sufficiently reach a recording layer arranged at the bottom with respect to the incident side of light beams, so that it is difficult to record and/or reproduce data.

However, in ISOM (International Symposium on Optical Memory) '98, Technical Digest, pp. 144-145 (Th—N-05), it has been suggested that it is possible to form a single-sided double-layer even in the case of a rewritable phase change medium. The points of this technique are that the transmittance of a first recording layer part is increased to about 50% so that light beams sufficiently reach a second recording layer part arranged at the bottom when the first recording layer part and the second recording layer part are arranged in that order from the incident side of light beams, that the reflectance of the second recording layer part is set to be higher, i.e., the transmittance thereof is lower, in order to maintain the balance of servo signals and regenerative signals from the first and second recording layer parts, and that the absorptivity Ac of the crystal part is set to be higher than the absorptivity Aa of the amorphous part in both the first and second recording layer parts in order to reduce overwrite jitters.

In order to satisfy the above described setting, the first recording layer part has a three-layer construction which has a so-called High to Low structure (which will be hereinafter briefly referred to as a "HtoL structure"), wherein the reflectance Rc of the crystal part is higher than the reflectance Ra of the amorphous part, and which has no reflective film, and the second recording layer part has a five-layer construction which has the LtoH structure, wherein the reflectance Rc of the crystal part is lower than the reflectance Ra of the amorphous part, a thin Au semitransparent film underlying the LtoH structure, and a thin Al—Cr reflective film on the top of the LtoH structure.

In this construction, with respect to the reflectance of each recording layer part viewed from the incident side of light beams, the reflectance of the first recording layer part is 9% of that of the crystal part and 2% of that of the amorphous part, and the reflectance of the second recording layer part is about 3% of that of the crystal part and about 9% of that of the amorphous part. Therefore, if the single-sided double-layer phase change medium is initial-crystallized in accordance with the conventional producing process, the initial reflectance of the address part and data part is about 9% in the first recording layer and about 3% in the second recording layer. This initial reflectance is far lower than, e.g., 15% to 25% of the single-sided single-layer DVD-RAM standard. At the initial reflectance of the first recording layer, it is possible to reproduce address signals and servo signals of the data part somehow if the reproducing power is increased. However, the reflectance of the second recording part is too low, so that it is difficult to reproduce both of address signals and servo signals.

In addition, the common problem of single-sided double-layer media, which are not limited to the above described rewritable media, is that the initial crystallizing step is complicated. That is, if each of the first and second recording layer parts is initial-crystallized, it is required to carry out double steps to deteriorate the productivity and producing costs.

SUMMARY OF THE INVENTION

The present invention has been made on the basis of the recognition of the aforementioned problems. That is, it is a principal object of the present invention to improve the recording transfer rate of a phase change recording medium, to reduce the producing costs of the medium, to greatly increase the degree of freedom for selecting the structure of the medium to particularly provide a structure of Rc<Ra, and to increase the storage capacity of the medium.

More specifically, it is an object of the present invention to shorten the time required to crystallize a recording layer to improve a data transfer rate, to omit an initial crystallizing step to reduce the producing costs by applying a rapid crystallizing performance to an as-deposited amorphous material, to allow a medium of Rc<Ra to be used in an as-deposited amorphous state to extend the range of selecting the structure of the medium, and to improve the reflectance of a single-sided double-layer medium to increase the storage capacity thereof.

That is, according to the present invention, a phase change recording medium has a first recording layer wherein a phase change between an amorphous state and a crystalline state occurs reversibly by light irradiation to change the optical characteristic of the first recording layer, the state of the recording layer being the amorphous state before a recording operation is carried out, and the recording layer containing fine nuclei having a grain size of from 0.5 nm to 4 nm.

The first recording layer may be irradiated with erasing light beams to produce a crystal part, and the distribution of the number of crystal grains constituting the crystal part with respect to the grain sizes of the crystal grains may have maximum values with respect to at least two different grain sizes.

In the phase change recording medium a grain size at a first maximum value of the at least two different maximum values may be greater than 4 nm and 20 nm or less, a grain size at a second maximum value of the at least two different maximum values may be greater than 20 nm and 100 nm or less, and the percentage of the sum of grain sizes belonging to a distribution, the center of which is the first maximum value, and grain sizes belonging to a distribution, the center of which is the second maximum value, in all of the crystal grains of the crystal part may be 75% or higher.

The phase change recording medium may further comprise: a second recording layer wherein a phase change between an amorphous state and a crystalline state occurs reversibly by light irradiation to change an optical characteristic; and a separation layer provided between the first recording layer and the second recording layer.

According to the present invention, a phase change recording medium has a first recording layer wherein a phase change between an amorphous state and a crystalline state occurs reversibly by light irradiation to change the optical characteristic of the first recording layer, the distribution of the number of crystal grains constituting the recording layer with respect to the grain sizes of the crystal grains having maximum values with respect to at least two different grain sizes in the amorphous state of the recording layer.

In the phase change recording medium, a grain size at a first maximum value of the at least two different maximum values may be greater than 4 nm and 20 nm or less, a grain size at a second maximum value of the at least two different maximum values may be greater than 20 nm and 100 nm or less, and the percentage of the sum of grain sizes belonging to a distribution, the center of which is the first maximum value, and grain sizes belonging to a distribution, the center of which is the second maximum value, in all of the crystal grains of the crystal part may be 75% or higher.

The first recording layer may be irradiated with recording light beams to produce an amorphous part containing fine nuclei having a grain size of from 0.5 nm to 4 nm.

The phase change recording medium may further comprise: a second recording layer wherein a phase change between an amorphous state and a crystalline state occurs reversibly by light irradiation to change an optical characteristic; and a separation layer provided between the first recording layer and the second recording layer.

According to the present invention, a phase change recording medium has a recording layer wherein a phase change between an amorphous state and a crystalline state occurs reversibly by light irradiation to change the optical characteristic of the recording layer, the state of the recording layer being the amorphous state before a recording operation is carried out, and the recording layer having a thermal conductivity of from 0.8 W/mK to 6 W/mK.

The recording layer may contain fine nuclei having a grain size of from 0.5 nm to 4 nm.

According to the present invention, a phase change recording medium has a recording layer wherein a phase change between an amorphous state and a crystalline state occurs reversibly by light irradiation to change the optical characteristic of the recording layer, the recording layer containing at least one of Kr and Xe in the range of from 0.2 at % to 10 at %.

According to the present invention, a phase change recording medium has a recording layer wherein a phase change between an amorphous state and a crystalline state occurs reversibly by light irradiation to change the optical characteristic of the recording layer, the recording layer having an amorphous state band part between adjacent tracks after the recording layer is irradiated with a recording light beam which has a spot size of a $e^{-2}$ diameter greater than a track pitch.

The state of the phase change recording medium may be an amorphous state wherein the address part of the recording layer has substantially the same randomness as that of the amorphous recording mark of the data part.

More specifically, the state of the address part may be an amorphous state, and the recording layer may contain fine nuclei having a grain size of from 0.5 nm to 4 nm.

In addition, the state of the address part of the recording layer may be amorphous state, and the recording layer may have a thermal conductivity of from 0.8 W/mK to 6 W/mK.

According to the present invention, there is provided a method for producing a phase change recording medium having a substrate and a recording layer deposited on the substrate, wherein the relationship between a dc voltage Vdc applied to a target and a sputter threshold voltage Vth of a target constituting element is set to be Vth<Vdc≦10 Vth when a recording layer of a phase change recording medium is deposited by sputtering.

In this process, an ion density Ni in a negative glow plasma produced in the vicinity of the target during the sputtering may be in the range of Ni>$10^{11}$ (cm$^{-3}$).

According to the present invention, there is provided a method for producing a phase change recording medium having a substrate and a recording layer deposited on the substrate, wherein while or after the recording film is deposited on the substrate, nuclei are produced in the recording film by raising the temperature of the recording film to a higher temperature than room temperature while the temperature of the substrate is maintained to be less than the thermal deformation temperature thereof.

In this method, the temperature rise may be carried out by an infrared ray lamp.

In this method, the temperature rise may be carried out while the substrate is supported on a material which does not substantially absorb light beam emitted from the infrared ray lamp.

According to the present invention, there is provided a method for producing a phase change recording medium, which has a first recording layer part wherein a phase change between an amorphous state and a crystalline state occurs by light irradiation, a separation layer formed on the first recording layer part, and a second recording layer part which is formed on the separation layer and wherein a phase change between an amorphous state and a crystalline state occurs, wherein the initial crystallization of the first recording layer part and the initial crystallization of the second recording layer part are substantially simultaneously carried out.

In this method, the initial crystallization may be carried out by irradiating with initial crystallizing light beams, and part of the initial crystallizing light beams for irradiating the first recording layer part may be used for the initial crystallization of the recording layer part.

The method for producing a phase change recording medium may further comprise the steps of: depositing the first recording layer part on the first substrate; depositing the second recording layer part on the second substrate; and sticking the first and second substrates together via a separation layer after the initial crystallizing step so that the first and second recording layer parts deposited sides face each other.

According to the present invention, a system for producing a phase change recording medium having a substrate and a recording film deposited on the substrate, which has heating means for raising the temperature of the recording film to a higher temperature than room temperature while maintaining the temperature of the substrate to be less than the thermal deformation temperature thereof, to produce nuclei in the recording film, while or after the recording film is deposited on the substrate, nuclei are produced in the recording film.

The heating means may be an infrared ray lamp.

The system may further comprise a substrate holder for supporting the substrate, the contact portion of the substrate holder with the substrate being made of a material which does not substantially absorb light beams emitted from the infrared ray lamp.

According to the present invention, a system for producing a phase change recording medium comprises: a first holding part for holding a first substrate, on which a first recording layer part wherein a phase change between a crystalline state and an amorphous state occurs by light irradiation is deposited; a second holding part for holding a second substrate, on which a second recording layer part wherein a phase change between a crystalline state and an amorphous state occurs by light irradiation is deposited; a light irradiation part for irradiating with an initial crystallizing light beam for initial-crystallizing the first and second recording layer parts; and an optical system for condensing the initial crystallizing light beam passing through the first recording layer part on the second recording layer part to irradiate the second recording layer part with the initial crystallizing light beam.

According to the present invention, with the above described constructions, it is possible to improve the recording transfer rate of the phase change recording medium, and it is possible to reduce the producing costs of the medium. In addition, it is possible to greatly increasing the degree of freedom for the selection of the structure of the medium, particularly it is possible to provide a medium having a structure of Rc<Ra, so that it is possible to increase the storage capacity of the medium.

More specifically, it is possible to reduce the time required to crystallize the recording layer to improve the data transfer rate, and it is possible to omit the initial crystallizing step to reduce the producing costs by applying a rapid crystallization performance to the as-deposited amorphous material. Moreover, by allowing the medium of Rc<Ra to be used from the as-deposited amorphous state, it is possible to increase the range for selecting the structure of the medium, and it is possible to improve the reflectance of a single-sided double-layer medium, so that it is possible to increase the storage capacity of the medium.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings:

FIGS. 1A through 1C are schematic diagrams of the fine structure of a recording layer of a preferred embodiment of a phase change recording medium according to the present invention, in comparison with a conventional phase change recording medium, wherein FIG. 1A shows the fine structure of a recording layer in this preferred embodiment, FIG. 1B showing the fine structure of a recording layer in an as-deposited state produced by the prior art, and FIG. 1C showing the fine structure of a crystal part formed by an optical recording operation in a recording layer produced by this preferred embodiment and the prior art;

FIG. 5 is a graph showing the distribution in crystal grain size of crystal grains having a greater size than 20 nm in a part between marks of an optical disc according to the present invention;

FIG. 6 is a graph showing the distribution in crystal grain size of fine crystal grains of an optical disc according to the present invention;

FIG. 7 is a conceptual sectional view of the first preferred embodiment of a phase change optical recording medium according to the present invention;

FIG. 8 is a graph wherein appearance frequencies of measured respective grain sizes are plotted in a comparative example;

FIG. 9 is a schematic sectional diagram showing an example of the third preferred embodiment of a phase change optical disc according to the present invention;

FIG. 10 is a schematic diagram of a principal part of a sputtering system for use in the third preferred embodiment;

FIG. 12 a schematic sectional view of a second example of the third preferred embodiment of an optical disc according to the present invention;

FIG. 13 is a schematic diagram showing a pattern after the first recording operation in the optical disc in the second example;

FIG. 15 a conceptual sectional view showing an example of the fourth preferred embodiment of a phase change recording medium according to the present invention;

FIG. 16 is a conceptual sectional view showing an example of the fourth preferred embodiment of a phase change recording medium according to the present invention;

FIG. 20 is a graph showing an example of the distribution in crystallizing time in a GeSbTe ternary alloy system;

FIG. 21 is a graph showing an example of the distribution in crystallizing temperature in a GeSbTe ternary alloy system;

FIG. 26 is a conceptual sectional view of a phase change recording medium produced in an example of the fifth preferred embodiment;

FIG. 31 is a schematic sectional view of a first example of the seventh preferred embodiment of a phase change optical disc according to the present invention;

FIG. 32 is a schematic sectional view of a second example of the seventh preferred embodiment of a phase change optical disc according to the present invention.

DETAILED DESCRIPTION OF THE PREFERRED EMBODIMENTS

Figure 2:
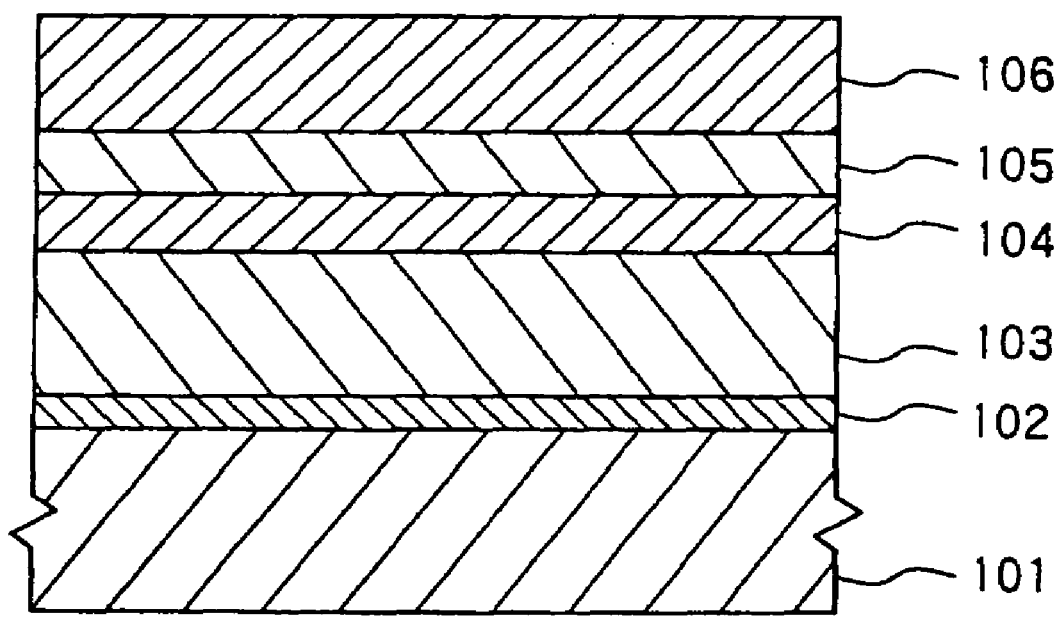
FIG. 2 is a sectional view of a phase change recording medium according to the present invention.

Referring now to the accompanying drawings, the preferred embodiments of the present invention will be described below.

FIRST PREFERRED EMBODIMENT

First, the first preferred embodiment of the present invention will be described. This preferred embodiment is characterized that the initial state, i.e., the as-deposited state, of a phase change recording medium, is an amorphous state which has a unique short-range order structure.

FIGS. 1A through 1C are schematic diagrams showing the fine structure of a recording layer of a phase change recording medium in this preferred embodiment, in comparison with a conventional phase change recording medium. That is, FIG. 1A is a schematic diagram showing the fine structure of a recording layer in this preferred embodiment, and FIG. 1B is a schematic diagram showing the fine structure of a recording layer in the as-deposited state, which is produced by the prior art. In addition, FIG. 1C is a schematic diagram showing the fine structure of a crystal part formed by an optical recording operation in a recording layer produced by this preferred embodiment and prior art.

The as-deposited state of the recording layer produced by the prior art (FIG. 1B) shows a random arrangement which has neither a long-range order nor a short-range order. On the other hand, although the recording layer in the as-deposited state produced by this preferred embodiment has no long-range order, it has a short-range order having a size of 0.5 nm (a hyperfine nucleus of about 8 atoms) to 4 nm (a fine nucleus of about 4000 atoms) (this is shown by A in FIG. 1A). In addition, the inventor observed that the same short-range order A exists in an amorphous part formed by an optical recording operation in a recording layer produced by the present invention and the prior art.

On the other hand, it was observed that a polycrystalline state having a long-range order of about 20 nm or more exists in the crystal part formed by the optical recording operation in a recording layer produced by this preferred embodiment and the prior art.

The recording layer shown in FIG. 1A is able to be produced by various means which will be described below.

Before describing examples of this preferred embodiment, a basic concept for producing a recording layer of a phase change recording medium in this preferred embodiment will be described below.

A recording film for use in a phase change recording is usually deposited by a sputtering method, and the state thereof is an amorphous state immediately after the thin-film deposition. The sputtering method is a technique for producing a predetermined film by allowing the transition of the surface of a substrate into a solid state serving as a film after sputter particles (gaseous phase), which are sputter-emitted from a target surface by a high-energy argon (Ar) ion bombardment, arrive at the surface of the substrate at random to migrate the surface in a random state.

It is generally said that a sputter particle has an energy of several eV. The value of 1 eV corresponds to $10^4$ K, which is far higher than thermal energy at room temperature. In addition, the transition rate of a sputter particle from a gaseous phase into a solid phase on a substrate is usually about $10^{12}$ k/sec. That is, it is guessed that the time required for a sputter particle to change from a random state of several eV (tens of thousands K) into a solid phase at room temperature is about 10 nanoseconds, and the time required for the sputter particle to pass through a temperature zone between the melting point and the crystallized temperature is about 1 nanosecond at the most. On the other hand, the crystallization holding time required to crystallize a GeSbTe or InSbTe recording film is tens nanoseconds. That is, when a film is deposited by a conventional sputtering method, the sputter particle is cooled in a far shorter time than the crystallization holding time, so that the state of the recording layer is an amorphous state having no short-range order immediately after the sputter deposition as shown in FIG. 1B.

This amorphous state immediately after the thin-film deposition is different from an amorphous state formed by an optical recording operation. Because the cooling rate during the optical recording operation is typically about $10^{10}$ K/sec, which is lower than that during a sputter deposition by about two figures, although it depends on the linear velocity and the layer structure of a medium. That is, since the cooling rate in a film deposition process during the sputter deposition is very high which is higher than the cooling rate during the formation of an amorphous part by about two figures, it is considered that an amorphous material having a higher randomness than that of the amorphous part after an optical recording operation, i.e., an amorphous material having a smaller short-range order, is formed in an as-deposited film.

If the quality of the amorphous state immediately after the sputter deposition is the same as that of the amorphous state formed by the optical recording operation, it is possible to carry out the recording and reproducing operations without carrying out the initial crystallizing step. However, since the amorphous state immediately after the sputter deposition is different from the amorphous state formed by the optical recording operation, it is difficult to carry out the optical recording in either a medium of Rc>Ra or a medium of Rc<Ra without carrying out the initial crystallizing step. The inventor found that the amorphous state formed by the optical recording operation has a short-range order although it is an amorphous state at a long distance since the crystallization holding time in a cooling process approximates to the time to crystallize the recording layer. Moreover, the sputtering process for a recording layer and interference layers arranged above and below the recording layer is improved on the basis of the above described finding, so that the inventor succeeded in forming a short-range order, which is the same as that in the amorphous state formed by the optical recording operation, in an as-deposited amorphous state to make the present invention.

Specifically, according to the present invention, one process is to decrease the cooling rate for sputter particles in a sputtering process to cause an amorphous state immediately after a sputter deposition to approximate to an amorphous state formed by an optical recording operation, and another process is to apply a compressible stress to a recording layer immediately after a sputter deposition to provide a state that the recording layer is easily crystallized. These processes may be combined.

In order to cause the amorphous state immediately after sputtering to approximate to the amorphous state formed by the optical recording operation, the energy of sputter particles being incident on a substrate is decreased, and/or the surface migration time is controlled so as to increase. Specifically, there are effective methods for using Kr (krypton) or Xe (xenon) gas, which are capable of conspicuously cooling GeSbTe sputter particles, or the mixed gas thereof as a sputter gas in place of Ar gas typically used, and/or for applying a bias to a substrate to promote the surface migration. The state of the thus formed disc immediately after the sputter deposition approximates to the amorphous state formed by the optical recording operation, and is the same as the amorphous state at a long distance, but it has a fine structure having a short-range order.

On the other hand, in order to apply a compressive stress to a recording layer immediately after the sputter deposition to promote the formation of the short-range order, it is effective to enhance the compressive stress of the recording layer itself or to apply a compressive stress to the interference layers arranged above and below the recording layer to allow the recording layer to easily contract. The volume of the recording layer in the amorphous state having the short-range order is slightly smaller than that in the amorphous state having no short-range order. Therefore, if the compressive stress is applied, it is easy to cause the volume of the recording layer to contract, i.e., to form the short-range order. In the case of a sputter film, it is possible to apply the compressive stress by causing high energy particles being incident on the substrate during the thin-film deposition. Specifically, it is effective to apply a bias to the substrate to increase the energy of sputter particles being incident on the substrate, or to apply a bias to the substrate to accelerate gas ions to positively cause the gas ions to be incident on the substrate.

Among these methods, the method for decreasing the gas pressure during the formation of the recording layer collides with the first method for decreasing the energy of sputter particles. However, the conditions for reasonably decreasing the cooling rate for sputter particles on the substrate to apply a moderate compressive stress to the recording layer are suitable for the present invention, and the method for decreasing the gas pressure during the formation of the recording layer is found by the relationship with other methods. However, the recording film is most preferably formed by carrying out a sputter deposition on a high pressure condition using a heavy rare gas (this sputter deposition is suitable for the application of a compressive stress at the same time that a bias is applied to a substrate), to sputter a low pressure gas to apply a great compressive stress when the upper and lower interference films are formed. The foregoing is a basic concept of a method for producing a phase change recording medium according to the present invention.

The present invention will be described in detail below.

FIG. 2 is a sectional view of a phase change recording medium according to the present invention. In FIG. 2, reference number 101 denotes a disc substrate, 102 denoting a semitransparent layer, 103 denoting a lower interference layer, 104 denoting a recording layer, 105 denoting an upper interference layer, and 106 denoting a reflective layer. The substrate 101 is a polycarbonate substrate having a diameter of 120 mm and a thickness of 0.6 mm. The substrate 101 comprises an address part (not shown) comprising pre-pit strings, and a data part (not shown) wherein pre-grooves are formed. A method for producing a substrate comprises the typical steps of: mastering a master disc, preparing a stamper by plating, and injection-forming a polycarbonate resin on the stamper. In this example, the track width of each of both of grooves and lands was set to be 0.74 μm, which was the same as that of the first generation DVD-RAM standard, and the depth of each of the groove was set to be 70 nm, which was the same as that of the crosstalk specification.

The phase change medium formed on the substrate comprises an Au semitransparent film 102 having a thickness of 10 nm, a bottom ZnS—$SiO_2$ interference film 103 having a thickness of 85 nm, a GeSbTe recording layer 104 having a thickness of 10 nm, a top ZnS—$SiO_2$ interference film 105 having a thickness of 30 nm, and an AlMo reflective film 106 having a thickness of 100 nm, which are arranged in that order from the substrate. The composition of each of the upper and lower ZnS—$SiO_2$ interference films was a standard composition containing 20 at. % $SiO_2$, and the composition of the GeSbTe recording layer was a standard composition wherein Ge:Sb:Te=2:2:5.

The optical design values of a disc having the above described film structure include an Rc of 5%, an Ra of 20%, and an Ac/Aa of 1.3, which are the same as those of a typical absorptivity adjusting LtoH structure. In addition, in the above describe film structure, the phase difference of reflected light was adjusted to be zero. All of layers other than the recording layer were formed by typical sputtering method and conditions for use in typical experiments. That is, the sputtering method was the magnetron sputtering method, and the sputter gas was pure Ar gas. In addition, the gas pressure was 0.67 Pa, and the power inputted to the target was tens to hundreds W. Moreover, the substrate was a non-bias substrate. In addition, the technique and conditions for depositing the GeSbTe film was special technique and conditions for obtaining a disc according to the present invention. An example of a method for forming a recording layer will be described below.

First, a substrate 101, on which a semitransparent layer 102 and a lower interference layer 103 have been formed, is introduced into a sputter chamber for forming a recording layer 104, and secured to a substrate holder facing a target. Then, the sputter chamber is evacuated, and a Kr—Xe mixed gas containing 20% Kr is introduced from a gas supply system at a flow rate of 200 sccm. Then, after the conductance of an exhaust system 7 is adjusted so that the gas pressure in the sputter chamber is adjusted to be 6.7 Pa, an RF power of 50 W is inputted to a sputter source by a power source 5, and simultaneously, a surface migration control system is operated to input a weak RF power to the substrate to bias-magnetron-sputter a GeSbTe target for five minutes to form a GeSbTe recording layer 104 having a thickness of 10 nm on the lower interference layer.

The different points from a typical sputtering were as follows: the Kr—Xe mixed gas was used as a sputter gas to easily lose GeSbTe sputter particles in a gaseous phase; the gas pressure was set to be high to promote the cooling of the GeSbTe sputter particles in the gaseous phase, and the energy of the gas ions being incident on the target was decreased to decrease the energy when the sputter particles were emitted from the target; the power inputted to the sputter source was set to be relatively low to more decrease the energy when the sputter particles were emitted; and the weak bias was applied to the substrate to cause the gas -ions to be incident on the substrate during the thin-film deposition so as not to thermally damage the polycarbonate substrate to increase the time to surface migrate the sputter particles on the substrate.

The above described points are effective in the decrease of the energy of the sputter particles being incident on the substrate and in the increase of the transition time from a random liquid phase state to a solid phase state on the substrate, i.e., in the decrease of the cooling rate for the sputter particles. By such a method, the cooling rate for the GeSbTe sputter particles in the sputter deposition process can be decreased from $10^{12}$ K/sec in the conventional method to an order of $10^{10}$ K/sec during an optical recording operation, so that a short-range order having a size of 0.5 nm to 10 nm can be formed in an amorphous state immediately after the thin-film deposition similar to the amorphous state during the optical recording operation. In order to cause the amorphous state immediately after the thin-film deposition to approximate to the amorphous state during the optical recording operation, it is not always required to carry out all of the selection of the sputter gas suitable for the above described material of the recording layer, the increase of the gas pressure, the decrease of the sputter power, and the application of the substrate bias, and these may be suitably combined. In addition to the above described methods, there are a method for promoting the surface migration of the sputter particles on the substrate by a method for heating the substrate by about tens ° C. during the thin-film deposition or by a method for providing an auxiliary ion source to irradiate the surface of the substrate with an ion shower; and a method for decreasing the energy of the sputter particles being incident on the substrate by a method for ionizing the sputter particles emitted from the target surface to pass the sputter particles through a deceleration field, a method for increasing the distance between the target and the substrate, or a method for eccentrically arranging the substrate with respect to the target to deposit a film by only sputter particles emitted obliquely from the target surface. By suitably combining these methods, the amorphous state immediately after the sputter deposition can approximate to the amorphous state during the optical recording operation.

While the recording layer 104 has been deposited by the most practical sputtering method in all of the above described examples, it is effective to apply the vacuum deposition method, the gas deposition method, the MBE (molecular beam expitaxy) method, the plasma CVD (chemical vapor deposition) method, the MOCVD (metal-organic chemical vapor deposition) method, or the like to the deposition of the recording layer in order to set the energy of the recording film material particles being incident on the substrate to be low.

On the GeSbTe recording film 104 produced by the substrate bias magnetron sputter method at a high pressure and low power in the above described Kr—Xe gas, an upper interference layer 105 and a reflective layer 106 are sequentially formed by a typical magnetron sputtering method to be ejected from the sputter chamber. The five-layer disc thus formed is applied on a polycarbonate substrate having a diameter of 120 mm and a thickness of 0.6 mm, on which no film is provided, via a UV-curing adhesive layer, to be prepared as a sample for verifying the advantages of the present invention.

As a comparative example, a disc having the same film construction as that in the above described example was prepared by a different producing method. The comparative disc was formed by initial-crystallizing a part of a recording layer with elliptical beams in accordance with a conventional producing process after the recording layer was formed on typical sputtering conditions by a typical sputtering method to form an applied structure. The conditions for sputtering the recording layer for use in the comparative example were the same as the conditions for sputtering the films other than the recording layer in the above described example of the present invention. That is, the magnetron sputtering method was used, and the sputter gas was pure Ar gas. In addition, the gas pressure was 0.67 Pa, and the power inputted to the target was tens to hundreds W. Moreover, the substrate was a non-bias substrate.

The initial crystallizing parts of the disc of the present invention and the comparative disc were evacuated by the following method. First, a disc evaluating system having a recording and/or reproducing optical system having a wavelength of 650 nm and an NA of objective lens of 0.6 was used to measure the reflectance of the mirror surface of the address part. Then, with respect to the data part, a 8/16 modulating random pattern signal having a linear velocity of 6 m/sec and a shortest bit length of 0.41 m/bit was recorded on adjacent land and groove, each of which has 10 tracks, and a regenerative signal was detected using a time interval analyzer to measure a jitter ratio (%) to a window width. The measurement of the jitter was carried out with respect to each of the land track and the groove track when each of the first recording operation, the tenth overwrite operation and the hundredth overwrite operation was carried out. The above described evaluating Conditions are based on the first generation DVD-RAM standard defining that the reflectance of the mirror part is 15% or more and the allowable jitter amount is 8.5% with respect to random data. The evaluated data are shown in table 1.

TABLE 1

Evaluated Results

| Disc | Reflectance (%) of Mirror Surface of Address Part | Jitter (%) of Data Part | | |
|---|---|---|---|---|
| | | 1st L/G | OW10 L/G | OW100 L/G |
| Present Invention | 20 | 7.5/7.2 | 7.7/7.3 | 7.3/7.0 |
| Comparative Example | 5 | 7.3/7.0 | 7.5/7.2 | 7.2/7.0 |

As can be clearly seen from table 1, the disc of the present invention has a high reflectance of the mirror surface and an excellent address signal quality. In addition, the reflectance of the data part is high from the first time, and the jitter of the data part is low from the first recording operation, so that it is possible to carry out a good recording.

On the other hand, in the case of the comparative disc produced by the conventional method, the whole surface is initial-crystallized. Therefore, although the jitter characteristic of the data part has a good value from the first recording operation, the reflectance of the mirror part is low, and the reflectance of the data part during the first recording operation is also low, so that the qualities of both of address signals and tracking servo signals are lower than those of a disc according to the present invention. In addition, as another great advantage of the present invention, it is possible to omit the initial crystallizing step from the producing process, so that it is possible to provide inexpensive discs. This needs no explanation.

The fine structures of a disc of the present invention and a comparative disc after recording were observed by the transmission electron microscope (TEM). In order to carry out the TEM observation, an as-deposited part and a recording part (optically recorded amorphous and crystal parts) were cut to prepare a small piece to peel away and remove the counter substance along with the UV adhesive layer. Thereafter, the peeled small piece was embedded in a resin to be polished, so that the sectional part of the medium film was exposed. Then, the recording layer of the sectional part of the medium film was observed by a high resolution electron microscope.

The observed results are shown in FIG. 1 described above. That is, FIG. 1A shows the fine structure of the as-deposited state of a recording layer 104 of a phase change medium according to the present invention and an amorphous mark part formed by an optical recording operation. FIG. 1C shows the state of a regular atomic arrangement of a crystal space formed by an optical recording operation of the recording layer 104 according to the present invention. FIG. 1B shows the fine structure of the as-deposited state (a part which is not initial-crystallized) of a phase change medium in a comparative example prepared by the prior art. The state of the phase change medium prepared by the prior art after the initial crystallization, and state of the crystal part formed by the optical recording operation were the same as those in FIG. 1C. In addition, the fine structure of the amorphous part formed by the optical recording operation on the initial-crystallized part of the phase change medium produced by the prior art was the same as that in FIG. 1A.

Figure 3:
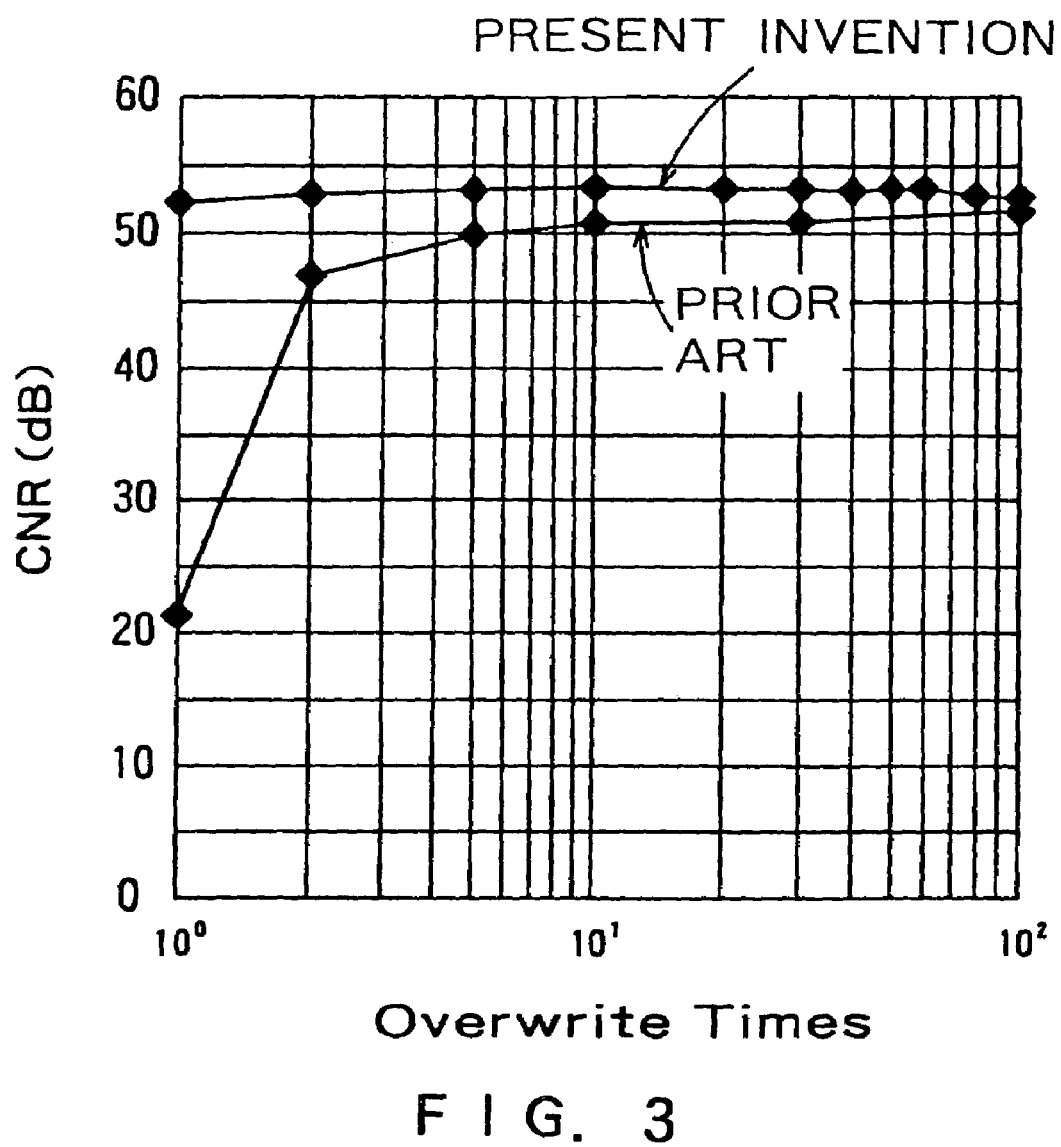
FIG. 3 is a graph showing the relationships between the number of OW repetitions and CNR (carrier to noise ratio), which were measured with respect to an as-deposited phase change medium formed in accordance with the present invention and an as-deposited (a part which is not initial-crystallized) phase change medium formed in accordance with the prior art.

Then, the relationship between the number of OW repetitions and CNR (carrier to noise ratio) was measured with respect to an as-deposited phase change medium, which was formed in accordance with the present invention, and an as-deposited (a part which is not initial-crystallized) phase change medium which was formed in accordance with the prior art. FIG. 3 is a graph showing the measured result. As can be clearly seen from FIG. 3, in the phase change recording medium formed in accordance with the present invention (which is expressed by "Present Invention" in FIG. 3), a high CNR exceeding 52 dB was obtained over the OW repetitions from the first recording operation after the as-deposition, whereas in the medium formed in accordance with the prior art (which is expressed by "Comparative Example" in FIG. 3), the CNR is low, about 20 dB, at the first recording operation after the as-deposited state, and it is not possible to obtain substantially the same CNR as that a non-initialized medium unless OW is repeated about 100 times. It is considered that the recording medium of the present invention is amorphous at a long distance, but it has a short-range order, so that the short-distance serves as a nucleus to achieve a good recording after the as-deposited state.

Then, the relationship between the CNR in the first as-deposited state and the size of the short-range order was examined. The size of the short-range order was controlled by adjusting the above-described process for sputtering the recording layer and the upper and lower interference layers. For example, as the gas pressure during the thin-film deposition of the recording layer was increased, as the sputter input to the target was decreased, and as the bias voltage applied to the substrate was increased, the size of the short-distance was increased. As a result, it was found that a cluster having about 8 atoms is required to exist in order to obtain a good CNR from the first recording operation in the as-deposited state. By the observation using the high resolution electron microscope, it was also found that the size of the cluster was 0.5 nm. When the short-range order (fine nucleus) was 5 nm or more, i.e., when about 8000 atoms are regularly arranged, the distance between clusters in the short-range order was decreased, and the fine structure having the short-range orders scattered in the amorphous material was changed to a polycrystalline structure. Such a polycrystalline structure is similar to the structure after the process for initial-crystallizing the phase change medium produced by the prior art, or the structure of the crystal part formed by the optical recording operation. That is, it was found that if the polycrystalline structure was applied to an LtoH medium, which was one of the objects of the present invention, the reflectance of the as-deposited state was decreased to be inadequate.

In the above described preferred embodiment, the upper and lower interference layers were produced without applying a typical, particularly great compressive stress to the recording layer. Similar to the above described preferred embodiment, a disc was experimentally manufactured by forming a recording layer on typical sputtering conditions and forming upper and lower interference layers at an Ar gas pressure of 0.1 Pa and a substrate bias of 50 W. After the disc thus experimentally manufactured was evaluated, the same result as the evaluated result of the present invention shown in table 1 was obtained. Also, when the recording film was formed by a high pressure sputtering with a heavy rare gas and when upper and lower interference films were formed by a low pressure bias sputtering, the same result was obtained. Although these evaluations were carried out at a linear velocity of 6 m/s, the recording characteristics were good from the first time by complementarily using a plurality of means, as the crystallization holding time was decreased by a high linear velocity operation.

As described above, according to this preferred embodiment, since it is possible to obtain a good recording characteristic from an as-deposited state, it is possible to improve the qualities of address signals and servo signals of a medium having an LtoH structure. In addition, since it is possible to remove an initial crystallizing step from a process for producing a phase change medium, it is possible to achieve the reduction of the producing costs of the medium, the labor saving of the producing process, and the space saving.

SECOND PREFERRED EMBODIMENT

The second preferred embodiment of the present invention will be described below. This preferred embodiment has a unique characteristic that the distribution in grain side of crystal grains with respect to the number of the crystal grains has a plurality of maximum values when the state of a phase change medium is a crystalline state.

The means necessary for carrying out this preferred embodiment and the operation thereof will be described in detail below.

As described above, the laser power and crystallizing time necessary for crystallizing an as-deposited optical recording film are conventionally different from the laser power and crystallizing time necessary for crystallizing an amorphous part formed by the fused amorphous material formation (i.e., recording). The reason for this is that the fine structure of an as-deposited amorphous state is different from that of an amorphous state formed by a subsequent optical recording operation. That is, the cooling rate in a film deposition process during a sputter deposition is very high (which is estimated to be $10^{12}$ K/sec), which is ten to hundred times as higher as the cooling rate in an amorphous part forming process during a recording operation. Therefore, it is considered that the amorphous material formed in the recording layer in the as-deposited state has a higher randomness, i.e., a smaller short-range order, than that of the amorphous part after recording.

On the other hand, the inventor obtained a recording layer capable of immediately recording (as-deposited recording) without the need of the initial crystallizing step, by repeating theoretical studies and experimental manufactures. Then, after the details of the fine structure of the obtained recording layer were examined, it was found that the obtained recording layer had unique characteristics different from those of conventional recording layers, in the distribution in crystal grain after being crystallized. That is, it was revealed that in the optical recording medium in this preferred embodiment, the crystalline state formed by irradiating with laser beams of an erase level was an aggregate of fine crystals having different crystal grain sizes, and the distribution in grain size of the fine crystals had a plurality of maximum values.

Specifically, the optical recording medium in this preferred embodiment has a phase change recording layer which reversibly changes between a crystalline state and an amorphous state by irradiation with light, and is characterized in that the distribution in the number of crystal grains constructing the recording layer with respect to the grain size thereof has the maximum values with respect to at least two different grain sizes when the state of the phase change recording layer is the crystalline state.

That is, the recording layer is a polycrystalline substance, which has the distribution in crystal grains having peaks with respect to a large crystal grain and a small crystal grain.

In addition, the area occupied by crystal grains, which belong to the distribution about the maximum value with respect to the small grain size of the at least two different grain sizes, is preferably in the range of from 20% to 90% of the area of phase change recording layer.

In addition, the small grain size of the at least two different grain sizes is preferably in the range of from 4 nm to 20 nm, and the large grain size of the at least two different grain sizes is preferably greater than 20 nm and not greater than 100 nm.

In order to achieve the as-deposited recording, when a disc is set in a recording and/or reproducing system to be operated at the same high linear velocity as that during actual use to be irradiated with laser beams of an erase power level, it is required that the disc is sufficiently crystallized by one irradiation so that the reflectance of the disc is completely a crystallization level. Specifically, the high linear velocity herein has a value of, e.g., 6 m/sec or more. When the pickup light has a wavelength of about 630 nm to about 660 nm and an NA of about 0.55 to about 0.65, the laser power during recording has three levels, an erase level Pe, a recording level Pw and a readout level Pr. Specifically, a power having a Pe of about 3 mW to about 6 mW, a Pw of about 10 mW to about 15 mW and a Pr of about 1.0 mW is selected.

When a recording is carried out, a part irradiated with laser beams of a Pe level is crystallized, and a part irradiated with laser beams of a Pw level is amorphous. A part which is not irradiated with laser beams (a part other than an object track) remains being the as-deposited amorphous. With respect to the as-deposited recording, it is important that a signal level from a crystallized region (i.e., a region between marks) after the first recording operation is not different from a signal level from a crystallized region after an overwrite is repeated two times or more. This state can be confirmed by observing, e.g., a reproduction waveform by an oscilloscope.

When a recording film suitable for an as-deposited recording is used, it is desired that a disc is designed to be "Low-to-High", i.e., so that the reflectance from a crystal part is lower than the reflectance from an amorphous part, in order to facilitate the tracking and the reading of data of a header part formed by irregularities previously embedded in a substrate. In the Low-to-High, a regenerative signal level from an erase part (crystalline) is lower than that from a recording mark part (amorphous). Ideally, it is desired that a part irradiated with laser beams of a Pe level is optically completely crystallized by only one recording operation, and a part irradiated with laser beams of a Pw level is optically complete amorphous.

That is, in the Low-to-High, it is desired that a signal from the Pe level irradiated part is sufficiently "Low", i.e., sufficiently lowered. However, in the case of a conventional optical recording medium, it was confirmed that the regenerative signal level was not sufficiently lowered by the Pe irradiation once, and the regenerative signal level tended to be gradually lowered by repeating an overwrite two times or more. On the other hand, in the case of a recording medium in this preferred embodiment, it was confirmed that the signal level from the Pe irradiated part was sufficiently lowered by only one irradiation with a laser beam modulated by the above described signal. That is, in the case of a recording medium in this preferred embodiment, it was found that the signal level from the Pe irradiated part was not changed by repeating an overwrite two times or more, and sufficiently crystallized by only one irradiation. On the other hand, in a recording medium in this preferred embodiment, the signal level from the Pw irradiated part was the same as that from the as-deposited region.

The optical recording medium in this preferred embodiment has a fine structure wherein a part between marks (an erase level Pe irradiated part) is sufficiently crystallized by only one recording operation from an as-deposited state so that crystal grains having relatively large grain sizes are surrounded by a large number of crystal grains having relatively small grain sizes. Such a fine structure can be identified by observation using, e.g., a TEM (Transmission Electron Microscope).

That is, in the TEM image obtained by the TEM observation, the recording mark part (amorphous part) is observed as a uniform region having poor contrast. On the other hand, the Pe irradiated part (crystal part) between marks is observed as crystal grains in accordance with the degree of crystallization, and as an aggregate of fine crystal grains having different contrast in accordance with crystal orientation when it is sufficiently crystallized. This tendency is generally the same even in the case of the recording films of any discs.

Figure 4:
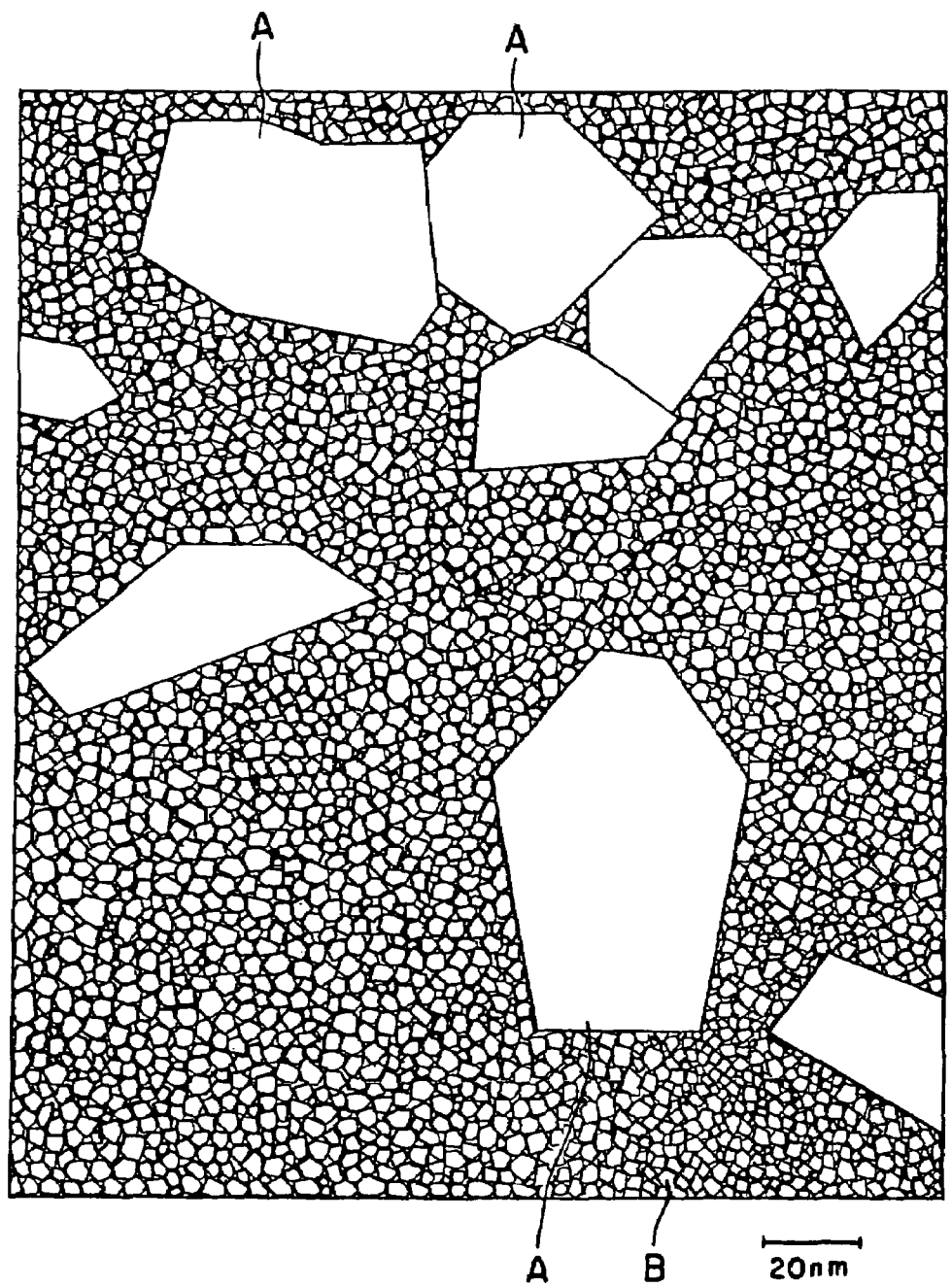
FIG. 4 is a schematic diagram showing an example of a TEM image of a recording layer of a part between marks of an optical disc according to the present invention.

FIG. 4 is a schematic diagram showing an example of a TEM image of a recording layer of a part between marks of an optical disc in this preferred embodiment. This figure shows a state of an optical disc in this preferred embodiment after being irradiated with laser beams of a Pe level only once after a recording layer is deposited. As can be seen from this figure, the recording layer in this preferred embodiment has crystal grains in all of parts between marks, and is completely crystallized to be polycrystalline. In addition, drawing attention to the crystal grain size, it can be seen that the recording layer in this preferred embodiment has a fine structure wherein crystal grains having relatively large grain sizes are tightly surrounded by crystal grains having relatively small grain sizes.

On the other hand, an overwrite was repeated ten times with respect to the optical disc in this preferred embodiment, and the TEM observation of the recording layer of the part between marks was carried out. As a result, the obtained TEM image was substantially the same as that in FIG. 4. That is, in the case of the optical disc in this preferred embodiment, it was found that the fine structure of the recording layer between marks was completely crystallized to be determined by the first irradiation with laser beams of an erase level from the as-deposited state, and was not changed by the subsequent overwrite.

A method for preparing a sample for the TEM observation will be described below. First, after a recording operation is carried out in a recording medium by the above described method, a metal reflective film and a substrate are removed, and the resulting medium is put on a metal mesh to be used as a sample to be observed. The removal of the substrate may be carried out using an organic solvent. However, it is required to prevent heat from being applied to the sample when the sample is prepared. Therefore, even if the ion milling method is used, it is required to fully carefully prevent the sample from being heated to 150° C. or higher.

By analyzing the example of the TEM image shown in FIG. 4 using an image processing, the distribution in grain size can be quantitatively derived.

FIG. 5 is a graph showing the distribution in crystal grain size in a part between marks of an optical disc in this preferred embodiment. This figure is obtained by plotting the distribution in appearance frequency of large crystal grains having a grain size of 20 nm or more, which is shown by A in the example of the TEM image of FIG. 4. In the example of FIG. 4, the proportion of the area occupied by crystal grains belonging to the distribution about the maximum value in the small grain size of the at least two different grain sizes is about 75%. Furthermore, this distribution was obtained in a region about 8.5 µm square extracted from the TEM image at random. The "grain size" is herein defined to be the average of the longest diameter and shortest diameter of one crystal grain, which are measured.

FIG. 5($a$) shows a case where only one recording operation was carried out from the as-deposited state, and FIG. 5($b$) shows a case where an overwrite was repeated ten times. It can be seen from FIG. 5 that large crystal grains are distributed in the range of from about 20 nm to about 100 nm. In addition, the distribution in crystal grain size is not substantially different even if an overwrite is repeated ten times as shown in FIG. 5($b$) The average of diameters of crystal grains belonging to the large crystal grains was 50.5 nm in FIG. 5($a$) and 60.8 nm in FIG. 5($b$). From the above results, it can be seen that the optical recording medium in this preferred embodiment is sufficiently crystallized by carrying out only one recording operation from the as-deposited state.

The grain size of the large crystal grains shown by A in FIG. 4 tends to depend on various conditions, such as the composition of the recording film and the producing process thereof. However, after the inventor carried out comparative studies with respect to various phase change recording media, it was found that the grain size of the large crystal grains was in the range of from about 20 nm to about 100 nm.

In addition, as can be seen from FIG. 4, there are a large number of fine crystal grains around large crystal grains shown by A. Similarly, the distribution in grain size was measured with respect to the fine crystal grains.

FIG. 6 is a graph showing the distribution in grain size of fine crystal grains. This figure is obtained by plotting the distribution in appearance frequency of small crystal grains having a grain size of 20 nm shown by B in the example of the TEM image of FIG. 4. This distribution is obtained by making a graph of an example of the distribution in appearance frequency of about 300 crystal grains having a size of 20 nm or less observed in a region about 2 µm square which is extracted from a TEM image of a sample at random, the sample being recorded only once from the as-deposited state, and the TEM image of the sample being observed.

It can be seen from FIG. 6 that the grain sizes of small crystal grains are distributed in the range of from about 4 nm to about 20 nm. The grain size corresponding to the maximum value of the distribution was about 7 to 8 nm. In addition, this distribution was not substantially changed even if an overwrite was repeated ten times.

On the other hand, a conventional optical disc will be described as follows.

That is, even if a conventional optical disc irradiated with a laser beam of a Pe level once, it is not crystallized, so that crystal grains are not observed. However, if an overwrite is repeated, crystallization proceeds, so that relatively large crystal grains are observed in the Pe irradiated part. If the distribution in grain size is analyzed, although the grain sizes are different in accordance with the composition of the recording film, the grain sizes are distributed in a certain range about a certain mean so that the distribution does not have a plurality of maximum values. For example, in the case of $Ge_2Sb_2Te_5$, the grain sizes are distributed in the range of from 70 nm to 150 nm, so that the crystallized part is filled with crystal grains having such a size. That is, the recording layer is filled with large crystal grains, and the distribution in grain size has a single maximum value.

Even if the conventional optical disc is initialized by an initializing system, the same result is obtained. That is, it was found that the crystallized part was filled with relatively large crystal grains having a grain size of about 70 to 150 nm.

As described above while comparing with the conventional optical disc, the optical disc in this preferred embodiment is characterized in that crystallization occurs sufficiently if irradiation with laser beams of an erase level is carried out only once, and the distribution in grain size has two maximum values in large crystal grains and fine crystal grains.

It is considered that the unique fine structure of the recording film in this preferred embodiment appears by the following mechanism. That is, it is well known that crystallization occurs in two stages, a nucleation stage and its grain growth stage. Then, in the recording layer of the optical disc in this preferred embodiment, there are already a large number of very fine regular structures capable of being an initial nucleus for crystallization even in the as-deposited state. Such a fine regular structure has a fine crystal nucleus having a size of about 0.5 to 4 nm.

When temperature rises to about the crystallizing temperature by irradiation with laser beams, the fine regular structures grow, so that small crystal grains having a size of about 4 nm to about 20 nm are produced about the respective fine regular structures. In this state, a large number of such small crystal grains are produced in the recording layer. These crystal grains form fine crystal grains shown by B in FIG. 4. This crystal grain size is an optically important value. When the crystal grain size is this value or less, the complex index of refraction approaches that of an amorphous material. If the grain size is 4 nm or more, the complex index of refraction is equal to that of a crystal. In addition, since the crystal grains are small, time necessary for the above described fine structure to grow to crystal grains having a size of about 4 to 20 nm may be short. Therefore, even at a high linear velocity, the state of the as-deposited disc can be changed to a state of an optically crystallized level by irradiating the disc with laser beams of an erase level.

On the other hand, after such an initial nucleation process, a crystal grain growing process occurs. In the case of the optical recording medium in this preferred embodiment, a large number of nuclei are already produced in an initial stage of irradiation with laser beams. Therefore, most of crystal nuclei can not further grow, and only a small number of crystal grains, which has a relatively small nucleus density around the crystal grains and which is held in a crystal growth temperature zone for a long time, become large crystal grains shown by A in FIG. 4. Furthermore, of course, such a crystal having a large grain size has optically a refractive index of a crystal.

The recording film in this preferred embodiment has the same fine structure even if it is initialized by a conventional initializing system. That is, bulky crystal grains having a size of 20 to 100 nm are surrounded by fine crystal grains having a size of about 4 to 20 nm. Also in this case, the grain sizes of most of crystal grains are very small, so that the crystallizing time to crystallize an amorphous material may be short. That is, the recording film is more suitable for a high linear velocity, and has an improved erasing rate.

In addition, the optical recording medium in this preferred embodiment is characterized in that the percentage of the area of crystal grains belonging to small grain sizes to that of all of the crystal grains is in the range of from 20% to 90%. moreover, It was found by the inventor's study that it was possible to more stably and surely carry out crystallization when the percentage of the area is in the range of from 40% to 80%. That is, when crystallization is carried out to exhibit such a distribution in grain size, the recording film has the best balance of crystal nucleation and crystal growth and can accomplish a high erasing rate. In addition, the recording film is suitable for the as-deposited recording.

As a method for producing an optical recording medium having a unique construction in this preferred embodiment, there is a method using krypton (Kr) and/or xenon (Xe) as a sputter gas as described above.

The reason why the cooling effects of Kr and Xe are superior to those of sputter particles, such as germanium (Ge), antimony (Sb) and tellurium (Te), will be described in more detail below. That is, in the deposition using the sputter method, sputter particles emitted from a target collide with atmospheric gas particles before the sputter particles reach a substrate. The kinetic energy which is lost at this time depends on the mass of an object to collide with the sputter particles. When approximation is carried out using a rigid body collision model, incident particles have the same mass as that of counter particles colliding with the incident particles. Assuming that the counter particles stand still, all of the kinetic energies of the incident particles move to the counter particles in the case of a head-on collision. In the case of a collision other than the head-on collision, the kinetic energy moves in a ratio corresponding to an impact parameter. If the kinetic energy is integrated over all of the impact parameters, half of the kinetic energy of incident particles moves to counter particles on the average when the incident particles collide with the same kind of the counter particles once. If a rigid body collision model is assumed, and assuming that the mass of a colliding particle is m1 and the mass of a collided particle is m2, the proportion of lost energy is expressed by $2m1 \cdot m2/(m1+m2)^2$.

The dominant mass numbers of Ge, Sb and Te atoms are 73, 122 and 123, respectively. For example, when Sb collides with Ar (mass number: 40), only 37% of the energy of Sb moves, whereas when Sb collides with Xe, 50% of the energy of Sb moves. When one particle collides with other particles a plurality of times, there is a conspicuous difference particularly due to the kind of gas. In general, as the mass numbers of two colliding particles are close to each other, the kinetic energy is efficiently lost. Therefore, if sputter particles collide with Kr or Xe, the energies thereof are sufficiently lowered, i.e., temperature is lowered, and then, the sputter particles reach the substrate. Therefore, while the temperature of the sputter particles on the substrate becomes room temperature, the cooling rate decreases, so that the randomness of the film decreases. As a result, it is possible to obtain an amorphous material having a randomness approximate to that of an amorphous part after an optical recording operation. Although the degree of the lost kinetic energy of the sputter particle depends on a collision rate, the collision rate $\upsilon$ is expressed by $\upsilon = 1/n\,\sigma$ ($\sigma$ is a collision cross section, and $n = p/k_B T$ is a gas particle density), so that the collision rate can be suitably adjusted by an atmospheric gas pressure.

Referring to concrete examples, this preferred embodiment will be described in more detail below.

First Example

FIG. 7 is a conceptual sectional view of the first preferred embodiment of a phase change recording medium according to the present invention.

In this figure, reference number 201 denotes a substrate, 202 denoting a first interference layer, 203 denoting a recording layer, 204 denoting a second interference layer, and 205 denoting a reflective layer. This medium was prepared by the following method. First, an optical disc substrate 201 of a polycarbonate having grooves having a width of 0.6 µm is mounted in a substrate holder of a multi-chamber sputtering system. Then, a first interference layer 202 having a thickness of 80 nm is deposited by the RF sputtering method in a sputtering chamber having a ZnS—$SiO_2$ composite target. Then, a recording layer 203 having a thickness of 20 nm is deposited by the DC sputtering method in a sputtering chamber having GeSbTe target. Subsequently, a second interference layer 204 having a thickness of 30 nm is deposited by the RF sputtering method in a sputtering chamber having a ZnS—$SiO_2$ composite target. Finally, a reflective layer 205 having a thickness of 50 nm is deposited by the DC sputtering method in a sputtering chamber having an Al target.

As a sputtering gas, pure Ar was used for depositing layers other than the recording layer 203, and a mixed gas of Ar and Kr was used for depositing the recording layer 203. The composition of the gas was Ar:Kr=1:10, and the total pressure was 4.0 Pa. As a vacuum gage for measuring a gas pressure, a diaphragm gage suitable for the measurement of the total pressure was used. The probe of the diaphragm gage was provided at a location wherein the probe was not under the influence of the position distribution in gas pressure, not at a location near a gas inlet. To the disc substrate ejected after the thin-film deposition is completed, a dummy substrate (thickness: 0.6 mm) was bonded by an UV resin to form a medium to be evaluated.

This recording medium was evaluated on at a constant linear velocity. While the state of the recording medium remained being the as-deposited state, a 3T signal having a linear velocity of 8.2 m/sec and a clock frequency of 116.45 MHz was recorded on an as-deposited disc. Thus, a CNR of 52.5 dB was obtained. In addition, when random signals of 3T to 11T were recorded on different tracks in the as-deposited state, a jitter value of 8.2% was obtained. In this track, an overwrite was repeated ten times, so that the jitter value was changed to 8.4%. Moreover, after an overwrite was repeated hundred times and thousand times, the jitter values were measured. The measured jitter values were in the range of from 8 to 9%.

Thus, it was possible to obtain a good jitter and repetition characteristic by recording directly in the as-deposited track.

Then, the crystalline state of the crystal part formed in the recording film in this preferred embodiment was examined by the TEM. First, the as-deposited track was irradiated only once with a laser beam, which was modulated by an 11T signal at the above described linear velocity and recording clock frequency, to form a mark row, and a regenerative signal waveform was observed. In this experiment, after the relationship between laser powers Pe of an erase level and regenerative signal levels from a location between marks was measured, the regenerative signal level was minimum at Pe=4.5 mW. The regenerative signal level is reflected in the reflectance of a track which is read out by laser beams. Therefore, the minimum of the regenerative signal level exhibits the optimum crystallizing condition. Thus, the optimum erase power was found.

Then, a sample for the TEM observation was formed. That is, an 11T signal was written in another as-deposited track at Pe=4.5 mW and Pw=12 mW by only one rotation of a disc. This was carried out in a plurality of tracks so as to facilitate observation as the TEM sample. This part will be hereinafter referred to as an "as-deposited recording part". In addition, a sample overwritten in different tracks a plurality of times at the same recording condition was prepared for comparison. Then, the Al reflective layer 205 and the substrate 201 were removed, and the residue was put on a metal mesh to be used as a sample to be observed. The Al reflective layer 205 was removed by a method for putting mesh-like scratches on the film to apply a tape thereon by an adhesive to peel off the layer. In addition, the substrate 201 was dissolved in an organic solvent to be removed. According to these methods, there is no heating process for changing the crystalline state.

First, a TEM bright field image of a part between marks of the as-deposited recording part was observed. From this result, the erase part was the same polycrystalline substance as that in the example of FIG. 4, and microcrystal and amorphous parts, which were not able to be resolved by the TEM, were not particularly observed. The respective crystal grains were observed by their crystal orientation as an aggregate of microcrystals having different contrasts.

On the basis of the TEM image, the grain size of the crystal grains was measured, and the appearance frequency thereof was examined. It was found by the analysis that two kinds of crystal grains, one kind of which belongs to fine crystal grains having a size of 4 to 20 nm about 8 nm and the other kind of which belongs to large crystal grains having a size of 20 to 100 nm, can be clearly distinguished from each other in both regions of the Pe irradiated region of the as-deposited recording part and the Pe irradiated region after the repeated overwrite. After the distribution in grain size of the large crystal grains and fine crystal grains was analyzed, the same graphs as FIGS. 5 and 6 were obtained.

Thus, it was revealed that the recording film in this preferred embodiment suitable for the as-deposited recording is characterized in that it is polycrystallized by irradiation with a laser beam of an erase level only once and that the distribution in grain size of the formed crystal grains comprises relatively large crystal grains distributed in the range of from 20 to 100 nm, and crystal grains which are filled around the relatively large crystal grains and which are distributed in the range of from 4 to 20 nm. In other words, it was revealed that the distribution has a plurality of maximum values when the appearance frequency of grain sizes is a function with respect to grain sizes. In addition, it was revealed that the distribution in grain size of the crystal part also has a plurality of maximum values even if an overwrite is repeated a plurality of times.

While the recording film has been formed of GeSbTe in this example, the recording film may be formed of InSbTe, AgInSbTe, AuInSbTe or any one of these material systems containing additional elements, or other phase change recording films may be used to obtain the same advantages as those in this example. In addition, the recording film in this example is not only applied to a repeatable medium, but it may also be applied to a once writable or rewritable type recording medium, such as a so-called CD-R or CD-RW to obtain the same advantages as those in this example.

COMPARATIVE EXAMPLE

For comparison with the above described example, an optical disc having a recording film 203 formed by a typical deposition process was prepared, and the same experiment was carried out. The construction and thickness of the films of the disc were the same as those in the first example. Films other than the recording film were deposited by the same method as that in the first example. As a sputter gas for the recording film, Ar gas was used, and the gas pressure was adjusted to be 1.0 Pa.

With respect to this disc, the as-deposited track was irradiated once with a beam, which was modulated by an 11T signal at the same linear velocity and recording clock frequency as those in the first example, to form a mark row to observe a regenerative signal waveform. As a result, the signal level from the Pe irradiation part was not sufficiently lowered by the Pe irradiation once. Moreover, the Pe was changed to carry out an experiment. When the Pe was less than 2.5 mW, there was no change. When the Pe was 2.5 mW or more and less than 6 mW, the reflectance was slightly lowered. However, the reflectance did not reach a saturated level, and was close to the signal level from the as-deposited part. In addition, when the power was 6 mW or more, the reflectance was not lowered. The reason for this is considered that the power is too high, so that the recording layer is partially molten and changed to be amorphous again when being cooled.

When an overwrite was carried out twice or more at a Pe of 2.5 mW or more and less than 6 mW, the reflectance was gradually lowered while the overwrite was repeated. When the overwrite was repeated five times or more, the signal level from the Pe irradiated part reached the saturation level. Therefore, assuming that the optimum Pe level during actual use was a power, at which a signal level from a part between marks after an overwrite was repeated ten times was minimum, the optimum Pe level was 4.0 mW.

Then, a sample for the TEM observation was formed. That is, an 11T signal was written in different as-deposited tracks at Pe=4.5 mW and Pw=12 mW by only one rotation of a disc. This was carried out in a plurality of tracks so as to facilitate observation as the TEM sample. This part will be hereinafter referred to as an "as-deposited recording part". In addition, a part overwritten in different tracks a plurality of times at the same recording condition was prepared for comparison.

Then, the Al reflective layer and the substrate were removed, and the residue was put on a metal mesh to be used as a sample to be observed. First, the TEM image of a part, at which a recording was carried out only once, was observed. As a result, it was found that when the as-deposited recording was carried out, the Pe irradiated part had a uniform contrast wherein crystal grains were not clearly identified, so that the Pe irradiated part remained being amorphous. This is supported by the fact that only a halo-like pattern was observed as an electron beam diffraction pattern of the Pe irradiated part. In addition, the recording mark part (amorphous) was observed as a uniform region having a poor contrast.

On the other hand, when an overwrite was repeated in the same disc, crystal grains were clearly identified in the Pe irradiated part. After the distribution in grain size of the Pe irradiated part was analyzed, it was revealed that most of grain sizes were in the range of from 70 to 150 nm.

FIG. 8 is a graph wherein the appearance frequencies of measured individual crystal sizes are plotted. That is, in this figure, the appearance frequencies of the grain sizes of all of the crystal grains are plotted from a region about 4.5 μm optionally obtained in a TEM photograph. As can be seen from FIG. 8, in a conventional optical disc, the distribution in grains size had a single maximum, and the maximum value thereof was about 110 nm. That is, it was found that the recording layer was filled with relatively large crystal grains.

In addition, after a track recorded twice for comparison was examined by the same TEM observation, it was found that crystallization did not proceed, so that most of regions were amorphous although crystal grains were partially observed.

Second Example

The second example of this preferred embodiment of a phase change optical recording medium according to the present invention will be described below.

In this example, the phase change optical recording medium has the same cross section as that of FIG. 7. However, the thickness of each of layers was designed so as to be suitable for a so-called High-to Low-construction which has a high reflectance when the state of a recording film 203 was a crystalline state.

That is, while the material of each of the layers was the same as the first example of this preferred embodiment, the thickness of a first interference layer 202, the thickness of a recording layer 203, the thickness of a second interference layer 204, and the thickness of a reflective layer 205 were 160 nm, 20 nm, 5 nm and 150 nm, respectively. The procedure for producing a recording medium was the same as that of the first example of this preferred embodiment.

Then, the recording medium thus produced was loaded in an initializing system to initialize the whole surface thereof. The laser beam of the used system was an elliptical beam having a size of 95 μm×1 μm. The initializing conditions included a linear velocity of 2 m/sec, a feed pitch of 12 μm and a laser power of 300 mW.

Then, the recording medium thus initialized was evaluated at a constant linear velocity. First, when a 3T signal having a linear velocity of 8.2 m/s and a clock frequency of 116.45 MHz was recorded, a CNR of 51.2 dB was obtained. Moreover, when an 11T signal was recorded on another initialized part of the disc once, a CNR of 56.5 dB, which was a good value as the CNR of the 11T signal, was obtained.

Then, when the 11T signal was overwritten by the 3T signal, the intensities of these signals were as follows.

11T carrier level: −47.2 dBm
3T carrier level: −12.5 dBm
effective erasing ratio: 34.7 dB The "effective erasing ratio" is defined as a difference between the signal strength of the written 11T signal and the signal strength of the overwritten 3T signal.

Then, when random signals from 3T to 11T were recorded on another initialized track, a jitter value of 9.5% was obtained. When an overwrite was repeated in this track, the jitter value was changed in the range of from 8% to 9%, so that it was confirmed that a very good jitter characteristic was obtained.

The reason why the good repetition characteristic was thus obtained is that a recorded amorphous mark was sufficiently erased by the overwrite as can be seen from the fact that the erasing rate was good, 34.7 dB.

Then, the crystalline state of the recording film was examined by the TEM. A part, which was only initialized and which was not recorded, was observed. A track, in which an overwrite was carried out a plurality of times, was also formed in the initialized part for comparison.

First, a sample was prepared by the same method as that of the first example, and the TEM bright field image of the initialized part was observed. The result was the same as the example of FIG. 4, and the initialized part was clearly polycrystalline. A fine crystal or amorphous part, which was not able to be dissolved by the TEM, was not detected. The respective crystal grains were observed as an aggregate of fine crystal grains having different contrast in accordance with their crystal orientation.

The grain sizes of the crystal grains were measured on the basis of the observed TEM image, and the appearance frequencies thereof were examined. First, the bright image of a region 8 μm square was picked up, and the grain sizes of crystal grains belonging to crystal grains of a large grain size were measured. Specifically, the longest diameter and the shortest diameter of the respective crystal grains were measured, and the average thereof was obtained to be recorded. The diameters of the respective crystal grains were distributed in the range of from 20 to 100 nm, and its average was 60 nm.

Then, when crystal grains of other parts belonging to crystal grains of a small grain size were observed at a high power, any parts were aggregates of relatively small grains having a grain size of 4 to 20 nm.

In addition, when a crystal part formed by repeating the overwrite was observed, it was revealed that the crystal part was similarly divided into large crystal grains and parts surrounded by and filled with fine crystal grains.

Furthermore, while the recording film 203 has also been formed of GeSbTe in this example, the recording film may be formed of InSbTe, AgInSbTe, AuInSbTe or any one of material systems containing additional elements to obtain the same advantages as those in this example. In addition, the recording film in this example is not only applied to a repeatable medium, but it may also be applied to a once writable or rewritable type recording medium, such as a so-called CD-R or CD-RW to obtain the same advantages as those in this example.

While this preferred embodiment of the present invention has been described in the terms of the examples, this preferred embodiment should not be limited to these examples.

For example, in the above described example, a four-layer structure of $ZnS$—$SiO_2$/GeSbTe/$ZnS$—$SiO_2$/Al deposited on a substrate by sputtering is illustrated. However, a five-layer structure wherein an Au semitransparent film is provided in the four-layer structure may be used. In addition, the material and thickness of each of the layers, and the method and conditions for depositing films other than the recording film should not be limited, except for the conditions for sputtering and initializing the recording layer which are important in this preferred embodiment.

For example, in the case of a five-layer structure, the semitransparent layer may also be formed of copper (Cu), silicon (Si) or a film having a structure wherein fine metal particles are dispersed in a dielectric matrix, in place of Au.

In addition, in place of the semitransparent film of the five-layer structure, a laminated film of two or more layers of two or more kinds of transparent film materials having different refractive indexes may be used. For example, if a film formed by sequentially laminating a ZnS film or a mixed film of ZnS and $SiO_2$, an $SiO_2$ film, and a ZnS film or a mixed film of ZnS and $SiO_2$, which have an appropriately selected thickness, is used, it is possible to provide a medium more suitable for a high density recording.

In addition, the material of the interference layer may be suitably selected from dielectric film materials, such as $Ta_2O_5$, $Si_3N_4$, $SiO_2$, $Al_2O_3$ and AlN, in place of $ZnS$—$SiO_2$, and the material of the recording layer may be suitably selected from chalcogen film materials, such as InSbTe, AgInSbTe and GeTeSe, in place of GeSbTe. The material of the reflective layer may be suitably selected from Al alloy film materials, such as AlMo, AlCr and AlTi, in place of Al.

Moreover, while the optical disc has been described as an example of an optical recording medium in the above described example, this preferred embodiment should not be limited thereto. For example, this preferred embodiment may be applied to any one of various optical recording media, such as an optical recording card, to obtain the same advantages as those of this preferred embodiment.

This preferred embodiment is applied in the above described form to have the undermentioned advantages.

First, according to this preferred embodiment, it is possible to provide an optical recording medium, which can be used immediately in an as-deposited state without passing through an additional process for initial-crystallizing a recording film and which has excellent recording characteristics and high repeatable overwrite characteristics.

As a result, it is possible to reduce equipment investments, operation costs and time necessary for initial crystallization, and it is possible to provide an inexpensive, high performance optical recording medium.

For example, in the case of a conventional optical recording medium, a tact time per disc in a deposition step is several seconds, whereas a tact time in an initialization step is several minutes, which serve as a great bottle neck for production. On the other hand, according to this preferred embodiment, it is possible to reduce such an initialization step, so that it is possible to greatly improve production throughput.

THIRD PREFERRED EMBODIMENT

The third preferred embodiment of the present invention will be described below.

In this preferred embodiment, there is provided a phase change recording medium which has a recording layer, wherein a phase change between a crystal phase and an amorphous phase is caused by irradiation with light from the outside, as means for accomplishing the above described object, and which is characterized in that the recording layer contains at least one of krypton and xenon.

The total percentage content of krypton and xenon in the recording layer is preferably in the range of from 0.2 to 10 at. % (atomic percent).

This allows the amorphous state of the recording layer immediately after sputtering deposition, i.e., in the as-deposited state, to approach the amorphous state after an optical recording operation to allow a recording reproducing operation without the need of any initial crystallizing steps.

The inventor found that it was possible to obtain the optimum characteristic of a recording film of an optical recording medium when the film contains krypton (Kr) and/or xenon (Xe), particularly when the atomic fraction of KR and/or Xe is in the range of from 0.2 to 10%, as a method for depositing an amorphous material having a favorable randomness in the as-deposited state with a good controllability.

When an amorphous mark is recorded in the as-deposited state of the phase change optical disc thus formed, a unique construction is formed. That is, a region between marks is crystallized, so that amorphous marks are scattered in a narrower crystallized band than the width of a track. The width of a mark is narrower than or equal to the width of the crystallized band. When it is equal to the width of the crystallized band, the amorphous parts are connected in the form of a network, and the crystallized region between marks exists therein. When the linear velocity is not high and when the end portion of the amorphous mark is crystallized, a slightly narrower crystal band than the width of a track is formed, and a slightly narrower amorphous mark than the width of the band exists in the band. The region between the crystal bands holds the amorphous state immediately after the sputtering formation.

That is, in this preferred embodiment, there is provided a phase change optical disc wherein the reflectance (Rc) of the crystal part is adjusted to be lower than the reflectance (Ra) of the amorphous part viewed from an optical detection side and wherein a recording state has an amorphous mark row having a width, which is narrower than or equal to the width of a crystal band than the width of a track, in the crystal band, the state of the phase change recording layer of an address part being an amorphous state in the phase change optical disc wherein the Rc is adjusted to be lower than the Ra viewed from the optical detection part.

In the state wherein the width of the crystal band is equal to the width of the amorphous mark, the end portion of the amorphous mark is connected to the amorphous band between the crystal bands. In this case, although it is difficult to define the width of the mark, it is defined in this preferred embodiment that the width of the mark corresponds to that of the crystal band when the width of the mark is connected to the amorphous band.

In general, a groove for a tracking guide is provided on an optical disc substrate, and a medium film is deposited thereon, so that the region between tracks is a groove stepped part. In this preferred embodiment, an optical disc is characterized in that the state of at least part of the groove stepped part is an amorphous state. The amorphous state between tracks may be formed after a recording operation is carried out in an unrecorded disc at least once, and may be changed to a crystalline state after an overwrite is carried out a plurality of times. It can be determined by, e.g., the electron beam diffraction method for irradiating with stopped electron beams, whether the state of the region between tracks is an amorphous state or a crystalline state.

Referring to the accompanying drawings, an example of this preferred embodiment will be described below.

FIG. 9 is a schematic sectional view showing an example of a phase change optical disc in this preferred embodiment. In this figure, reference number 301 denotes a substrate, 302 denoting a first interference layer, 303 denoting a recording layer, 304 denoting a second interference layer and 305 denoting a reflective layer. The optical sick of FIG. 9 can be produced by, e.g., the following method. First, an optical disc substrate 301 of a polycarbonate having grooves having a width of 0.6 μm is mounted in a substrate holder of a multi-chamber sputtering system.

FIG. 10 is a schematic diagram showing a principal part of a sputtering system for use in this preferred embodiment. In this figure, reference number 311 denotes a sputtering chamber, 312 denoting a disc substrate, 313 denoting a sputtering target, 314 denoting a sputtering source, 315 denoting a sputtering power supply, 316 denoting a gas introducing system, 317 denoting an exhaust system, and 318 denoting a substrate surface migration control system. The sputtering chamber of FIG. 10 was used for forming the recording layer 303. Other layers were deposited in other sputtering chambers having similar constructions using their sputtering methods and conditions.

First, the substrate 301 is transported to a sputtering chamber having a ZnS—$SiO_2$ composite target to deposit a first interference layer 302 having a thickness of about 80 nm by the RF sputtering method. Then, the substrate 301 is transported to a sputtering chamber having a GeSbTe target to deposit a recording layer 303 having a thickness of about 20 nm by the DC sputtering method. Subsequently, the substrate 301 is transported to the sputtering chamber having the ZnS—$SiO_2$ composite target again to deposit a second interference layer 304 having a thickness of about 30 nm by the RF sputtering method. Finally, the substrate 301 is transported to a sputtering chamber having an Al target to deposit a reflective layer 305 having a thickness of about 50 nm by the DC sputtering method.

When the recording layer 303 was deposited, a mixed gas of Ar and Xe was used as a sputtering gas. The composition of the gas was Ar:Xe=1:4, and the gas pressure was 2.0 Pa.

After a sample deposited on the same conditions as those of the deposition of the recording layer 303 was analyzed by a Rutherford back scattering (RBS), it was revealed that the composition of contained Xe was 2.5 atomic %.

This optical disc was evaluated at a constant linear velocity without carrying out the initial crystallizing step. After a 3T signal having a clock frequency of 116.45 MHz was recorded on an as-deposited disc at a linear velocity of 8.2 m/sec in accordance with the DVD standard, a CNR value of 52.5 dB was obtained. After random signals from 3T to 11T were recorded on another as-deposited track, a jitter value of 8.5% was obtained. When an overwrite was repeated in this track, the jitter value gradually decreased, and it was 8.4% when the overwrite was repeated ten times. Moreover, when the overwrite was repeated hundred times and thousand times, both of the measured jitter values were in the range of from 8 to 9%.

Thus, according to this preferred embodiment, it is not required to carry out the initial crystallization, and it is possible to obtain good CNR and repetition characteristics even if a recording is carried out directly in an as-deposited track.

The inventor studied the details of the relationship between the amount of a rare gas contained in the recording layer 303 and the characteristic of the disc.

Figure 11:
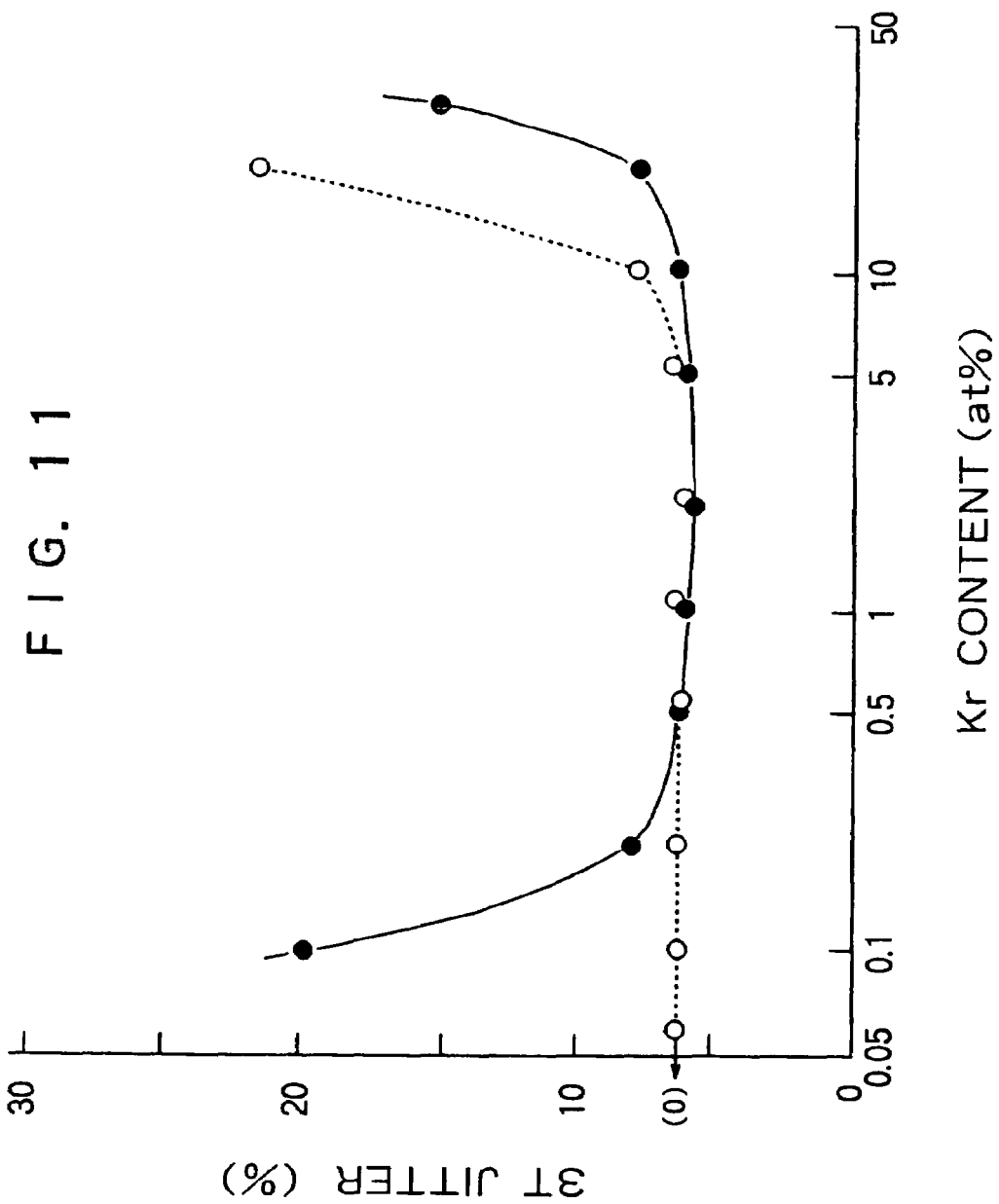
FIG. 11 is a graph showing the relationship between the amounts of Kr, which are contained in a recording layer, and 3T jitter characteristics.

FIG. 11 is a graph showing the relationship between the amount of Kr contained in a recording layer and a 3T jitter characteristic. The content of Kr was measured by the RBS. In addition, the content ratio of Kr in the recording layer depends on the pressure of Kr gas, the thin-film deposition rate and the substrate bias when the recording layer is deposited. That is, as the gas pressure increases, or as the thin-film deposition rate decreases, there is a tendency for the amount of Kr incorporated into the film to increase. In addition, with respect to the substrate bias power, the content ratio of Kr was highest when an appropriate bias was applied. In general, it is considered that, as the content of Kr increases, the randomness of the recording layer decreases to approach an amorphous state after an optical recording operation.

In FIG. 11, black plotted points denote jitter amounts when a 3T mark row is recorded once without carrying out initialization after a thin-film deposition, and white plotted points denote jitter amounts when a 3T mark row is recorded after the recording of a 3T mark row and the DC erase are repeated hundred times. The jitter amount on the axis of ordinates of the graph is expressed by percentage with respect to the width of a window.

The standard of an allowable amount of 3T jitter including a practical operating margin as a drive is 8%. When the jitter is less than this standard, a low BER (bit error rate) operation having a high reliability is ensured, and when the jitter is not less than the standard, there is no reliability. As can be seen from FIG. 11, the initial recording jitter (black circle) is higher than 8% when the content ratio of Kr is less than 0.2 at % (atomic percent), so that it is difficult to ensure the low BER operation. On the other hand, the jitter exceeded 8% again when the content ratio of Kr was 20 at % or more. That is, it was found that it was possible to obtain a good jitter characteristic in a content therebetween.

The reason why the jitter is high when the content ratio of Kr is less than 0.2 at % is that the relaxation of the cooling rate of the recording layer during the thin-film deposition is insufficient in this range to lack the formation of the short-range order state, so that it is difficult to carry out crystallization from a non-initialized amorphous state. On the other hand, the rapid increase of the jitter at a Kr content ratio of less than 20 at % is based on the decrease of the CNR which is based on the decrease of the amplitude of a signal. It is considered that this is caused by the fact that the change of the optical characteristic between a crystal and an amorphous material decreases in a recording layer containing an excessive amount of Kr of 20 at % or more.

The jitter (white circle) after repeated recording is held to be a sufficient low value from a conventional recording layer containing no Kr (the white circuit at the left end in FIG. 11; "0" in 0 of an arrow extending to the left means that Kr is contained), to a film having a Kr content ratio of 10 at %, and rapidly increases when the Kr content ratio is 10 at % or more. Because in the case of a film containing 10 at % Kr or more, atomic diffusion proceeds by repeating heating and cooling cycles, so that the state of the film becomes a phase separation state. Therefore, it can be seen that the Kr content ratio, in which a low jitter operation can be carried out after a recording operation is repeated after carrying out the initial recording without carrying out the initialization step, is in the range of from 0.2 to 10 at %. After the same experiment was also carried out with respect to Xe, the content ratio of Xe was in the range of from 0.2 to 12 at %, which was a slightly wide range, so that a low jitter characteristic was obtained over the repeated recording from the initial recording.

That is, according to this preferred embodiment, it is possible to promote the short-range order state in the as-deposited state by carrying out a sputtering deposition using a gas, such as Kr and Xe, and selecting deposition conditions so that the composition of the gas is in a predetermined range of composition, and it is possible to obtain a very good light writing characteristic without carrying out the initial crystallizing step.

Furthermore, while GeSbTe has been used as the material of the recording layer in this preferred embodiment, InSbTe or any one of material systems containing additional elements added thereto may be used to obtain the same advantages as those in this preferred embodiment. In addition, this preferred embodiment is not only applied to a repeatable medium, but it may also be applied to a once writable or rewritable type recording medium, such as a so-called CD-R (compact disc-recordable) or CD-RW to obtain the same advantages as those in this preferred embodiment.

An example of this preferred embodiment, wherein the state of a track after recording was examined, will be described below.

FIG. 12 is a sectional view showing the schematic construction of an optical disc in this preferred embodiment. That is, the optical disc in this preferred embodiment comprises a semitransparent film 322, a lower interference film 323, a recording layer 324, an upper interference film 325 and a reflective layer 326, which are laminated on a substrate 321 in that order. The substrate 321 is a pre-formatted polycarbonate substrate having a diameter of 120 mm and a thickness of 0.6 mm, and comprises an address part of pre-pit strings and a data part, in which pre-grooves are formed. A method for producing the substrate 321 comprises the typical steps of: mastering a master disc, preparing a stamper by plating, and injection-forming a polycarbonate resin on the stamper. In this preferred embodiment, the track width of each of grooves G and lands L was set to be 0.74 μm, which was the same as that of the first generation DVD-RAM (digital versatile disc-random access memory) standard, and the depth of each of the grooves G was set to be 70 nm, which was the same as that of the stroke cancel specification.

The respective layers formed on the substrate 321 include the Au semitransparent layer 322 having a thickness of 10 nm, the lower ZnS—SiO$_2$ interference layer 323 having a thickness of 85 nm, the GeSbTe recording layer 324 having a thickness of 10 nm, the upper ZnS—SiO$_2$ interference layer 325 having a thickness of 30 nm and the AlMo reflective layer 326 having a thickness of 100 nm, which are arranged in that order from the substrate surface. The composition of each of the upper and lower ZnS—SiO$_2$ interference films was a standard composition containing 20 at. % SiO$_2$, and the composition of the GeSbTe recording layer was a standard composition wherein Ge:Sb:Te=2:2:5. The optical design values of an optical disc having the above described structure include an Rc (reflectance of crystal part) of 5%, an Ra (reflectance of amorphous part) of 20%, and an Ac (absorptivity of crystal part)/Aa (absorptivity of amorphous part) of 1.3, which are the same as those of a typical absorptivity adjusting LtoH structure.

In addition, in the film structure, the phase difference between the reflected light beams of the crystal part and amorphous part was adjusted to be zero. All of layers other than the recording layer 324 were formed by typical sputtering method and conditions for use in typical experiments. That is, the sputtering method was the magnetron sputtering method, and the sputter gas was pure Ar gas. In addition, the gas pressure was 0.67 Pa, and the power inputted to the target was tens to hundreds W. Moreover, the substrate was a non-bias substrate.

On the other hand, the technique and conditions for depositing the GeSbTe recording layer 324 was special technique and conditions in this preferred embodiment. Referring to FIG. 10, a method for forming the recording layer will be described below. First, a substrate 321, on which a semitransparent layer 322 and a lower interference layer 323 have been formed, is introduced into a sputter chamber 311 for forming a recording layer, and mounted on a substrate holder facing a target 313 shown in FIG. 10. Then, the sputter chamber 311 is evacuated, and a mixed gas of Kr and Xe containing 20% Kr was introduced from a gas supply system 316 at a total flow rate of 200 sccm. Then, after the conductance of an exhaust system 317 was adjusted so that the gas pressure in the sputter chamber 311 was adjusted to be 6.7 Pa, an RF power of 50 W was inputted to a sputter source 314 by a power source 315, and simultaneously, a surface migration control system 318 was operated to input a weak RF power of 10 W to the substrate to bias-magnetron-sputter the GeSbTe target 313 for five minutes to form a GeSbTe recording layer 324 having a thickness of 10 nm on the lower interference layer 323.

The different points from a typical sputtering were as follows:

(1) The mixed gas of Kr and Xe was used as a sputter gas to allow GeSbTe sputter particles to easily lose energy in a gaseous phase;

(2) The gas pressure was set to be high to promote the cooling of the GeSbTe sputter particles in the gaseous phase, and the energy of the gas ions being incident on the target was decreased to decrease the energy when the sputter particles were emitted from the target;

(3) The power inputted to the sputter source was set to be relatively low to more decrease the energy when the sputter particles were emitted; and (4) The weak bias was applied to the substrate to cause the gas ions to be incident on the substrate during the thin-film deposition so as not to thermally damage the polycarbonate substrate 21 to increase the surface migrate time for the sputter particles on the substrate.

The above described different points are effective in the decrease of the energy of the sputter particles being incident on the substrate and in the increase of the transition time from a random liquid phase state to a solid phase state on the substrate, i.e., in the decrease of the cooling rate for the sputter particles. By such a method, the cooling rate for the GeSbTe sputter particles in the sputter deposition process can be decreased from $10^{12}$ K/sec in the conventional method to an order of $10^{10}$ K/sec during an optical recording operation, so that the amorphous state immediately after the thin-film deposition can approximate to the amorphous state during the optical recording operation.

In order to cause the amorphous state immediately after the thin-film deposition to approximate to the amorphous state during the optical recording operation, it is not always required to carry out all of (1) the selection of a sputter gas suitable for the above described material of the recording layer, (2) the increase of the gas pressure so as to be suitable for the above described material of the recording layer, (3) the decrease of the sputter power so as to be suitable for the above described material of the recording layer, and (4) the application of the substrate bias so as to be suitable for the above described material of the recording layer. These methods may be suitably combined.

In addition to the above described methods, effective methods include (5) a method for heating the substrate to about tens ° C. during the thin-film deposition, and (6) a method for promoting the surface migration of the sputter particles on the substrate or for ionizing the sputter particles emitted from the target surface to pass the sputter particles through a deceleration field, by a method for providing an auxiliary ion source to irradiate the surface of the substrate with an ion shower during the thin-film deposition or the like.

Moreover, effective methods include (7) a method for increasing the distance between the target and the substrate, and (8) a method for decreasing the energy of the sputter particles being incident on the substrate by a method for eccentrically arranging the substrate with respect to the target to deposit a film by only sputter particles emitted obliquely from the target surface.

By suitably combining these methods, the amorphous state immediately after the sputter deposition can approximate to the amorphous state during the optical recording operation. In addition, while the recording layer 24 has been deposited by the most practical sputtering method in all of the above described examples, it is effective to apply the vacuum deposition method, the gas deposition method, the MBE (molecular beam expitaxy) method, the plasma CVD (chemical vapor deposition) method, the MOCVD (metal-organic chemical vapor deposition) method or the like to the deposition of the recording layer in order to set the energy of the material particles of the recording layer being incident on the substrate to be low.

On the GeSbTe recording layer 324 produced using (1) a Kr—Xe mixed gas, (2) a high pressure atmosphere, (3) a low power and (4) the substrate bias magnetron sputter method, an upper interference layer 325 and a reflective layer 326 were sequentially formed by a typical magnetron sputtering method to be ejected from the sputter chamber. This disc having a five-layer construction is applied on a polycarbonate substrate having a diameter of 120 mm and a thickness of 0.6 mm, on which no film is provided, via a UV-curing adhesive layer, to be prepared as a sample for verifying the advantages of this preferred embodiment.

As a comparative example, a disc having the same film construction as that in the above described optical disc was prepared by a different producing method. The comparative disc was formed by initial-crystallizing a recording layer with an elliptical beam in accordance with a conventional producing process after the recording layer was formed on typical sputtering conditions by a typical sputtering method to form an applied structure. The conditions for sputtering the recording layer for use in the comparative example were the same as the conditions for sputtering films other than the recording layer in the above described preferred embodiment. The magnetron sputtering method was used, and the sputter gas was pure Ar gas. In addition, the gas pressure was 0.67 Pa, and the power inputted to the target was tens to hundreds W. Moreover, the substrate was a non-bias substrate.

The optical recording of the optical disc in this preferred embodiment and the comparative disc was carried out by the following method. That is, a disc evaluating system having a recording and/or reproducing optical system having a wavelength of 650 nm and an NA of objective lens of 0.6 was used. The $e^{-2}$ diameter of a laser spot is about 0.9 μm. On the other hand, the track pitch of the disc is 0.74 μm which is smaller than the $e^{-2}$ diameter of a laser spot. By using such laser beams, with respect to the data part, a 8/16 modulating random pattern signal having a linear velocity of 6 m/sec and a shortest bit length of 0.41 μm/bit was recorded on adjacent land and groove, each of which has 10 tracks.

The inventor observed the recording states of the disc of FIG. 12 in this preferred embodiment, on which the optical recording operation was carried out without carrying out the initial crystallization, and comparative disc, by a transmission electron microscope (TEM). In order to carry out the TEM observation, the recording part was cut to prepare a small piece sample, and the counter substrate together with the counter substrate was peeled off. Thereafter, the substrate was dissolved to be removed, and only the medium film part was picked up on a mesh. Then, Au of the first layer was removed by ion milling.

FIG. 13 is a schematic diagram showing a pattern after initially recording the optical disc in this preferred embodiment.

Figure 14:
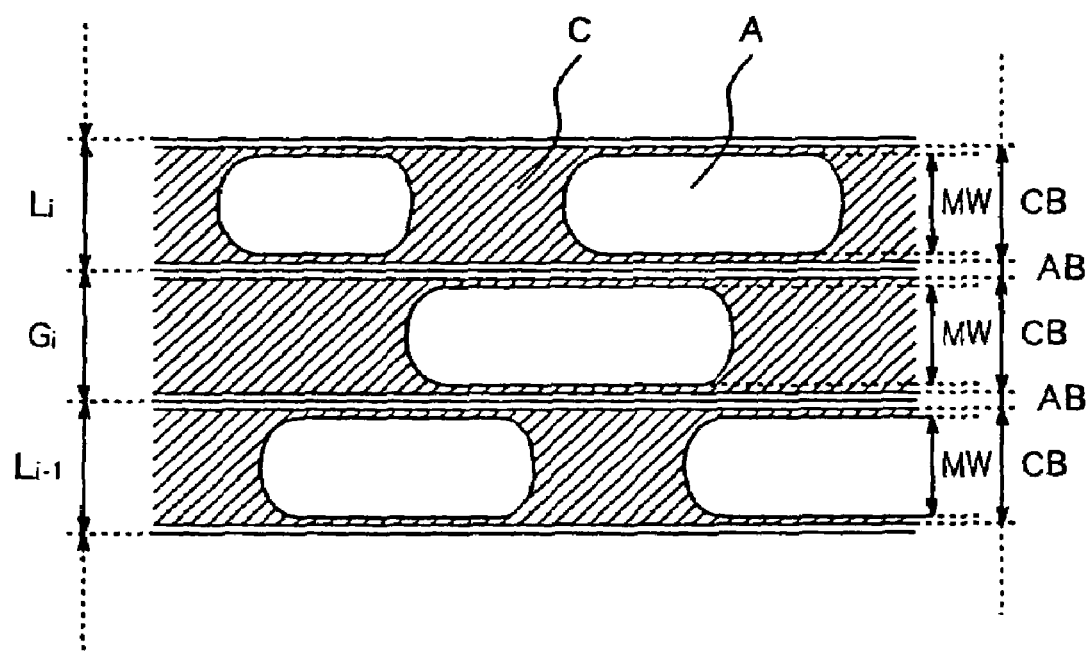
FIG. 14 is a schematic diagram showing a pattern during the hundredth overwrite (OW100) of the optical disc in the second example.

FIG. 14 is a schematic diagram showing a pattern when the hundredth overwrite operation (OW100) is carried out on the optical disc in this preferred embodiment. In both figures, $L_{i-1}$ and $L_i$ denote a number i-1 land track and a number i land track, respectively, and Gi is a number i groove track. In addition, A denotes an amorphous recording mark part, C denoting a crystalline intermark part, CB denoting a crystal band width, AB denoting the width of an amorphous band between crystal bands, and MW denoting the width of a mark. Although MW is not shown in FIG. 13, MW corresponds to CB in the pattern of FIG. 13.

On the other hand, in the comparative disc produced by the conventional method, it is required to carry out initial crystallization. Therefore, after the initial recording and after the OW, there was a pattern wherein the amorphous band AB part does not exist in FIG. 14 and amorphous recording marks are scattered in a network in a crystalline state.

In addition, on the disc in this preferred embodiment, random data were recorded at a high speed of 12 m/s, and the TEM observation of the recording pattern was carried out. As a result, a pattern approximating to that of FIG. 13 was obtained even after the OW.

These observation results can be interpreted as follows. That is, during a recording operation, a part serving as a recording mark melts, and the temperature of the surrounding part is raised to its crystallizable temperature zone. If the linear velocity is low or if the number of OW operations is large, the integrated time that the temperature of the mark edge is raised to its crystallizable temperature zone is long, so that a crystal part is produced around the amorphous mark. Therefore, the disc in this preferred embodiment has a pattern approximating to that shown in FIG. 14 as the linear velocity decreases and as the number of OW operations increases, and a pattern approximating to that shown in FIG. 13 as the linear velocity increases and as the number of OW operations decreases.

That is, in either case, the optical disc in this preferred embodiment is a phase change optical disc wherein the reflectance of a crystal part is adjusted to be lower than the reflectance of an amorphous part viewed from an optical detection side and wherein a recording state has a pattern, in which an amorphous mark row having a width narrower than or equal to the width of a crystal band (an amorphous band is formed between adjacent crystal bands) than the width of a track is formed in the crystal band, which is narrower than the width of a track, the state of the phase change recording layer of an address part being an amorphous state.

While the examples of this preferred embodiment have been described, this preferred embodiment should not be limited thereto.

For example, in the above described example, a four-layer structure of ZnS—SiO$_2$/GeSbTe/ZnS—SiO$_2$/Al or AlMo film deposited on a substrate by sputtering, or a five-layer structure, in which an Au semitransparent film is provided in the four-layer structure, is illustrated as a medium having a film structure of Rc<Ra. However, any one of medium of Rc<Ra may be used in this preferred embodiment. In addition, the material and thickness of each of the layers, and the method and conditions for depositing films other than the recording film should not be limited, except for the conditions for sputtering and initializing the recording layer which are important in this preferred embodiment.

For example, in the case of a five-layer structure, the semi-transparent layer may be formed of silver (Ag), copper (Cu), silicon (Si) or a film having a structure wherein fine metal particles are dispersed in a dielectric matrix, in place of Au. In addition, the material of the interference layer may be suitably selected from dielectric film materials, such as Ta$_2$O$_5$, Si$_3$N$_4$, SiO$_2$, Al$_2$O$_3$ and AlN, in place of ZnS—SiO$_2$, and the material of the recording layer may be suitably selected from chalcogen film materials, such as InSbTe, AgInSbTe and GeTeSe, in place of GeSbTe. The material of the reflective layer may be suitably selected from Al alloy film materials, such as AlCr and AlTi, in place of AlMo.

Moreover, while the optical disc has been described as an example of an optical recording medium in the above described example, this preferred embodiment should not be limited thereto. For example, this preferred embodiment may be applied to any one of various optical recording media, such as an optical recording card, to obtain the same advantages as those of this preferred embodiment.

This preferred embodiment is applied in the above described form to have the undermentioned advantages.

First, according to this preferred embodiment it is possible to improve the quality of address signals and servo signals of a phase change recording medium wherein the reflectance of a crystal part is set to be lower than the reflectance of an amorphous part, and it is possible to reduce the jitter of a data part from the first recording operation.

In addition, according to this preferred embodiment, it is possible to provide an optical recording medium, which can be used immediately in an as-deposited state without passing through an additional process for initial-crystallizing a recording film and which has excellent recording characteristics and high repeatable overwrite characteristics.

As a result, it is possible to reduce equipment investments, operation costs and time necessary for initial crystallization, and it is possible to provide an inexpensive, high performance optical recording medium.

As described above, according to this preferred embodiment, it is possible to provide a phase change optical recording medium which has a higher performance than those of conventional media and which can simplify the producing process thereof. This has great industrial merits.

FOURTH PPREFERRED EMBODIMENT

The fourth preferred embodiment of the present invention will be described below. This preferred embodiment is characterized in that the recording layer of a phase change recording medium has a unique range of thermal conductivity.

In this preferred embodiment, there is provided a phase change recording medium which has a recording layer, wherein a phase change between a crystal phase and an amorphous phase is caused by irradiation with light from the outside, as means for accomplishing the above described object, and which is characterized in that the thermal conductivity of the amorphous state is 0.8 W/mK or more and 6 W/mK or less and that the recording layer has an address part and a data part, the state of the address part being substantially an amorphous state.

Data are not written on the address part of the phase change recording medium by the user. That is, the initial state of the address part is held. In this preferred embodiment, a recording layer deposited by a method, which will be described in detail later, has the above described thermal conductivity, and can record data immediately in an as-deposited state, so that it is not required to carry out an initial crystallizing process. That is, the recording medium in this preferred embodiment is characterized in that the address part has the above described construction even if it is used by the user after it is produced.

Furthermore, throughout the specification, "substantially amorphous state" means an optically amorphous state. For example, the light reflectance, which is important as the characteristic of a recording medium, is closer to the reflectance of an amorphous mark than the reflectance of a crystal space.

In addition, in this preferred embodiment, there is provided a phase change recording medium having a recording layer wherein a phase change between a crystal phase and an amorphous phase is caused by irradiation with light from the outside, the recording layer having an address part and a data part, the state of which is substantially an amorphous state in an unrecorded state before recording data, the thermal conductivity of the amorphous state being 0.8 W/mK or more and 6 W/mK or less.

That is, since it is not required to carry out any initial crystallizing steps in order to produce a medium in this preferred embodiment, the data part of the medium in this preferred embodiment has the above described structural characteristic in an unused state before data are written on the data part.

The thermal conductivity is more preferably 2 W/mK or more and 4 W/mK or less.

In addition, the principal component of the recording layer is preferably GeSbTe or AgInSbTe.

The inventor found that a recording medium, wherein the thermal conductivity of an as-deposited amorphous part is adjusted to be in the above described range, has good recording characteristics even if data are recorded in an as-deposited amorphous state without the need of any initial crystallizing steps.

The phase change recording layer in the above described preferred embodiment is characterized in that the thermal conductivity of an amorphous part in an initial state, i.e., a state as depositing the recording layer by a sputtering method or the like, is lower than the thermal conductivity of an amorphous part of a conventional phase change recording medium and that the control range is wide. Since the thermal conductivity is set to be lower than that of the conventional phase change recording medium, the temperature of the amorphous part tends to rise even if Aa is adjusted to be optically small, so that it is possible to obtain good erase characteristics. In addition, since the phase change recording layer in this preferred embodiment can control the thermal conductivity in a wider range in accordance with the producing method, it is possible to improve the degree of freedom in thermal response design.

Basically, this preferred embodiment relates to materials. However, since a method for producing a phase change recording medium is important in order to obtain a predetermined thermal conductivity, a method for producing a phase change recording medium in this preferred embodiment will be briefly described.

A recording layer for use in a phase change recording operation is deposited usually by a sputtering method. Immediately after the thin-film deposition, the state of the recording layer is an amorphous state. The sputtering method is a technique for producing a predetermined film by allowing sputter particles (gaseous phase), which are sputter-emitted from a target surface by a high-energy argon (Ar) ion bombardment, to arrive at the surface of a substrate at random to migrate the surface in a random state (liquid phase), and thereafter, by allowing the state of the phase to be a solid phase serving as a film. The cooling rate during the transition from the gaseous phase to the solid phase is usually about $10^{12}$ K/sec. That is, it is guessed that the time required for a random state of several eV (tens of thousands K) to be changed to a solid phase at room temperature is about 10 nanoseconds, and that the time required to pass through a temperature zone between a melting point and a crystallizing temperature is about 1 nanosecond at the most.

On the other hand, the time to crystallize a GeSbTe or InSbTe recording layer is tens nanoseconds. The condition for allowing a film to be crystallized is that the time to crystallize the film is shorter than the crystallization holding time, so that the state of the recording layer immediately after the sputter deposition is an amorphous state. It is herein important that the amorphous state immediately after the thin-film deposition is different from the amorphous state formed by the optical recording operation. Because the cooling rate during the optical recording operation is typically about $10^{10}$ K/sec, which is smaller than the cooling rate in a sputter deposition process by about two digits, although it depends on the linear velocity of a beam and the layer structure of a medium. The difference between the cooling rates from a molten state (which means both of the migration process in sputter deposition and the melting process during the optical recording operation) is reflected in randomness. That is, as the cooling rate is higher, randomness is higher, and when the cooling rate is low, it has a fine structure having a short-range order although it is microscopically random.

This difference in fine structure is reflected in thermal conductivity. In general, the thermal conductivity in a random state is lower. The reason for this is that scattering is great in a random system in either case where thermal conduction is caused by lattice vibration or electronic conduction. Therefore, comparing the amorphous state with the crystalline state, the thermal conductivity in the amorphous state is clearly lower than that in the crystalline state. When the short-range order (which may be called nano-crystal) is contained in the amorphous state, it is considered that the thermal conductivity has an intermediate value between the amorphous state and the crystalline state if a simple weighted means is derived.

However, after the detailed measurement of thermal conductivity was carried out, the inventor found that the thermal conductivity of an amorphous material containing a nano-crystal was lower than that in an amorphous material containing no nano-crystal. Although some reasons for this are guessed, a strong reason is the amorphous part of the amorphous material containing the nano-crystal contains a larger number of dangling bonds in the vicinity of the nano-crystal. Another reason is that there is a mechanism wherein head is absorbed by a nano-crystal part having a lower heat capacity than that of an amorphous part to inhibit the whole thermal conduction.

A concrete method for forming a phase change recording medium having a recording layer having a thermal conductivity in this preferred embodiment is to lower the cooling rate-of sputter particles in a sputter process to cause an amorphous state immediately after the thin-film deposition to approximate to an amorphous state formed by an optical recording operation. In order to cause the amorphous state immediately after sputtering to approximate to the amorphous state formed by the optical recording operation, the energy of sputter particles being incident on a substrate is decreased, or the time for surface migration is increased. More specifically, there is effectively a method for using, as a sputter gas, krypton (Kr) gas, xenon (Xe) gas or the mixed gas thereof, which have a greater cooling effect on GeSbTe sputter particles than generally used argon (Ar) gas, a method for lightly applying a bias to a substrate to promote surface migration, or the like. Immediately after the sputter deposition, the state of a disc thus formed approximates to an amorphous state formed by an optical recording operation. Therefore, the disc has a low thermal conductivity peculiar to the nano-crystal containing amorphous material.

Referring to the accompanying drawings, the examples of this preferred embodiment will be described below.

FIGS. 15 and 16 are conceptual views showing examples of the sectional structure of a phase change recording medium in this preferred embodiment. In these figures, the same reference numbers are used for members having the same functions. FIG. 15 shows a medium having a typical LtoH structure, and FIG. 16 shows a medium having a typical HtoL structure (Rc>Ra).

In FIGS. 15 and 16, reference number 401 denotes a polycarbonate substrate having tracking grooves, 402 denoting a semitransparent film, 403 denoting a lower interference layer, 404 denoting a recording layer, 405 denoting an upper interference film, and 406 denoting a reflective film.

Figure 17:
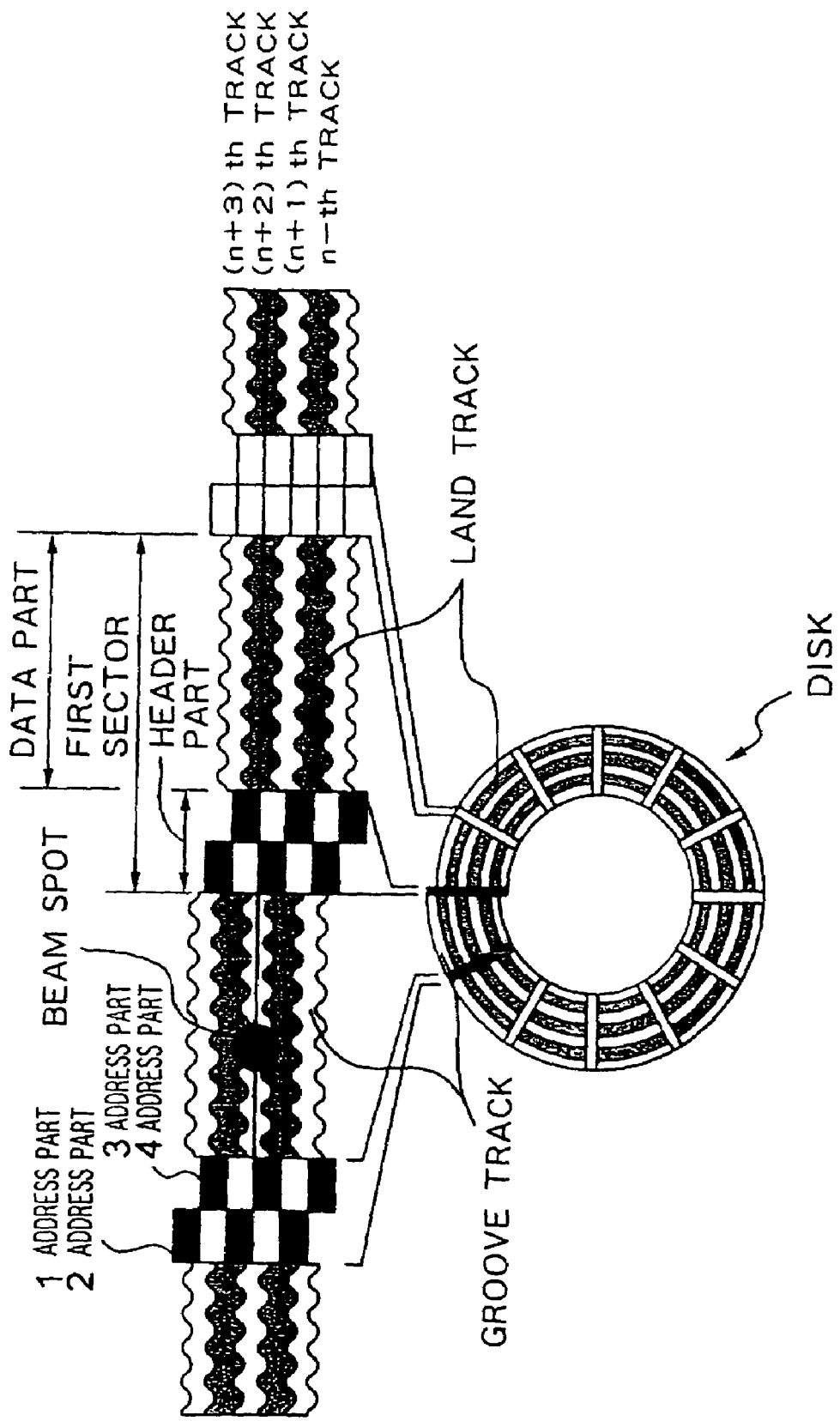
FIG. 17 is a conceptual plan view showing an example of a recording medium.

FIG. 17 is a conceptual plan view showing an example of a recording medium. That is, this figure shows the plan structure of a DVD-RAM, the lower side of this figure showing the whole structure of the DVD-RAM, and the upper side thereof showing an enlarged view of a part of the DVD-RAM. On the disc, "land tracks" and "groove tracks" are alternately formed on the disc. The disc is radially divided into a plurality of "sectors". On the top part of each of the sectors, a "header part", i.e., an "address part", is provided. On the "header part", sector information, such as address, is provided as a pre-pit string. The data recording and/or reproducing operation is carried out on the "header part", and it is carried out on the "data part".

Therefore, the crystalline state or amorphous state of the "header part" of the recording medium does not change after the product is shipped. In other words, when the initial state of the medium is an amorphous state, the state of the "header part" remains being the amorphous state. On the other hand, when the medium passes through a crystallization step similar to conventional media, the state of the "header part" remains being the crystalline state.

As will be described later, the recording medium in this preferred embodiment does not pass through the initial crystallizing step, so that the state of the "header part" is substantially an amorphous state, and the thermal conductivity thereof is in a unique range which is different from the conventional range.

Alternatively, when the state of the recording medium in this preferred embodiment is an unused state, the state of the "data part" is also substantially an amorphous state, and the thermal conductivity thereof is in a unique range which is different from the conventional range.

The phase change recording medium in this preferred embodiment may be produced by the following procedure. First, a polycarbonate substrate 1 may be produced by a typical mastering process for an optical disc substrate. For example, the polycarbonate substrate 1 has a thickness of 0.6 mm, a diameter of 120 mm, a track pitch of 0.6 µm and a groove depth of 70 nm.

Each of layers may be formed using, e.g., a magnetron sputtering system. In the case of FIG. 15, for example, an Au semitransparent film 402 having a thickness of 10 nm, a lower ZnS—$SiO_2$ interference film 403 having a thickness of 80 nm, a GeSbTe recording layer 404 having a thickness of 20 nm, an upper ZnS—$SiO_2$ interference film 405 having a thickness of 30 nm, and an Al alloy reflective film 406 having a thickness of 100 nm are sequentially deposited by sputtering on the groove surface of a substrate 401 in that order. In the case of the recording medium of FIG. 16, for example, a lower ZnS—$SiO_2$ interference film 403 having a thickness of 120 m, a GeSbTe film 404 having a thickness of 15 nm, an upper ZnS—$SiO_2$ interference film 405 having a thickness of 20 nm and an Au reflective film 406 having a thickness of 10 nm are deposited by sputtering.

After the respective layers are deposited, the medium is ejected from the sputtering system. Thereafter, the medium is mounted on, e.g., a blank substrate, so that it is possible to obtain a phase change recording medium.

In this preferred embodiment, the conditions for forming the recording layer and the upper and lower interference films are adjusted in the above described producing procedure to control the lower thermal conductivity of the amorphous material than those of conventional media, and the thermal conductivity of the amorphous material in a wide range. Specifically, any one of the following conditions or suitable combinations thereof is adopted.

(1) When a recording layer is formed, any one of Kr, Xe and Kr—Xe gases, which have a high cooling effect on Ge, Sb, Te sputtering particles, is used in place of Ar gas which is used for conventional methods.

(2) In order to promote the cooling effect in a process for transporting sputter particles, the gas pressure is set to be higher than 0.25 to 0.67 Pa, which is a typical value in conventional methods.

(3) The input to a GeSbTe target is set to be low to decrease the cathode fall voltage to suppress the emission energy of sputter particles.

(4) During the thin-film deposition, a weak bias is applied to a substrate holder to increase the migration time of sputter particles on a substrate.

(5) During the thin-film deposition, a substrate is heated in a temperature zone less than the thermal modification temperature of a polycarbonate substrate.

By adopting the above described conditions, the cooling rate for sputter particles on the substrate can be decreased, so that fine nuclei having a short-range order can be produced in an as-deposited recording layer. Thus, the thermal conductivity of the as-deposited amorphous part can be lower than the conventional thermal conductivity. Simultaneously, by controlling the cooling rate of sputter particles on the substrate, the thermal conductivity of the amorphous part can be controlled in a wide range.

The formation of the short-range order in the recording layer can be carried out by improving the conditions for depositing the upper and lower interference films in addition to the above described adjustment of the conditions for depositing the recording layer. Specifically, the interference film is formed at a lower gas pressure than a typical gas pressure, and the sputter input power is set to be higher than a typical power of hundreds W to thousands W. The interference film thus formed has a compressive stress to promote the volumetric shrinkage of the recording layer. In the recording layer, the volume of the crystal part is smaller than that of the amorphous part having the same number of atoms as that of the crystal part. Therefore, if the volumetric shrinkage is promoted by the upper and lower films, a short-range order having a smaller volume than that of an amorphous part is easily formed in the recording layer.

The inventor formed phase change recording media shown in FIGS. 15 and 16 by the above described method. In addition, in order to clarify their effects, a comparative phase change recording medium having the same sectional structure was produced by the conventional deposition method as a comparative example. The conventional deposition method means a method for forming a recording layer using Ar gas at a gas pressure of about 0.4 Pa and a sputter input of hundreds W and for forming upper and lower interference films at a gas pressure of about 0.67 Pa and a sputter input of hundreds W.

The medium having the structure of FIG. 15 produced by the deposition method in this preferred embodiment will be hereinafter briefly referred to as a "disc 1" in this preferred embodiment, and the medium having the structure of FIG. 16 produced by the deposition method in this preferred embodiment will be hereinafter briefly referred to as a "disc 2". In addition, the medium having the structure of FIG. 15 produced by the conventional deposition method will be hereinafter briefly referred to as a "comparative disc 1", and the medium having the structure of FIG. 16 produced by the conventional deposition method will be hereinafter briefly referred to as a "comparative disc 2".

The measurement of the thermal conductivity of the recording layer of the conventional phase change recording medium as compared with the phase change recording medium produced by the above described technique in this preferred embodiment was carried out by the "high-speed time-resolved (picosecond) thermoreflectance technique". This is a technique developed by Baba et al., Ministry of International Trade and Industry, Industrial Technology Department, National Research Laboratory of Metrology. Measurement System Department, Measurement Information Section. The details of the technique is disclosed in, e.g., Proc. Thermophysical Properties 17, p43, Prc. EUROTHERM '57 "Microscale Heat Transfer".

This measuring method utilizes light and heat material properties that the reflectance of a material depends on the temperature of the material. The variation in reflectance of a material with respect to temperature depends on the kind of the material. For example, in the case of Al, the variation in absolute reflectance is about $10^{-5}$ (K-1). This phenomenon can be physically explained as the variation in thermal reflectance caused by the fact that the thermal oscillation of a lattice has a slight influence on the electronic state thereof. In this measuring method, a pump light beam having a pulse width of about picoseconds is used as means for heating the surface of a material. When the material is irradiated with a pulse light beam, the surface temperature of the material rises, and the reflectance thereof varies, generally increases. When the pump light beam is turned off, heat is diffused in a direction of the thickness of the sample from the surface thereof, so that the surface temperature falls and the reflectance decreases. In the case of a thin-film sample having a thickness of tens nm, the time constant of a thermal diffusion in a direction of the thickness of the film depends on the thermal conductivity of the film, and has a value between tens picoseconds and several nanoseconds. When the variation in surface reflectance after turning off the pump light beam is monitored by a probe light beam having a low power, by which the surface is not substantially heated, the time constant of a thermal diffusion in a direction of the thickness of the film is measured. If this time constant is converted into the thermal permeability in a direction of the thickness of the film and if the resulting thermal permeability is converted into a thermal conductivity (which is assumed as a linear thermal conduction in a direction of the thickness of the film), it is possible to derive the value of the heat conductivity.

The high-speed time-resolved (picosecond) thermoreflectance technique method is the only technique capable of accurately measuring the thermal conductivity of a thin-film sample having a thickness of tens nm. The reliability of the measured value is far higher than, e.g., the "Alternating Current (AC) Calorimetric method" which has been used well. Originally, the Alternating Current (AC) calorimetric method was developed in order to measure the thermal conduction of a film sample having a thickness of hundreds μm. However, there was no measuring method suitable for a thin-film sample having a thickness of tens to hundreds nm, so that the Alternating Current (AC) calorimetric method had to be applied to a thin-film. An example of the thermal conductance of a film material for use in a phase change recording medium, which was measured by the Alternating Current (AC) calorimetric method, is disclosed in, e.g., Jpn. Appl. Phys. 28-3, pp. 123-128. As the measured value of the thermal conductivity of an amorphous part of a GeSbTe recording layer relating to this preferred embodiment, a value of 0.58 W/mK is clearly described. This measured value is very doubtful in respects of the facts that this measured value is lower than the thermal conductivity of ZnS—SiO2 disclosed in the same literature, that the measured value is the same as the thermal conductivity of the crystal part of the GeSbTe film, and that the measured value is far lower than the bulk thermal conductivity of each of Ge, Sb and Te.

The inventor has reexamined measurement by the Alternating Current (AC) calorimetric method. However, the measured value of a sample having a thickness of tens nm for use in an actual phase change recording medium varied widely, so that it was not possible to carry out significant measurement at all. Moreover, also with respect to the measurement of a sample having a thickness of tens μm, to which the Alternating Current (AC) calorimetric method was able to be applied, the dispersion in measured value exceeded plus and minus tens %, so that it was difficult to acquire reliable data.

On the other hand, as described above, the high-speed time-resolved (picosecond) thermoreflectance technique method is designed to carry out the high-speed time-resolved measurement of the thermal diffusion in a direction of the thickness of a sample, and to observe the variation in reflectance of the surface of the sample by a probe light beam in picosecond order after heating the surface of the sample by a pump light beam. This is a technique for precisely measuring behavior wherein when heat is diffused in a direction of the thickness of a sample after heating the surface of the sample, the surface temperature thereof falls and the thermal reflectance thereof decreases. This is a technique useful for all of film materials although the precision of measurement is particularly high with respect to a material having a high thermal reflectance, e.g., Al. Because if an Al thin-film is coated on the surface of, e.g., even a transparent thin-film material having a low reflectance, the thermal conductivity of the transparent thin-film material can be known by examining the time varied temperature of the surface of the Al coated film in accordance with the thermal diffusion in a direction of the thickness of the transparent thin-film material.

The inventor carried out the detailed measurement of the thermal conductivity of a thin-film sample having a thickness of tens nm. In the measurement of the thermal conductivity, the disc samples of FIGS. 15 and 16 and a sample, wherein only a recording layer was produced on, e.g., an Si wafer, and wherein an Al film used for measuring a thermal reflectance was coated thereon, were used. In the latter, a GeSbTe film having a thickness of 100 nm was formed on an Si wafer by the above described deposition method in this preferred embodiment or by the conventional deposition method, and an Al film having a thickness of, e.g., 20 nm, was sequentially coated thereon. When the former disc sample was used directly, a recording layer was exposed by a method for sticking a tape an Al alloy reflective film to peel off the tape after peeling off a stuck counter blank substrate, and an Al film having a thickness of about 10 to 20 nm was coated thereon.

As a result of measurement, the thermal conductivity of the former was substantially the same as that of the latter in a range of ±5%. Throughout the specification, the value of the latter, i.e., the value of the sample produced on the Si wafer, is used as the measured value.

The thermal conductivity of the amorphous state of the recording layer produced by the conventional method was typically 7 (W/mK), and in the range of from 6.8 to 7.2 (W/mK) in accordance with the formation conditions. In addition, the thermal conductivity of the crystalline state was in the range of from 8.8 to 10.1 (W/mK) in either case of the conventional recording layer or the recording layer in this preferred embodiment, and was about 1.3 to 1.4 times as large as the thermal conductivity of the amorphous state of the conventional recording layer.

On the other hand, the thermal conductivity of the recording layer in this preferred embodiment was in the range of from 0.8 to 6 (W/mK) in the as-deposited state, i.e., in the amorphous state. It is considered that the fluctuation in value in this rage depends on the method for producing the recording layer, i.e., the size and content ratio of fine nuclei contained in the amorphous material.

Since it was guessed that the recording layer in this preferred embodiment has fine nuclei in the amorphous state, it was predicted that the thermal conductivity thereof was an intermediate value between the thermal conductivity of the amorphous state of the conventional recording layer and the thermal conductivity of the crystalline state. On the other hand, it is guessed that the reason why the recording layer in this preferred embodiment has a far lower value in the amorphous state than those of the crystalline state and amorphous state of the conventional recording layer is that the thermal resistance is high due to the dangling on the interface between fine nuclei and so forth as described above.

Figure 18:
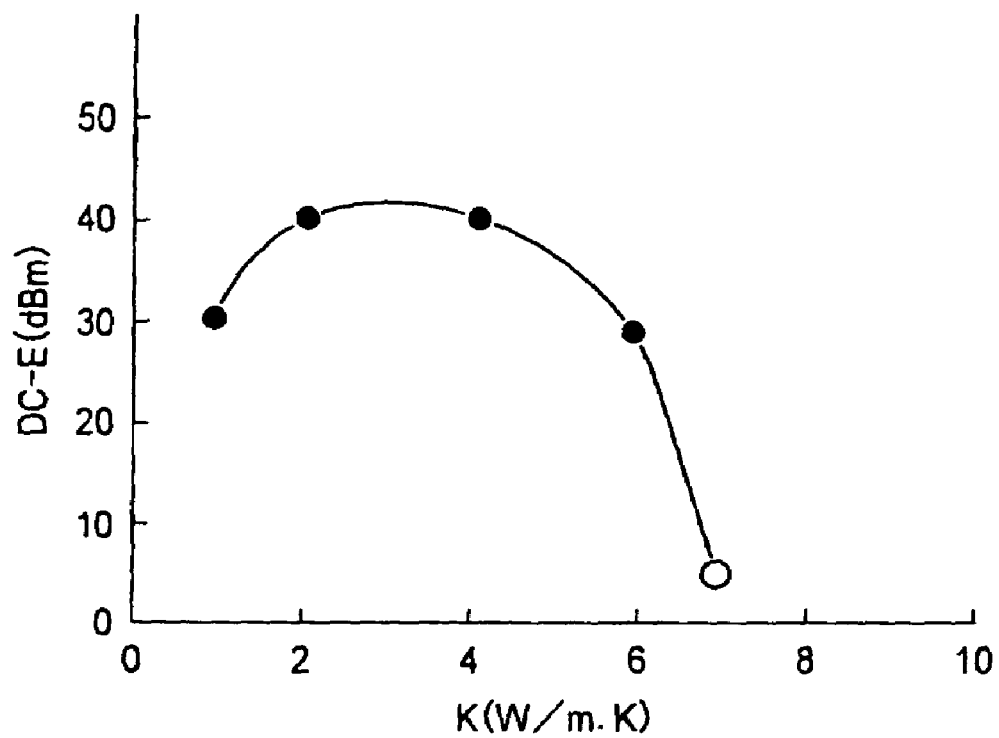
FIG. 18 is a graph showing the relationship between the measured values of thermal conductivity ($\kappa$) and DC erasing rates measured using a disc sample having the structure of FIG. 15.

FIG. 18 is a graph showing the relationship between the measured value of thermal conductivity (κ) and DC erasing rates measured using a disc sample having the structure of FIG. 15.

The measurement of the DC erasing rates was carried out by the following method. That is, the disc having the structure of FIG. 15 was set in an evaluating system having a light source having a wavelength of 650 nm and an objective lens having an NA of 0.6. Then, the disc was rotated at a linear velocity of 10 m/sec, and a mark corresponding to 11T was recorded at the optimum recording power (10 to 13 mW in this case). Thereafter, the CNR of the disc was measured, and the disc was irradiated with an erase power (4 to 6 mW) as DC to measure the decreased amount of the 11T carrier level. The initial crystallization of the recording layer was not herein carried out with respect to both of the disc in this preferred embodiment and the conventional disc.

In FIG. 18, black circles denote the thermal conductivity κ and DC erasing rate of the phase change recording medium in this preferred embodiment, and a write circle denotes those of the conventional phase change recording medium. In the conventional disc, the DC erasing rate was about 5 dB at the most, so that the erasing characteristic thereof was very bad. On the other hand, in the disc in this preferred embodiment, it was possible to obtain a high erasing rate of 35 dB or higher when κ was in the range of from 0.8 to 6 W/mK. In particular, when κ was in the range of from 2 to 4 W/mK, it was possible to obtain a very high erasing rate of 40 dB or higher. It is considered that the reason for this is that the time for the temperature of the phase change recording medium in this preferred embodiment to be held to a higher temperature is long even if the optical absorptivity is the same since the thermal conductivity κ of the amorphous state of the recording layer of the phase change recording medium in this preferred embodiment is adjusted to be lower than that of the conventional medium.

Figure 19:
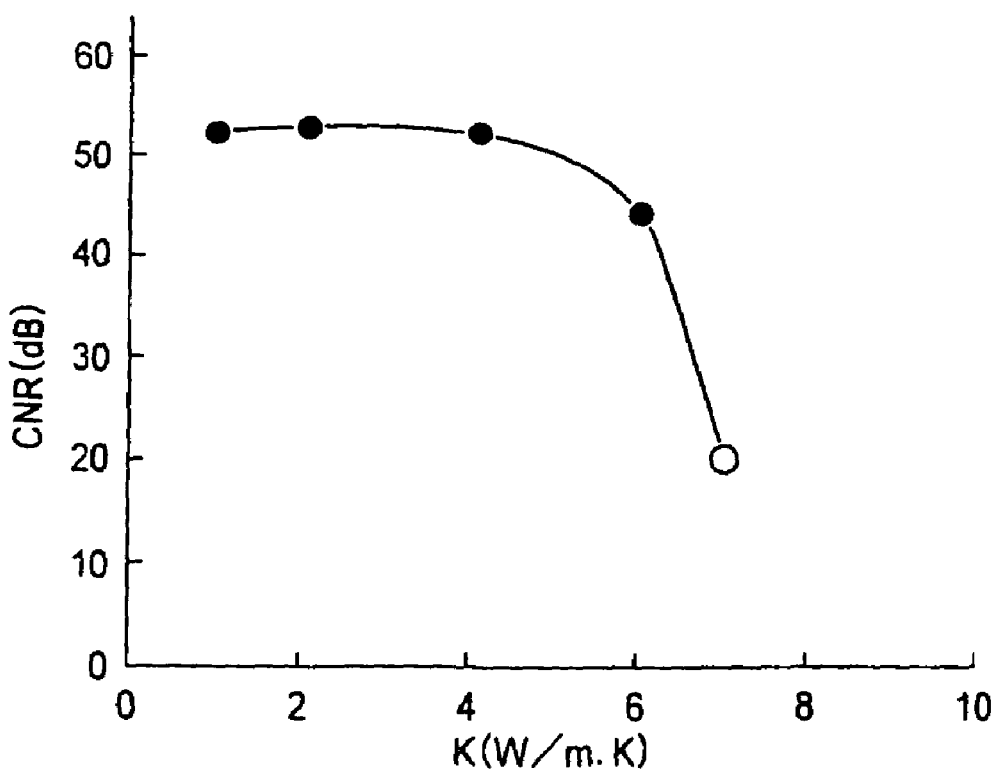
FIG. 19 is a graph showing the relationship between the values of 3T-CNR and the values of thermal conductivity in the first recording operation without initialization.

FIG. 19 is a graphs showing the relationship between 3T-CNR and thermal conductivity κ in the first recording operation without initialization. Also in this figure, black circles denote data in this preferred embodiment, and a white circle denotes data in the conventional medium. As can be seen clearly from FIG. 19, the CNR of the conventional medium is low, about 20 dB, whereas the CNR of the phase change recording medium in this preferred embodiment is very high, about 52 dB, from the first recording operation in a non-initialized state. It is guessed that the reason for this is that the recording layer in this preferred embodiment has fine nuclei of a short-range order in the amorphous material even in the as-deposited state, and the formation of a crystal space proceeds at a high speed even in the first recording operation in the as-deposited state. Then, in the medium in this preferred embodiment, it is considered that the presence of fine nuclei is reflected in the thermal conductivity in accordance with the above described mechanism.

As can be seen from the foregoing, the phase change recording medium in this preferred embodiment does not need the initialization step after the thin-film deposition of the recording layer, and the initial state in the as-deposited state can be used immediately as an amorphous material.

Also with respect to the HtoL medium shown in FIG. 16, the same evaluation as the above described evaluation was carried out, so that the same results were obtained in the range of a difference of about 2 dB. That is, it was found that this preferred embodiment was effective in the medium having either of the LtoH or HtoL structure. However, when the HtoL medium is used in a non-initialized state, the initial reflectance thereof is low, so that the qualities of address signals and servo signals are lower than those when the LtoH medium is used without initialization. Therefore, when the recording medium of FIG. 16 is used, it is desired to the reflectance of the amorphous part to be high, about 10%, to adjust so as to stabilize servo.

In the above described example, the GeSbTe film has be used as the recording layer. However, this preferred embodiment may be applied to any films containing other elements added to GeSbTe. In that case, the value of the thermal conductivity κ was shifted by only several percents, and the approximately effective range of κ was 0.8 to 6 W/mK.

While the GeSbTe recording layer has been used in the above described example, this preferred embodiment may be similarly applied to an AgInSbTe recording layer. That is, a typical composition of GeSbTe is approximately Ge: 0.22, Sb: 0.22, Te: 0.56, whereas a typical composition of AgInSbTe is approximately, e.g., Ag: 0.08, In: 0.13, Sb: 0.49, Te: 0.30, as disclosed in Jpn. Appl. Phys., 32, pp. 5241-5247. That is, both contained Sb and Te as principal components, and the same good characteristics as those of GeSbTe in a range of thermal conductivity κ shifted by about 10%.

More specifically, the material of the recording layer may be suitably selected from chalcogen metal compounds, such as Ge—Sb—Te and Ag—In—Sb—Te, and materials suitably containing a very small amount of Cr, V, N or the like, in place of the above described materials. The desired composition range of the phase change recording medium is a composition range which copes with both the rapid crystallization at a temperature higher than a crystallizing temperature and the thermal stability of the amorphous state at room temperature.

FIG. 20 is a graph showing an example of the distribution in crystallizing time in a GeSbTe ternary alloy system. In this figure, it is possible to carry out crystallization at a higher speed as the crystallizing time is shorter.

FIG. 21 is a graph showing an example of the distribution in crystallizing temperature in a GeSbTe ternary alloy system. In this figure, the amorphous state is more thermally stable as the crystallizing temperature is higher.

Data of FIGS. 20 and 21 are disclosed in, e.g., J. Appl. Phys., 69(5), pp. 2849-2856 (1991). As can be seen from these figures, the composition range capable of coping with both the rapid crystallization and the stability of the amorphous state is a composition range wherein each of the composition ranges of Ge, Sb and Te is ±5 at % about a composition segment, on which a ratio of GeTe:$Sb_2Te_3$ is in the range of from 5:2 to 1:6.

Figure 22:
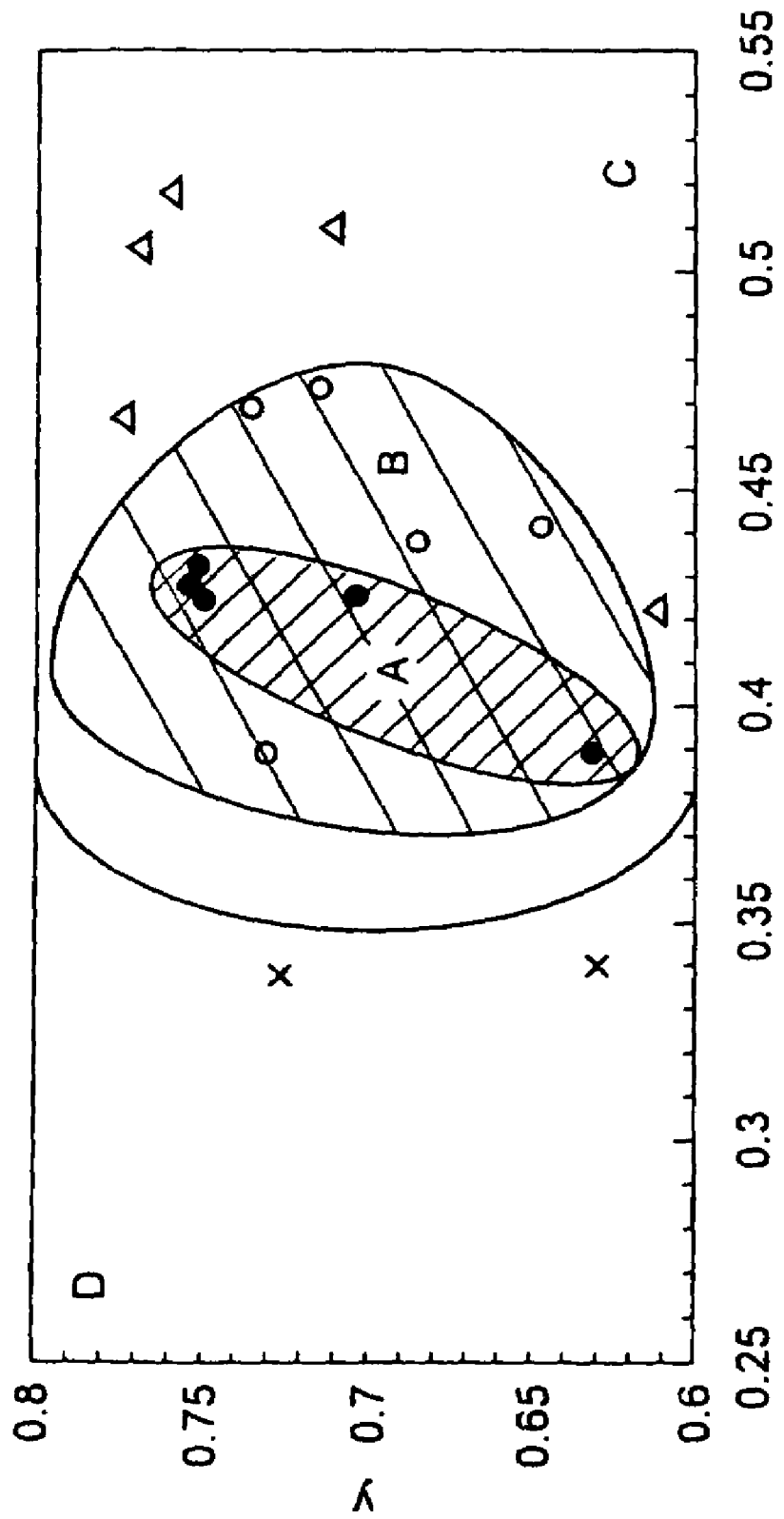
FIG. 22 is a graph showing a desired composition range in an Ag—In—Sb—Te four-element alloy.

FIG. 22 is a graph showing a desired composition range in an Ag—In—Sb—Te four-element alloy. That is, in this figure, x and y of a composition formula expressed by $(AgSbTe_2)x(In_{1-y}Sb_y)_{1-x}$ are plotted on the axes of abscissas and ordinates of the graph. In this figure, the composition range shown by B is desired for a recording layer, and the composition range shown by A is more desired as the material of a recording layer. That is, the composition range expressed by x=0.37-0.42 and y=0.62-0.79.

As described in detail above, according to this preferred embodiment, it is possible to carry out a recording operation at a high CNR immediately from an as-deposited state, so that it is possible to remove an initial crystallizing step from a process for producing a phase change recording medium. As a result, it is possible to reduce the producing costs and to cause phase change recording media to spread widely.

FIFTH PREFERRED EMBODIMENT

The fifth preferred embodiment of the present invention will be described below. In this preferred embodiment, there is provided a producing method which omit an initial crystallizing step by providing unique conditions when the recording layer of a phase change recording medium is sputtered.

That is, there is provided a method for producing a phase change recording medium having a substrate and a recording film deposited thereon, wherein the relationship between a voltage Vdc applied to a target and a sputter threshold voltage Vth of a target constituent element is set to be Vth<Vdc≦10 Vth when the recording film is deposited on the substrate by sputtering.

In a preferred example of this preferred embodiment, the relationship between the voltage Vdc and the sputter threshold voltage Vth is set to be 3 Vth≦Vdc≦8 Vth.

In addition, an ion density Ni in a negative glow plasma produced during sputtering is greater than $10^{11}$ (cm$^{-3}$).

In addition, the recording film contains GeSbTe or AgInSbTe as a principle component.

On the other hand, a system for producing a phase change recording medium in this preferred embodiment is a system for producing a phase change recording medium having a substrate and a recording layer deposited thereon, the system comprising a target for depositing the recording layer on the substrate by sputtering, a power supply for applying power to the target to produce a negative glow plasma, and a plasma density increasing means provided for enhancing the density of the negative glow plasma.

In order to accomplish the object of this preferred embodiment, after the inventor studied conditions and methods for sputtering a recording layer so that an as-deposited amorphous state approximates to an amorphous state formed by an optical recording operation after an initialing process, the above described present invention was made. Typical constituent elements of a target used for forming a phase change recording layer include Ge, Sb, Te, Ag and In. The sputter threshold voltage (Vth) for these elements is approximately 20 eV although it depends on the kind of element and the kind of sputter gas. Conventionally, in order to increase the thin-film deposition rate, a typical value of the Vdc has been in the range of from 300 V to 600 V, which was 15 to 30 times as large as the value of the Vth. After the inventor carried out experiments in view of the recording characteristics of a recording layer without any initializing processes, particularly in view of the variation in reflectance when the first recording operation is carried out without carrying out initialization, while the conditions for sputtering the recording layer are varied in detail, the inventor found it was possible to obtain good non-initialized recording characteristics in a far lower range of Vdc than the conventional Vdc.

That is, the range of Vdc capable of obtaining practically sufficient first recording characteristics in a non-initialized state, i.e., an as-deposited state, is Vth<Vdc≦10 Vth.

In general, the Vdc is a voltage applied between a discharge cathode and a negative glow plasma in a gaseous discharge. In sputtering, the target corresponds to a cathode, and positive ions are accelerated toward the target in a cathode fall during negative glow to be incident on the target by energy substantially corresponding to the Vdc to cause the material of the target to be sputter emitted. The Vdc exists in both the DC discharge and the RF discharge. In the case of the RF discharge, the Vdc is often called "self-bias voltage". The Vth is a threshold energy sputter-emitted from the target material, and means that the sputter emission does not substantially occur in a region wherein the energy of ions being incident on the target is less than the Vth.

The inventor examined the details of the variation in fine structure of a recording layer when light irradiation is repeated from the as-deposited state before this preferred embodiment was made. In this examination, the recording layer was deposited in accordance with the prior art on the condition of Vdc>10 Vth, specifically on the condition of Vdc=400 V (Vth will be described later). If the as-deposited amorphous state was repeatedly irradiated with light beams having an intensity of crystallizing level, the recording layer is gradually crystallized, and the reflectance is changed from an amorphous level to a crystal level. If irradiation is repeatedly carried out hundred times or more, the reflectance is completely changed to the crystallizing level. The recording layer of a medium having an intermediate reflectance between an amorphous material and a crystal, the recording layer of an as-deposited amorphous material, and the recording layer completely crystallized by repeating light irradiation two hundreds times were observed by a high resolution transmission electron microscope (TEM).

As a result, in the recording layer of the as-deposited amorphous material, no fine structure appeared, and the electron beam diffraction pattern was a halo pattern peculiar to the amorphous material. On the other hand, the completely crystallized recording layer was an aggregate of crystal grains having a grain size of about 50 nm, and the electron beam diffraction was a spotty pattern. These structures are well known.

On the other hand, it was observed that an intermediate state, in which the reflectance of the medium had an intermediate level between the amorphous level and the crystal level, had a structure wherein fine nuclei having a size of several nm were scattered in the amorphous material, and it was also observed that the density of nuclei was increased and the nuclei grew in accordance with the increase of the number of light irradiation operations. From these results, the inventor has had an idea that a recording operation can be carried out from an as-deposited state if it is possible to form a recording layer having a structure wherein fine nuclei are scattered in an as-deposited state.

In order to form fine nuclei in an as-deposited amorphous state, conditions and methods for sputtering a recording layer were studied. As a result, it was found that a recording operation can be carried out from an as-deposited state if the Vdc during sputtering is controlled in a range defined in this preferred embodiment. Typical constituent elements of a target used for forming a phase change recording layer include Ge, Sb, Te, Ag and In. The sputter threshold voltage (Vth) for these elements is about 12 to 30 eV although it depends on the kind of element and the kind of sputter gas. The values of Vth of the above described elements with respect to various rare gases are shown in table 2.

TABLE 2

| | Sputter Threshold Energy (Vth: eV) | | | | |
| --- | --- | --- | --- | --- | --- |
| | Sputter Gas | | | | |
| | He | Ne | Ar | Kr | Xe |
| Ge | 30 | 28 | 25 | 22 | 19 |
| Sb | 25 | 23 | 20 | 18 | 16 |
| Te | 24 | 23 | 20 | 16 | 15 |

TABLE 2-continued

| | Sputter Threshold Energy (Vth: eV) | | | | |
|---|---|---|---|---|---|
| | Sputter Gas | | | | |
| | He | Ne | Ar | Kr | Xe |
| Ag | 20 | 17 | 15 | 14 | 12 |
| In | 22 | 20 | 18 | 17 | 15 |

Table 2 show the reported values of sputtering yields, and interpolated values (Vdc at which a thin-film deposition rate is substantially "0") of the results of experiments for examining the relationship between thin-film deposition rates and values of Vdc examined by the inventor.

In a case where a multicomponent material and/or a multicomponent sputter gas is used, the arithmetical mean of values of table 1 may be used. In addition, the addition of a very small amount of reactive gas, such as additional element, oxygen, nitrogen or hydrogen, does not have a great influence on the values of table 1.

Conventionally, a typical value of Vdc has been in the range of from 400 to 600 V, which have been ten times or more as large as Vth, in order to increase the thin-film deposition rate. On the other hand, the inventor experimentally manufactured media while varying the value of Vdc during sputtering of a recording layer, and repeated experiments in view of the reflectance after being irradiated with a light beam once. As a result, the inventor has found that it is possible to produce fine nuclei in the recording layer to obtain good as-deposited recording characteristics in a far lower range of Vdc than the conventional Vdc. The range of Vdc capable of obtaining significant rapid initialization characteristics was Vdc≦10 Vth. Since no film is formed when Vdc is not higher than Vth, the lower limit of Vdc is Vth.

The reason why fine nuclei are produced in an as-deposited amorphous material by adjusting the range of Vth to Vth<Vd≦10 Vth is as follows. That is, as described above, the crystallization of the phase change recording layer proceeds in a temperature zone which is the crystallizing temperature thereof or higher and which is less than the melting point thereof. The time for the temperature of the recording layer to be held in the temperature zone which is the crystallizing temperature thereof or higher and which is less than the melting point thereof will be hereinafter referred to as a "crystallization holding time". If this crystallization holding time is sufficiently longer than the "crystallizing time" peculiar to each material of the recording layer, the recording layer is completely crystallized, and if the crystallization holding time is shorter than the "crystallizing time", the recording layer is hardly crystallized.

The crystallizing time corresponds to a time constant of crystallization in the Arrhenius equation or (Johnson-Mehl-Abrami) equation. In view of a sputtering process, sputter particles (Ge, Sb, Te, Ag, In, dimer thereof, trimer thereof, or the like) emitted from a target are incident on a substrate in a gaseous phase state having energy of several eV (tens of thousands K), to be transformed to a solid phase state serving as a thin-film. Also when the sputter particles are changed from a gaseous phase state to a solid phase state, a crystallizable temperature zone between less than the melting point and the crystallizing temperature is passed. However, on the conventional conditions of Vdc, the energy of sputter particles was very high when being incident on the substrate. Therefore, the cooling rate of sputter particles on the substrate was very high, and the crystallization holding time was far shorter than the crystallizing time. Thus, no nucleus existed in the as-deposited state of the phase change recording layer formed by the conventional method, no nucleus existed, and the as-deposited state was an amorphous state having vary high randomness. It takes a lot of time to crystallize such an as-deposited amorphous film.

On the other hand, if the range of Vdc in this preferred embodiment is used, the energy of sputter particles emitted from the target decreases, and the energy of sputter particles being incident on the substrate also decreases. As a result, the cooling rate of the sputter particles on the substrate decreases, and the crystallization holding time during the change from the gaseous phase to the solid phase increases, so that fine nuclei are produced. Then, by the presence of such fine nuclei, it can be completely crystallized by irradiating it with a light beam only once.

As described above, although Vth<Vdc≦10 Vth is desired in order to obtain good rapid initializing characteristics, this range is lower than the conventional Vdc. However, if the value of Vdc is simply set to be low, the thin-film deposition rate of the recording layer decreases, and this is not desired for the production efficiency in the sputter process. In order to improve the efficiency in the whole process, it is important to enhance throughput without increasing the costs in the whole process or to reduce the costs without damaging throughput in the whole process so that the initializing process reducing effect exceeds the decrease of the production efficiency in the sputter process (the decrease of the thin-film deposition rate) while the value of Vdc is set to be a range capable of obtaining good as-deposited recording characteristics. The efficiency in the whole process can not univocally be determined since it is a design matter based on the producing time per disc. As the results of the inventor's experiments (which will be described in detail later), the efficiency in the whole process was improved over the whole range of Vth<Vdc≦10 Vth.

In addition, the improvement of the production efficiency in the sputter process can be also accomplished by improving the sputter process itself. For example, there is a method for attempting to increase the ionic current density (Ii) introduced into the target, i.e., to increase the ion density (Ni) in a negative glow plasma, while the range of Vdc is set to be able to obtain good non-initialized first-recording characteristics. Assuming that a sputtering yield is γ and a target area is St, the sputter emission amount can be expressed by γ (Vdc)·Ii·St, wherein γ (Vdc) shows that γ is a function of Vdc (which is in proportion to the energy of ions being incident on the target), and γ (Vth)=0. In addition, the relationship between Ii and Ne is Ii=e·Ni·vi/4, wherein e denotes the elementary charge amount, and vi denotes a random speed of an ion in a negative glow plasma. Therefore, if the Ni is high even if the Vdc is low, it is possible to achieve a high thin-film deposition rate. As means for increasing the Ni while holding a low value of Vdc, there are means for increasing the magnetic field intensity of a magnet for magnetron plasma, means for increasing the frequency of a plasma exciting power supply, and auxiliary plasma density increasing means, such as a hollow cathode electron source, an ion source and an inductive coupling plasma producing coil. In addition, as an effective, energy controllable high-density plasma source, there are ECR plasma and helicon plasma.

After experiments are repeated using these means, it was found that a rapid deposition can be carried out while good non-initialized first-recording characteristics are held, when the Ni is adjusted to be greater than $10^{11}$ (cm$^{-3}$). The lower limit of the Ni is the condition for obtaining a practical thin-film deposition rate, e.g., a thin-film deposition rate of 0.5 nm/sec or higher even if the value of Vdc is a low value of about 2 Vth, and a sufficiently high thin-film deposition rate of about 2 nm/sec when the Vdc is 10 Vth. There is particularly no upper limit of Ni. However, excessive increase of the plasma density cause the heating of the substrate, the Ni is preferably less than $10^{12}$ $(cm^{-3})$. Since the phase change recording medium producing system in this preferred embodiment has plasma density increasing means, it is possible to produce high-density plasma having an Ni of $10^{11}$ $(cm^{-3})$ or higher in the range of Vth<Vdc≦10 Vth.

The Vdc can be directly read out of a monitor attached to a typical sputtering system. The Vdc can also be monitored by mounting a voltage probe on a target or by observing a voltage waveform by an oscilloscope using a high-frequency high-pressure-proof probe in the case of the RF discharge. The Ni can be measured by a probe method. The details of the probe method are described in, e.g., "Fundamentals of Plasma Engineering" by Sinriki Teii (Uchida Rokakuho Shuppan).

Referring to the accompanying drawings, the examples of this preferred embodiment will be described below.

Figure 23:
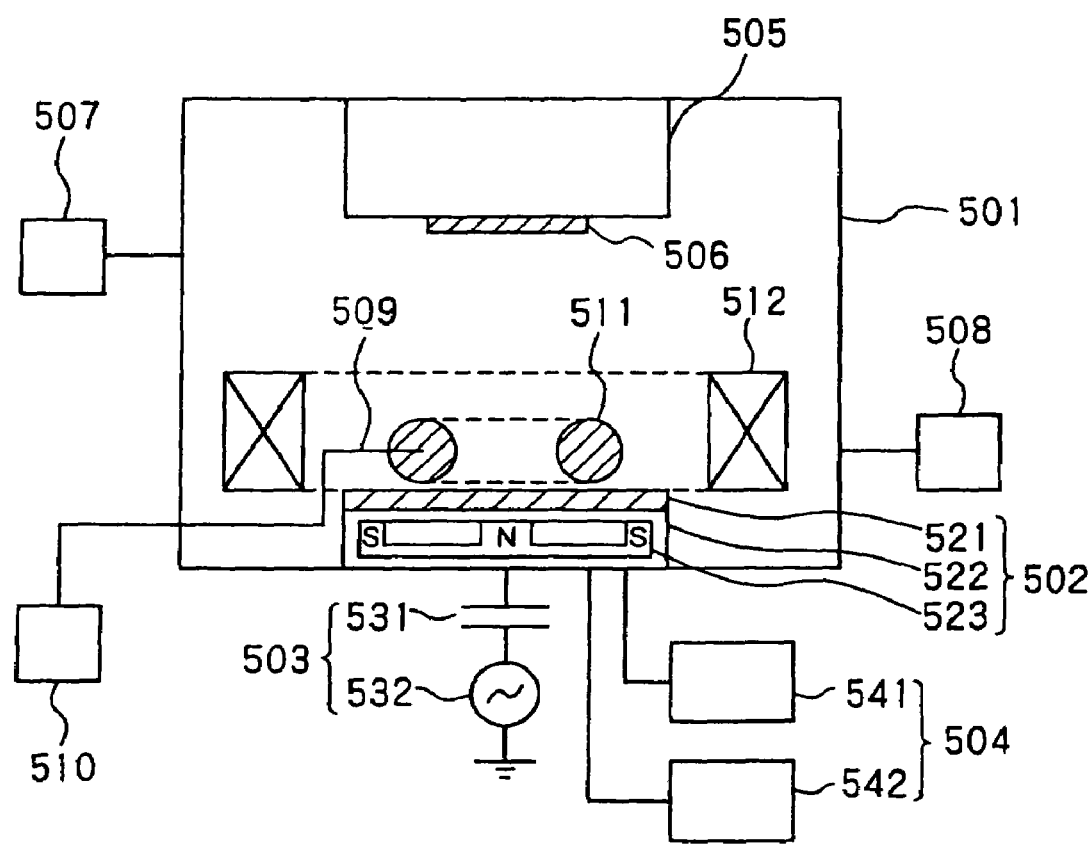
FIG. 23 is a conceptual diagram of a magnetron sputtering system for use in the fifth preferred embodiment of the present invention.

FIG. 23 is a conceptual diagram of a magnetron sputtering system which was used for this preferred embodiment of the present invention. The system shown in FIG. 23 is used mainly for forming a recording layer. Other films, such as an interference layer and a reflective layer, than the recording layer can be formed by means of the same sputtering system as the conventional sputtering system. Of course, the other films then the recording layer may be formed by means of the system of FIG. 23.

In FIG. 23, reference number 501 denotes a deposition container, 502 denoting a sputter source, 521 denoting a sputtering target constituting the sputter source 502, 522 denoting a target housing constituting the sputter source 502, 523 denoting a magnet constituting the sputter source 502, 503 denoting a sputter power supply, 531 denoting a direct current breaking capacity constituting the sputter power supply 503, 532 denoting an RF (13.56 MHz) power supply constituting the sputter power supply 503, 504 denoting a Vdc monitor system, 541 denoting a Vdc monitor constituting the monitor system 504, 542 denoting a high-frequency high-pressure-proof probe and an oscilloscope, which constitute the monitor system 504, 505 denoting a substrate holder, 506 denoting an optical disc substrate, 507 denoting a sputter gas supply system, 508 denoting an exhaust system, 509 denoting a plasma probe, 510 denoting a probe circuit, 511 denoting a magnetron plasma, and 512 denoting an inductive coupling coil.

This example is an example of RF magnetron discharge. The electric power supply to the target may be DC. In addition, typical bipolar discharge, which is not magnetron discharge, may be used for this preferred embodiment. Of course, a power meter is mounted on the sputter power supply for monitoring a sputter input. In the above described construction, the Vdc monitor 541 is previously mounted on the sputtering system, and comprises an RF breaking and tuning LC circuit and a direct current voltage (Vdc) monitor. Although the monitor 542 comprising the probe and the oscilloscope was particularly required for carrying out this preferred embodiment, it was provided for confirmatively measuring the Vdc serving as an essential parameter in this preferred embodiment. The plasma probe 509 is not mounted on a typical system for sputtering a phase change recording medium. The plasma probe 509 was mounted for measuring plasma parameters, such as a plasma potential and an ion density, which are related to this preferred embodiment. The probe circuit is a typical probe circuit, and comprises a voltage applying system to the probe, and a probe current monitoring system. The magnetron plasma density (ion density) was herein calculated from an ion saturation current, on which the magnetic field has a small influence. The inductive coupling coil 512 is specially mounted for carrying out this preferred embodiment, and provided for increasing the plasma density and the ion current density being incident on the target.

In addition, FIG. 23 shows an example of a so-called static opposed type sputtering system. This preferred embodiment should not be limited to the positional relationship between the target and the substrate, the substrate may be eccentrically arranged with respect to the target to rotate or revolve around the target. Although the sputter gas is typically argon (Ar) gas, it may be any one of He, Ne, Kr, Xe and mixed gases thereof. In addition, a reactive gas, such as oxygen, nitrogen and hydrogen, may be added if necessary.

Using the above described system, this preferred embodiment was carried out by the following procedure.

FIRST EXAMPLE

In this example, there was examined the relationship between the values of Vdc, non-initialized first-recording characteristics and thin-film deposition rates when any methods for enhancing the plasma density are not carried out. Using the system shown in FIG. 23, this example was carried out by the following procedure.

Figure 24:
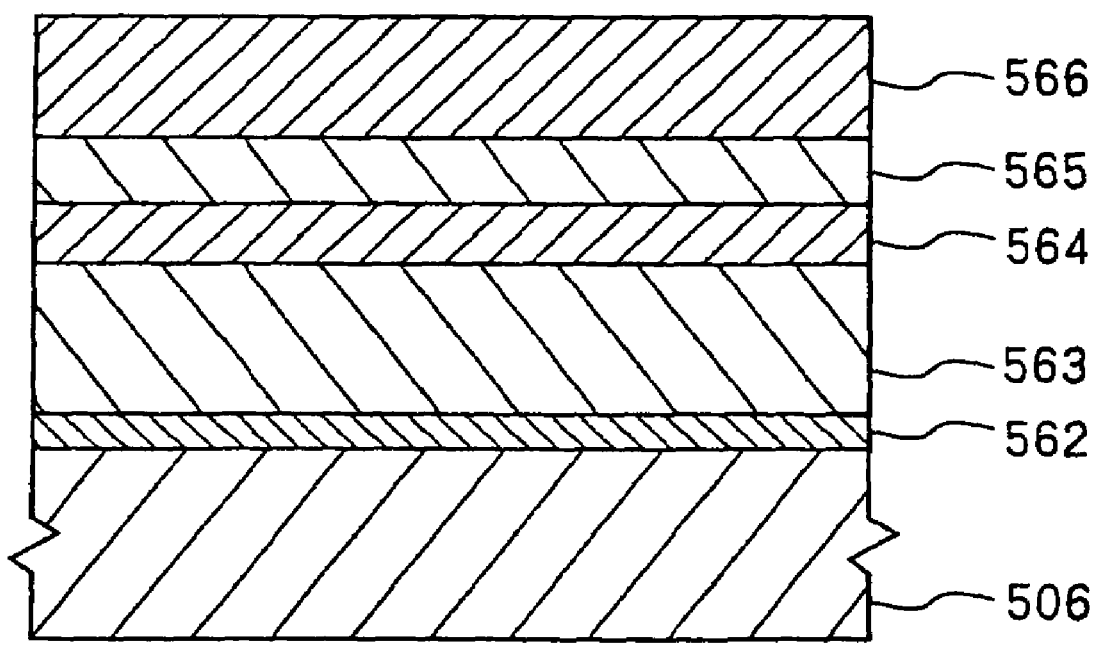
FIG. 24 is a conceptual sectional view of a recording medium experimentally manufactured in an example of the fifth preferred embodiment.

FIG. 24 is a conceptual diagram showing the sectional structure of a recording medium experimentally manufactured in this example.

In this figure, reference number 506 denotes a polycarbonate substrate having tracking grooves. As the substrate 506, an experimentally manufactured substrate having a diameter of 120 nnm, a thickness of 0.6 mm and a track pitch of 0.6 μm was used. In order to examine the first recording characteristic in a non-initialized state, the structure of a medium film formed on the substrate was a five-layer structure comprising a gold (Au) semitransparent layer 562 having a thickness of 10 nm, a first ZnS—$SiO_2$ interference layer 563 having a thickness of 80 nm, a GeSbTe (2:2:5) recording layer 564 having a thickness of 20 nm, a second ZnS—$SiO_2$ interference layer 565 having a thickness of 30 nm, and an Al alloy reflective layer 566 having a thickness of 50 nm.

The medium has a so-called LtoH (lot to high) structure which has a reflectance of 20% when the state of the recording layer is an amorphous state and a reflectance of 5% when the state of the recording layer is a crystalline state. The LtoH structure was adopted in order to enhance the reflectance in a non-initialized state, i.e., as as-deposited amorphous state, to improve the stability of a tracking servo signal. This preferred embodiment may be applied to a medium having a so-called HtoL structure wherein the reflectance in the crystalline state is higher than the reflectance in the amorphous state. In such a case, the reflectance in the amorphous state should be set so as to sufficiently obtain the stability of servo.

The sputtering system of FIG. 23 is used for forming a recording layer. Other layers than the recording layer may be formed by a sputtering system independent of the system of FIG. 23, or by a sputtering system connected to the system of FIG. 23. In the undermensioned description, other layers than the recording layer was formed by a typical sputtering system, i.e., a sputtering system having the same construction as that of the system of FIG. 23 except that the Vdc confirming oscilloscope system 542, the plasma probe 510 and the inductive coupling coil 512 are not provided. In addition, in order to prevent the surface oxidation of the recording layer after the thin-film deposition, the connection type system is used to sequentially form layers in a vacuum.

First, after the above described Au semitransparent layer 562 and first ZnS—SiO$_2$ interference layer 563 are formed on the substrate 506, the substrate 506, together with the substrate holder 505, is transported into the deposition container 501 of the sputtering system of FIG. 23. As described above, in this preferred embodiment, the inductive coupling coil for increasing the plasma density is not operated when the recording layer is formed. The mass flow controller of the sputter gas supply system is adjusted to introduce argon (Ar) gas into the deposition container at 100 sccm, and the exhaust system is adjusted to hold the gas pressure in the container to be 2 Pa.

Then, when the RF power supply 503 is turned on to input a power of P (W) to the sputter source 502, a doughnut-type magnetron plasma is produced in a space above the GeSbTe target 521, and the Vdc is displayed on the Vdc monitor in accordance with the P. The P is changed as a discharge parameter every deposition. With respect to the monitored value of the Vdc, the reading of the monitor 541 attached to the system was coincident with the measured value of the confirming voltage prove and oscilloscope system in a range of ±5 V. Therefore, the direct reading value of the monitor 541 attached to the sputtering system will be described below.

The value obtained by dividing the P by the Vdc is a mean ion current density being incident on the target. Referring to a previously examined thin-film deposition rate, sputter discharge is continuously carried out until the GeSbTe recording layer 564 having a thickness of 20 nm is deposited on the first interference layer 563. Thereafter, the RF power supply 503 is turned off to interrupt gas. Then, the substrate, on which the recording layer 564 has been deposited, is sequentially moved to the deposition chambers for the second interference layer and the reflective layer 566 to form a phase change disc.

The disc thus obtained was stuck on a dummy substrate having no medium film to carry out recording and/or reproducing operations in an as-deposited state. In the formation of the medium film, the deposition time is often relatively short, and it is difficult to carry out the probe measurement during the thin-film deposition. Therefore, it is desired to separately carry out the probe measurement on the same conditions as those for the deposition to derive the ion density. The ion current density being incident on the target and the ion density in plasma will be described in the next example, and the relationship between the values of Vdc, the first recording characteristics in a non-initialized state, and thin-film deposition rates will be herein described.

Figure 25:
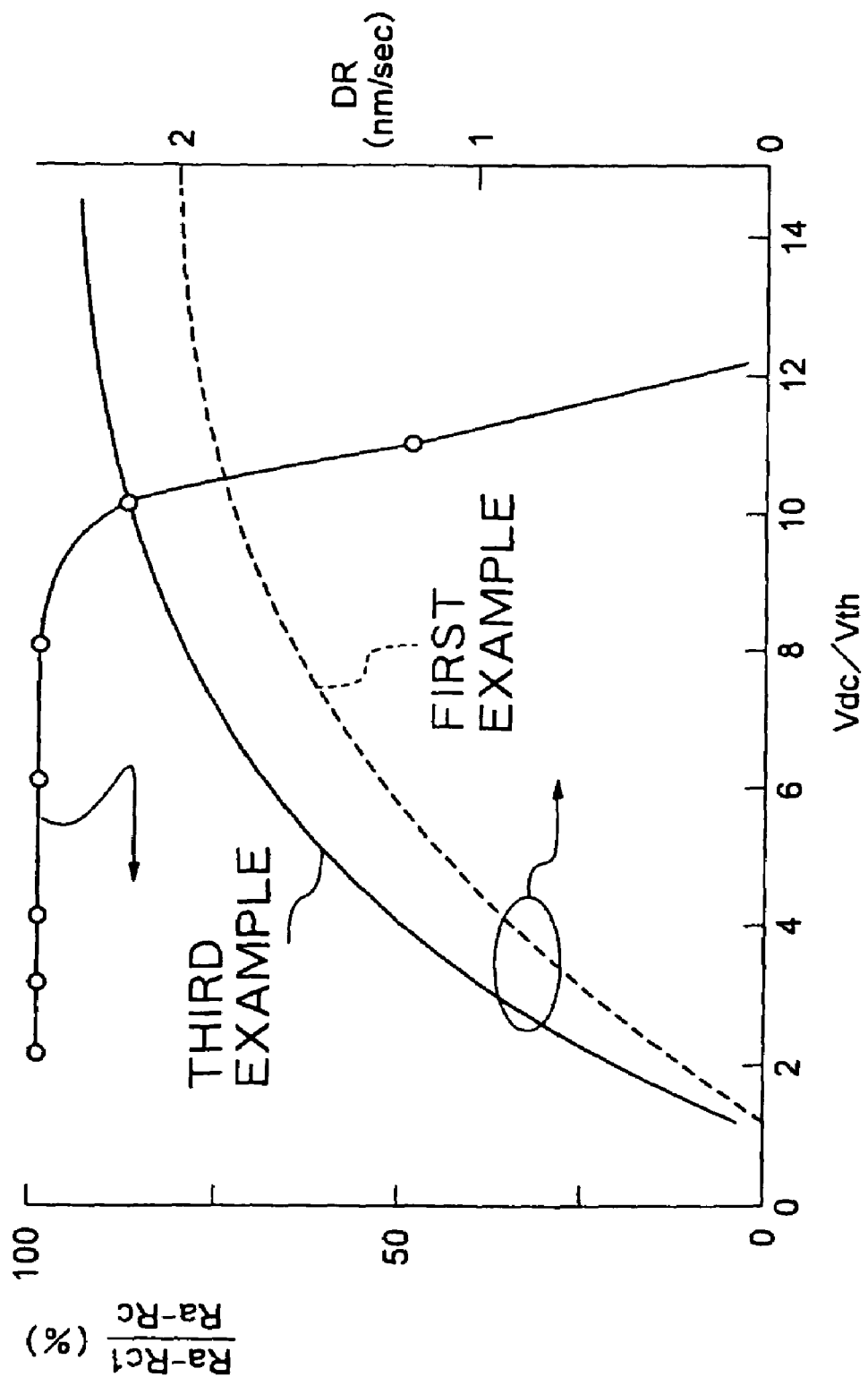
FIG. 25 is a graph showing the relationship between the values of Vdc/Vth, non-initialized first-recording characteristics, and thin-film deposition rates.

FIG. 25 is a graphs showing the relationship between the values of Vdc/Vth, non-initialized first-recording characteristics, and thin-film deposition rates. The value of Vth may be a weighted arithmetical mean of the values of Vth of Ge, Sb and Te, or experimentally derived from the thin-film deposition rate and the Vdc (the value of Vth is given by the interpolated value of the Vdc, by which the thin-film deposition rate is zero). The weighted arithmetical mean of the values of Vth of Ge, Sb and Te described on a sputter data book was substantially coincident with the experimentally derived value of Vth to be substantially 20 V.

The (Ra-Rc1)/(Ra-Rc) on the axis of ordinates was derived using the as-deposited amorphous reflectance (Ra), the reflectance (Rc1) of a crystal space formed by carrying out the first recording operation in the as-deposited state, and the reflectance (Rc) of a crystal space after overwrite operations were carried out hundred times or more. Since the Rc corresponds to the reflectance of a crystal part after the initial crystallizing step is carried out in accordance with the conventional method, the (Ra-Rc1)/(Ra-Rc) is an index how good crystal space is formed by the first recording operation in the as-deposited state. If this value is 100%, it means that the crystal space is completely formed from the first recording operation, and if this value is x %, it means that a part of (100-x) % is not sufficiently crystallized and the residual amorphous material exists.

It can be seen from FIG. 25 that it is possible to obtain good non-initialized first-recording characteristics by setting Vth<Vdc≦10 Vth in accordance with this preferred embodiment. That is, it is possible to omit the initial crystallizing step from a process for producing a phase change recording medium. In particular, in a range of Vdc≦8 Vth, the (Ra-Rc1)/(Ra-Rc) was 100%, which was a complete value, and the repeatability thereof was sufficiently high.

Furthermore, when the Vdc is smaller than 3 Vth, the thin-film deposition rate tends to be extremely slow to decrease the film density to slightly deteriorate the oxidation resistance, so that it is desired that 3 Vth≦Vdc.

The DR on the right axis of ordinates in FIG. 25 denotes the thin-film deposition rate of a recording layer. The thin-film deposition rate obtained by the first example of this preferred embodiment are shown as a "first example" in this figure.

As can be seen from this figure, the thin-film deposition rate of the recording layer decreases as the value of Vdc decreases. For example, when the value of Vdc is set to be 2 Vth, the thin-film deposition rate of the recording layer is about 0.5 nm/sec. Since a typical value of thin-film deposition rate in the conventional method is about 2 nm, the thin-film deposition rate is decreased to about one-fourth of the conventional typical value when Vdc=2 Vth. However, also in this case, the effect capable of reducing the initialization step is greater.

The producing costs will be compared on the conditions that the producing time per disc is the same as the conventional producing time. The price of the sputtering system is typically about 10 to 20 times as large as the price of the initializing system. If the decreased amount of the thin-film deposition rate of the recording layer is replaced with the number of the increased sputter chambers, one of the increased sputter chambers increases the price of the whole sputtering system by about 5 to 10%, so that the decreased amount of the thin-film deposition rate by ¼ can be replaced with the price of four initializing systems. However, ten initializing systems have been conventionally provided for each sputtering system. On the other hand, according to this preferred embodiment, it is not required to provide ten initializing systems, the number of which is far greater than the above described converted number (four) of the initializing systems corresponding to the thin-film deposition rate.

The above described trial calculation is established substantially over the whole range of Vth<Vdc≦10 Vth in this preferred embodiment. According to the above described trial calculation, the lower limit of Vdc is a value, at which the thin-film deposition rate is decreased to one-tenth of the conventional rate, and 1.3 Vth in this preferred embodiment. However, a method for calculating the efficiency of the whole process depends on the design of the process. The value of Vdc is herein defined so as to be higher than Vth.

While the Vdc has been controlled mainly by the discharge input (P) in this preferred embodiment, the Vdc slightly varies in accordance with the kind of gas and the kind of target constituting element. In addition, from the results of the inventor's experiments, it was confirmed that the DR was in proportion to γ (Vdc)Ii. In this example, the value of Ii was in the range of from 0.4 to 0.8 mA/cm$^2$, and the value of Ni was in the range of from $2 \times 10^{10}$ to $4 \times 10^{10}$ (cm$^{-3}$), when the Vdc/Vth was in the range of from 2 to 10.

SECOND EXAMPLE

FIG. 26 is a conceptual diagram showing an example of the sectional structure of a phase change recording medium produced in this example. In this figure, reference number 571 denotes a disc substrate, 572 denoting a lower interference layer, 573 denoting a recording layer, 574 denoting an upper interference layer, and 575 denoting a reflective layer.

In this example, layers other than the recording layer 573 were formed by a technique using pure Ar, a typical magnet (1T class), a power supply of 13.56 MHz and no feedback, without the sputtering system of FIG. 23. In addition, all of the layers were formed in a vacuum.

Furthermore, while the four-layer structure has been adopted as the layer structure of a typical phase change recording medium in this preferred embodiment, this preferred embodiment should not be limited to the layer structure of the film. For example, this preferred embodiment may be widely applied to the structure shown in FIG. 4 on pp. 66-67 of Technical Digest of Joint-MORIS/ISOM 1997, the structure shown in FIG. 1 on pp. 74-75 thereof, the structure shown in FIG. 1(a) on pp. 23-24 of Post Deadline Paper, Technical Digest thereof, the structure shown in FIG. 1 on pp. 104-109 of Digest of Tenth Phase change. Recording Workshop Symposium, and the structure disclosed in Japanese Patent Laid-Open No. 10-226173.

A pre-formatted disc of polycarbonate is typically used as a disc substrate. The typical diameter of the substrate is 64 mm, 80 mm, 120 mm, 135 mm, 300 mm or the like, and the typical thickness of the substrate is 0.6 mm or 1.2 mm. In this example, a DVD-RAM format disc substrate was used. Although the upper and lower interference layers are typically formed of ZnS-20% $SiO_2$, these layers may be suitably formed of a transparent dielectric material, such as Ta—O, Si—O, Si—N, Al—N, Ti—O, B—N and Al—O.

The recording layer is typically formed of Ge—Sb—Te or Ag—In—Sb—Te. In this example, the recording layer was formed of $Ge_2Sb_2Te_5$.

The reflective layer may be formed of a high reflectance material, such as Al alloys, Au, Cu, Ag and Ti—N. In this example, the reflective layer was formed of an Al—Mo alloy.

The thickness of the lower interference layer 572 was 120 nm, and the thickness of the recording layer 573 was 20 nm. In addition, the thickness of the upper interference layer 574 was 15 nm, and the thickness of the reflective layer 575 was 100 nm. In optical calculations, with respect to a light beam having a wavelength of 650 nm, the reflectance of the amorphous part is 5% and the reflectance of the crystal part is 20%.

Then, a procedure for producing a phase change recording medium having the structure of FIG. 26 will be described. The substrate 571 was loaded on the sputtering system, and the sputtering system was evacuated to form the lower interference layer 572 on the conventional conditions. Thereafter, the substrate was transported into the sputtering system having the structure of FIG. 23, and the recording layer 573 was formed by the following procedure.

That is, the thin-film deposition container 501 has been previously evacuated, and the substrate, together with the substrate holder 505, is transported in a vacuum from the chamber for forming the lower interference layer 572. An Ar—Kr mixed gas is introduced at 200 sccm from the gas supply system 507. Then, while the pressure in the thin-film deposition container 501 is maintained to be 2 Pa, the pulse modulated RF power supply 532 is inputted to produce a doughnut-type magnetron plasma 511 in a space above the GeSbTe target 521.

A cathode fall is formed between the negative glow plasma and the target, so that the target has a potential of −Vdc with respect to the ground potential. Among ions in the plasma, ions diffused to the cathode are accelerated toward the target to impact on the target at an energy of substantially Vdc, so that target constituting elements are emitted by sputtering. Since the energy during the sputter emission is substantially in proportion to the energy of ions being incident, i.e., the Vdc, the energy of sputter particles in this preferred embodiment is set to be lower than that in the conventional method.

After the recording layer was deposited as described above, the upper interference layer 574 and the reflective layer 575 were sequentially laminated again by the conventional sputtering method, and the disc was taken out to atmosphere.

Also in this example, a large number of optical recording media were experimentally manufactured using Vdc as a parameter, and the recording characteristic in the as-deposited state was evaluated. As a result, the relationship between the values of Vdc/Vth, the non-initialized first-recording characteristics and the thin-film deposition rates was substantially the same as that shown in FIG. 25, and it was possible to obtain good non-initialized first-recording characteristics in a range of Vth<Vdc≦10 Vth.

Furthermore, as will be described in detail later, by producing a high-density plasma using the above described various plasma density increasing means, the amount of sputter emission can be a high value of several nm/sec, which is substantially the same as that in the conventional method, even at a lower Vdc than that in the conventional method.

Third Example

The above described first and second examples show basic forms of this preferred embodiment mainly in view of the relationship between the values of Vdc and the non-initialized first-recording characteristics. In this third example, a plasma density increasing means is further provided in order to enhance the thin-film deposition rate while the value of Vdc is set to be in a desired range on the first recording characteristic in a non-initialized state.

In this example, while the construction of the sputtering system used for depositing a recording layer is the same as that in FIG. 23, it is attempted to increase the magnetic field intensity of the magnetron plasma producing magnet 523 or to use the inductive coupling plasma producing coil 512, or to use both. Although the value of Vdc varies by the increase of the magnetic field intensity and the production of the inductive coupling plasma, the discharge input (P) to the sputter source is also adjusted so that the value of Vdc is in the range of 2 Vth≦Vdc≦10 Vth, in which good non-initialized first-recording characteristics are basically obtained.

The procedure for carrying out the third example by means of the system having the structure of FIG. 23 should be the following improvement of the above described procedure in the first example. That is, the magnet 523 is changed from a member for producing a magnetic field of about 1 to 1.5 kG to a member for producing a magnetic field of about 2 to 2.5 kG. Alternatively, a power is supplied to the inductive coupling plasma coil 512 at the same time that a power is applied to the sputter source. Alternatively, both may be carried out.

In order to increase the magnetic field intensity, the constituent material of the magnet may be changed to a high Bs material, or the design of the magnetic circuit may be improved. The inductive coupling plasma coil is designed to produce a so-called inductive coupling plasma (ICP) used for a semiconductor process system or the like. In the inductive coupling plasma coil, a Cu coil or an $SiO_2$ coated Cu coil is provided in the vicinity of the target in the thin-film deposition container, and an RF power is inputted from the outside to produce the ICP.

In this example, the value of Vdc was monitored, and the ion density (Ni) was measured by means of the plasma probe 509, so that the first recording characteristics in the non-initialized state and the thin-film deposition rates were examined by the same method as that in the first example. The first recording characteristics in the non-initialized state had a good value of Vth<Vdc≦10 Vth even in a case where an auxiliary plasma density increasing means, such as an inductive coupling plasma producing means, are used, and a magnetron field intensity is increased. This means that not only the first recording characteristics in the non-initialized state, but also the fine structure of the as-sputtered film, do not depend on the plasma density during the thin-film deposition of the recording layer, and are controlled by the value of Vdc, i.e., non only the energy of ions being incident on the target, but also the energy of sputter particles emitted from the target.

The thin-film deposition rate is in proportion to $\lambda$ (Vdc)·Ii similar to the first example. As described above, Ii can be expressed as Ii=e·Ni·vi/4 using the ion density (Ni) in the plasma and the random speed (vi) of ions in the plasma. Since vi is about 5×10. Since the vi is about $5×10^5$ (cm/sec) in view of an ion temperature of about 1000 K, the Ii can be presumed from the Ni in the prove measurement, so that the thin-film deposition rate can be presumed. In the above described first example, i.e., in a case where the plasma density was not particularly increased, the value of Ni was in the range of from $2×10^{10}$ to $4×10^{10}$ ($cm^{-3}$) and the value of Ii was in the range of from 0.4 to 0.8 $mA/cm^2$, in the range of Vdc/Vth of 1 to 10, in which good non-initialized first-recording characteristics were obtained. On the other hand, in this example, the value of Ni was a high value of $10^{11}$ ($cm^{-3}$), and the value of Ii was a high value of 2 $mA/cm^2$, in the range of Vdc/Vth of 2 to 10.

The thin-film deposition rates (DR) obtained in this example are expressed by a "third example" in FIG. 25. As can be seen clearly from this figure, when a high-density plasma is produced in accordance with this example, the thin-film deposition rate of the recording layer exceeds the conventional typical value, so that the efficiency of the whole process can be remarkably improved.

In the above described example, the magnetron field intensity increasing means has been used as the plasma density increasing means, and the inductive coupling coil has been used as the auxiliary plasma generating means. However, there may be used various methods, such as a method for providing a hollow cathode type electron source, and a method for providing an ion source (a differential exhaust system may be also provided when the operation pressure is lower than that in the sputter chamber), and a method for utilizing an ECR plasma or a helicon plasma.

FOURTH EXAMPLE

In this example, an Ar-10% Kr mixed gas was used. By adding Kr having a large mass number, it is possible to enhance-the sputter emission efficiency even if a low ion energy is used. In order to lower the value of Vdc, a gas having a small mass number is preferably used. Therefore, when a rare gas is used, He, Ne, Kr and Xe are preferably mixed at a suitable ratio.

Although FIG. 23 shows an example of a typical magnetron sputter source, the magnet of FIG. 23 may be arranged on the reverse surface of the target, or the magnet may be arranged on the target on the same side as that of the substrate. Alternatively, a typical bipolar sputter source (non-magnetron type) or an ECR sputter source may be used in place of the magnetron sputter source. Moreover, the above described auxiliary plasma producing means for enhancing the plasma density is preferably added. In this example, a NdFeB magnet having a strong magnetic field source (>2T class) was adopted as the plasma density increasing means to enhance the efficiency for capturing electrons in a negative glow. The sputter power supply may be DC or RF, and an AC power supply having a suitable frequency may be used in place of a typical RF having a frequency of 13.56 MHz. In addition, a pulse modulated plasma may be used to increase the density.

In this example, an RF power supply having a frequency of 13.56 MHz pulse-modulated by 10 kHz was used. By pulse-modulating by 10 kHz, the bipolar diffusion loss of ions and electrons from the negative glow is decreased, and the plasma density is increased. In this preferred embodiment, since its point is the control of Vdc, the Vdc in discharge is preferably timely monitored to control the sputter power supply by a feedback circuit so that the Vdc is always a predetermined value, in order to control the variation in Vdc due to disturbance. By the feedback system, the fluctuations in Vdc and Ni can be controlled to be less than ±1%.

Other constructions may be the same as those of the conventional sputtering system. Comparing the sputtering plasma in this example with the conventional sputtering plasma, the value of Ni was $3×10^{10}$ ($cm^{-3}$) or less in the conventional system wherein pure Ar, a typical magnet (~1T class), a power supply of 13.56 MHz and no feedback were used, whereas the Ni was $10^{11}$ ($cm^{-2}$) to be greatly improved to realize a high thin-film deposition rate in this example.

In the conventional system, the value of Ni was about $3×10^{10}$ ($cm^{-3}$) at the most even if a high power of about 2 kW was inputted, although the value of Ni depends on the input power. In addition, in the case of no feedback, the fluctuation in Ni in discharge was in the range of about ±20%.

FIFTH EXAMPLE

The rapid initialization characteristic substantially depends on the value of Vdc, and does not depends on the number of ions being incident on the target, i.e., the value of Ni. Therefore, this preferred embodiment may be applied particularly without increasing the plasma density. An example wherein this preferred embodiment is applied on the condition that the plasma density is less than $10^{11}$ ($cm^{-3}$), e.g., Ni=$4×10^{10}$ ($cm^{-3}$), will be described below.

The medium to be used is the same as that in the above described first example. The recording layer was deposited by a technique using pure Ar, a typical magnet (~1T class), a power supply of 13.56 MHz and no feedback.

On the condition that Vdc=10 Vth, it was possible to obtain an as-deposited recording characteristic, which was far superior to that of a recording medium produced on the conventional condition (typically Vdc>13 Vth) and which was able to be practically used. At this time, the thin-film deposition rate of the recording layer was maintained to be a rate of about 90% of the conventional typical value, so that it was clearly possible to improve the efficiency of the whole process.

In addition, when the value of Vdc was set to be a low value of 2 Vth, the thin-film deposition rate of the recording layer was decreased to about one-eighth of the conventional typical value. Although this increases the costs by eight initializing systems, the effect for reducing the initialization step corresponds to ten initializing systems, so that the efficiency of the whole process is improved.

When the value of Vdc is too close to the value of Vth, the decreased amount of the thin-film deposition rate is more remarkable than the acceleration due to the removal of the initialization step. This balance point may be the condition that the thin-film deposition rate is decreased to one-tenth of the conventional rate. This condition is approximately Vdc=1.7 Vth in this example.

SIXTH EXAMPLE

Then, the material of the recording layer was changed from Ge—Sb—Te to $Ag_8In_{13}Sb_{49}Te_{30}$ (at %), and this preferred embodiment was applied by the same technique as those in the above described examples using Ge—Sb—Te.

As a result, similar to the comparative examples wherein the recording layer was produced in accordance with the conventional method, and similar to the case of Ge—Sb—Te, it was possible to obtain good as-deposited recording characteristics in the whole range of Vth<Vdc≦10 Vth, and it was confirmed that the initialization step reducing effect was greater than the thin-film deposition rate reducing rate to improve the efficiency of the whole process.

While the examples of this preferred embodiment have been described, this preferred embodiment should not be limited thereto.

That is, the film material and thickness of the respective layers, and the methods and conditions for depositing films other than the recording film should not be limited, except that the sputter condition for the recording layer is important for the application of this preferred embodiment. For example, the material of the recording layer may be selected from chalcogen metal compounds, such as Ge—Sb—Te and Ag—In—Sb—Te, and materials suitably containing a very small amount of Cr, V, N or the like, in place of the above described materials.

In addition, in the case of a five-layer film structure, the semitransparent layer may be formed of silver (Ag), copper (Cu), silicon (Si) or a film having a structure wherein fine metal particles are dispersed in a dielectric matrix, in place of Au. In addition, the material of the interference layer may be suitably selected from dielectric film materials, such as $Ta_2O_5$, $Si_3N_4$, $SiO_2$, $Al_2O_3$ and AlN, in place of ZnS—$SiO_2$, and the material of the recording layer may be suitably selected from chalcogen film materials, such as InSbTe, AgInSbTe and GeTeSe, in place of GeSbTe. Moreover, the material of the reflective layer may be suitably selected from Al alloy film materials, such as AlCr and AlTi, in place of AlMo.

Moreover, while the optical disc has been used as an optical recording medium in the above described example, this preferred embodiment should not be limited thereto. For example, this preferred embodiment may be applied to any one of various optical recording media, such as an optical recording card, to obtain the same advantages as those of this preferred embodiment.

According to this preferred embodiment, it is possible to carry out a recording operation at a high CNR immediately from an as-deposited state, so that it is possible to remove an initial crystallizing step from a process for producing a phase change recording medium. As a result, it is possible to reduce the producing costs and to cause phase change recording media to spread widely.

SIXTH PREFERRED EMBODIMENT

The sixth preferred embodiment of the present invention will be described below. In this preferred embodiment, there is provided a method and system for producing a phase change recording medium, wherein a recording layer on a substrate is heated on unique conditions and wherein an initial crystallizing step is omitted.

In order to the above described object, a method for producing a phase change recording medium according to this preferred embodiment is a method for producing a phase change recording medium having a substrate and a recording film deposited thereon, wherein fine nuclei are produced in the recording film by raising the temperature of the recording film to a higher temperature than room temperature while the temperature of the substrate is set to be less than its thermal deformation temperature, while or after the recording film is deposited on the substrate.

On the other hand, a system for producing a phase change recording medium according to this preferred embodiment is a system for producing a phase change recording medium having a substrate and a recording film deposited thereon, which comprises heating means for raising the temperature of the recording film to a higher temperature than room temperature while setting the temperature of the substrate to its thermal deformation temperature, to produce fine nuclei in the recording film.

Alternatively, a system for producing a phase change recording medium according to this preferred embodiment is a system for producing a phase change recording medium having a substrate and a recording film deposited thereon, which comprises means for depositing the recording film on the substrate, and heating means for raising the temperature of the recording film to a higher temperature than room temperature while setting the temperature of the substrate to its thermal deformation temperature, to produce fine nuclei in the recording film.

In this preferred embodiment, the heating means is preferably an infrared ray lamp.

The system further comprises a substrate holder for supporting the substrate, the substrate holder having a contact portion with the substrate, the contact portion being made of a material which does not substantially absorb an infrared ray emitted by heating the lamp.

The basic concept of this preferred embodiment is that while or immediately after the phase change recording layer is deposited, the temperature of the recording layer is raised to crystallize the recording layer or to produce fine nuclei in an amorphous network. Conventionally, when a practical resin substrate was used as a substrate for an optical disc, it was impossible to raise the temperature of a recording layer to a higher temperature than room temperature during and after the thin-film deposition since the thermal deformation temperature of the substrate is lower than the crystallizing temperature of the recording layer.

The inventor found that if the temperature of a recording layer is raised to a lower temperature than the thermal deformation temperature of a substrate during or immediately after the thin-film deposition, it is possible to form nuclei in an amorphous network although it is not possible to completely crystallize the recording layer, and made the first through third inventions.

Moreover, the inventor found that if an infrared ray lamp system capable of rapidly heating and cooling is adopted, it is possible to raise only the temperature of a recording film having a very small thermal capacity in a time to prevent a thermal load to be applied to a substrate having a large thermal capacity, and it is not only possible to form a structure that fine nuclei are scattered in an amorphous network, but it is also possible to form a recording film in a crystalline state, and made the fourth invention.

In addition, the inventor found that if a material, which does not absorb lamp rays, is used as the material of the contact portion of the substrate holder with the substrate in the application of the fourth invention, the thermal deformation of the substrate does not occur even if the lamp heating is carried out for a sufficiently long time in order to crystallize the recording film, and made the fifth invention.

The reason why the initial crystallizing step can be reduced to accomplish the object of this preferred embodiment by the recording film formed in this preferred embodiment, i.e., by the recording film having the structure wherein the fine nuclei are scattered in the amorphous network, will be briefly described. As described above, a recording mark is made of an amorphous material in view of the principle of the phase change recording, and the amorphous part of the recording mark is crystallized by the irradiation with erasing beams for about tens nanoseconds without annealing for a long time, so that it seems that it is not hindered from carrying out a recording operation on an as-deposited amorphous material without passing through the initial crystallizing step. However, it is not actually possible to carry out a recording operation on the as-deposited amorphous material since it is not possible to form a crystal space thereon. On the other hand, once the initial crystallization is carried out, even if the amorphous mark is formed by the irradiation with light, the amorphous mark is rapidly crystallized by the irradiation with erasing beams.

The significant difference between the as-deposited amorphous material and the amorphous material formed by the optical recording operation can not be found by the typical X-ray diffraction or electron beam diffraction. The inventor observed the details of the as-deposited amorphous material and the amorphous part formed by the optical recording operation using a high resolution electron microscope. As a result, no regular structure was particularly observed in the as-deposited amorphous material. On the other hand, a short-range order having a size of about sub-nanometer to about several nm was observed in the amorphous material formed by the optical recording operation. That is, the inventor found that it was possible to rapidly crystallize the amorphous state including the short-range order by promoting the crystallization by the short-range order although it was not possible to rapidly crystallize the as-deposited amorphous part having high randomness and no order.

This preferred embodiment was made on the basis of this finding. That is, according to this preferred embodiment, it is possible to effectively heating the recording layer without damaging the substrate of the phase change recording medium, to form the short-range order capable of causing the rapid crystallization. As a result, it is not required to carry out the initial crystallization, so that it is possible to reduce the producing costs and to cause phase change recording media to spread widely.

In Arrhenius handling, assuming that a crystallizing constant is $\alpha$, a ratio (X) of a crystal region in amorphous material is $x=1-\exp(-\alpha t)$, wherein t is time. In addition, $\alpha$ can be expressed by $\alpha=\upsilon \exp(-Ea/kT)$ using a frequency factor ($\upsilon$) for crystallization and an activation energy (Ea) for crystallization, wherein k is the Boltzmann's constant and T is an absolute temperature. Therefore, it is found that crystallization depends on both temperature and time to proceed and that crystallization gradually proceeds even at room temperature in a long time of tens years.

In this preferred embodiment, the heating time to produce fine nuclei or the heating time for crystallization corresponds to a tact for producing a phase change recording medium, and is several seconds to several minutes. In this time range, fine nuclei are produced at a lower temperature than a crystallizing temperature obtained by a so-called DSC measurement. This can be also analogized by the fact that crystallization is easily carried out by heating at a temperature of about 200 to 300° C. even if the heating is carried out for tens nanoseconds to about hundred nanoseconds by the irradiation with laser beams.

The relationship between the heating time and heating temperature, which was experimentally derived by the inventor, is as follows. That is, when a recording layer having a structure, wherein fine nuclei are scattered in an amorphous material, (which is optically substantially an amorphous state), is formed, the heating temperature is preferably 80 to 90° C. in the case of a heating time of several minutes, 100 to 110° C. in the case of a short heating time of several seconds to about ten seconds, and 120° C. or higher in the case of a heating time of one second or less.

On the other hand, when the recording layer is intended to be crystallized, the heating temperature is preferably 110 to 120° C. in the case of a heating time of several minutes, 130 to 140° C. in the case of a heating time of ten and several seconds, and 150° C. or higher in the case of a heating time of one second or less.

Furthermore, since the migration of sputter particles on the substrate is promoted when heating is carried out during the thin-film deposition, it is preferably to carry out heating during the thin-film deposition since a short-range order is more easily formed than when heating is carried out after the thin-film deposition, i.e., after migration is completed to be solidified, to promote the solid phase diffusion.

The material of the substrate of the phase change recording medium will be described below.

As the substrate of the phase change recording medium, a polycarbonate substrate having a thermal deformation temperature of about 120° C. is typically used. As substrate materials other than polycarbonate, a polymethyl methacrylate (PMMA) or an amorphous polyolefin (PO) may be used as the material of a substrate of an optical disc for optical characteristics. The thermal deformation temperature of PMMA is 85° C. in the case of an injection molded article, and about 100° C. in the case of a cast article. In addition, the thermal deformation temperature of PO is about 130° C. The present invention is effectively applied to a PMMA or PO substrate in place of the polycarbonate substrate.

Moreover, the present invention may also be applied to a new optical disc substrate material which is studied to be adopted in future. When only the recording layer is selectively heated by the infrared ray lamp in this preferred embodiment, it is effective even if the thermal deformation temperature of the substrate is lower than the crystallizing temperature of the recording layer (the standard of which is the DSC measured value), and the infrared ray lamp has the merits of being easy to be produced and of being capable of more rapidly heating and cooling.

Moreover, if the contact portion of the substrate holder with the substrate is made of a material which does not substantially absorb lamp rays emitted from the infrared ray lamp, it is possible to selectively heat the recording layer, so that it is possible to inhibit the thermal deformation of the substrate.

Referring to the accompanying drawings, the examples of this preferred embodiment will be described below.

Figure 27:
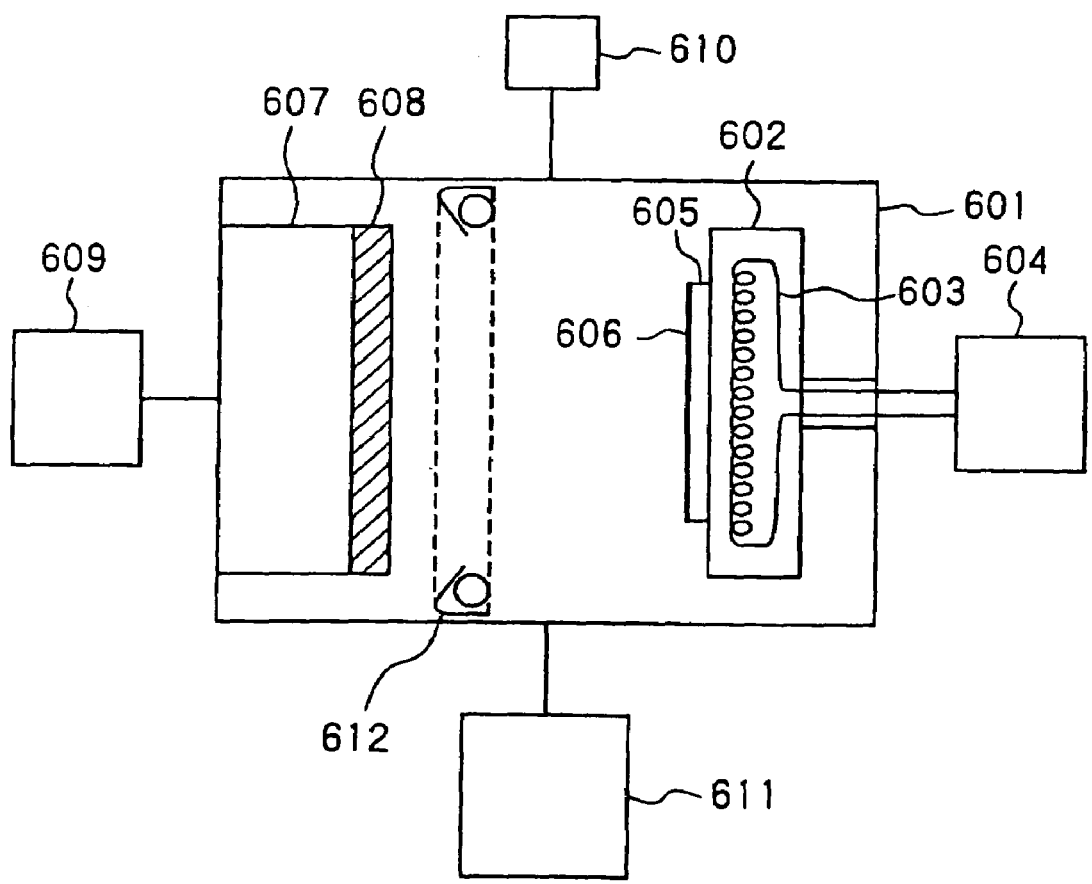
FIG. 27 is a conceptual diagram showing an example of a phase change recording film forming system for use in the sixth preferred embodiment of the present invention.

FIG. 27 is a conceptual diagram showing an example of a phase change recording film forming system for use in this preferred embodiment. In this figure, reference number 601 denotes a thin-film deposition container, 602 denoting a substrate holder, 603 denoting a resistance heater, 604 a heater power supply, 605 denoting an optical disc substrate, 606 denoting a phase change recording film, 607 denoting a sputter source, 608 denoting a GsSbTe target, 609 denoting a sputter power supply, 610 denoting a gas supply system, 611 denoting an exhaust system, and 612 denoting a substrate heating infrared ray lamp.

In the first example of this preferred embodiment, the resistance heater 603 is mainly used for raising the temperature of the recording film in FIG. 27. In the second example of this preferred embodiment, the infrared ray lamp is used for raising the temperature of the recording film. However, both the resistance heater and the infrared ray lamp may be used for raising the temperature of the recording film. In addition, the thin-film deposition container 601 may be a separate batch type container, a batch type container provided in a loading/unloading chamber, or one chamber of a plurality of thin-film deposition containers connected in an inline type or single wafer processing system.

FIRST EXAMPLE

In this example, only the resistance heater 603 is used for raising the temperature of the phase change recording film. Using the above described construction of FIG. 27, this preferred embodiment was applied in accordance with the following procedure. The thin-film deposition container is one chamber of a single wafer processing sputtering system. The polycarbonate substrate 605 is mounted in a front chamber, which is evacuated, and then the substrate 605 is delivered to each of the thin-film deposition containers. Before the recording film 606 is deposited, a first interference film of ZnS—$SiO_2$ is formed on the substrate 5 by a predetermined method. The substrate 5 having the first interference film is delivered to the evacuated thin-film deposition container 601. The substrate 605 and the holder 602 may be moved together or separately.

After the heater 603 is energized to hold the temperature of the substrate to, e.g., 85° C., e.g., Ar gas is supplied from the gas supply system 610 at 200 sccm, and the gas pressure in the container is held to, e.g., 0.25 Pa. Then, when the sputter power supply 609 is turned on to input an RF power to the sputter source 607, a magnetron plasma is produced in the vicinity of the target 608. In a cathode fall formed between the target and the plasma, Ar ions in the plasma are accelerated toward the target to impact on the surface of the target at an energy of hundreds eV. Then, particles of Ge, Sb and Te constituting the target are sputter-emitted, and a GeSbTe film is deposited on the substrate 605 facing the target. Thereafter, a second interference film, e.g., ZnS—$SiO_2$ film, and a reflective film, e.g., an Al alloy film, are sequentially deposited on the substrate delivered to another thin-film deposition container, and the substrate is ejected to atmosphere. It is not required to heat a part of the recording layer other than the thin-film deposited part, at a temperature zone less than the thermal deformation temperature of the substrate.

In this example, the layer structure of the medium was a typical HtoL (high to low) structure wherein the reflectance of a crystalline material is higher than the reflectance of an amorphous material, and the thickness of each of the layers was adjusted so that the reflectance of the amorphous material was 10% and the reflectance of the crystalline material was 35%. These set values were applied in order to verify the effects of this preferred embodiment. This means that the values of reflectance were set so as to be able to obtain stable servo signals when the as-deposited state is an amorphous state. However, this preferred embodiment may be applied to the LtoH structure in place of the structure having the above described values of reflectance.

The phase change recording medium formed by the above described procedure will be hereinafter referred to as a "medium 1 in the first example". That is, the medium 1 in the first example is obtained by heating to a temperature zone less than the thermal deformation temperature of the substrate using the resistance heater 603 during the thin-film deposition of the recording layer. Thus, a plurality of media 1 in the first example were formed while the substrate temperature varies during the thin-film deposition.

Then, by the same procedure as the above described procedure, the substrate is not heated during the thin-film deposition of the recording film, and the heater 603 is energized to heat the substrate for several minutes after the thin-film deposition of the recording layer, so that a phase change recording medium having the same layer structure as that of the above described medium. This will be hereinafter referred to as a "medium 2 in the first example". Also in this case, a plurality of discs were experimentally manufactured using an annealing temperature after the thin-film deposition of the recording film as a parameter.

Then, as a comparative example, a disc having the same layer construction as that of the above described disc was produced without heating the substrate both during and after the thin-film deposition of the recording film. This will be hereinafter referred to as a "comparative medium".

The "medium 1 in the first example", the "medium 2 in the first example" and the "comparative medium", which were obtained in accordance with the above described procedure, were evaluated by the following procedure. First, after the disc ejected from the sputtering system was stuck on a counter blank substrate, the disc was set in a disc evaluating system without carrying out the initial crystallizing step. Then, a signal was recorded at a linear velocity of 8.2 m/sec and a recording bit length of 0.28 µm/bit.

In addition, noise level was measured in order to examine the damage to the substrate due to the heating of the substrate. After the reflectance of the disc was examined before the recording operation, all of the media 1 and 2 in the first example and the comparative media had a value of about 10%, so that it was suggested that the initial state, i.e., the as-deposited state, was macroscopically an amorphous state.

Figure 28:
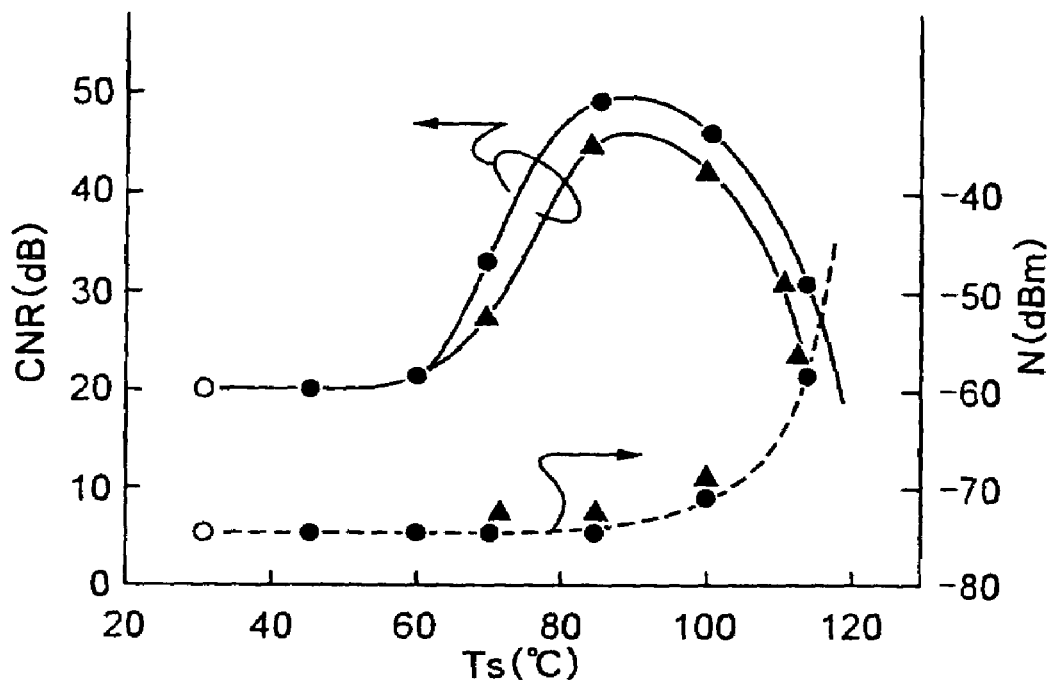
FIG. 28 is a graph showing the evaluated results of discs.

FIG. 28 is a graph showing the evaluated results of the discs. In this figure, white circles denote the evaluated results of the comparative medium, black circles denote the evaluated results of the medium 2 in the first example, and black triangles denote the evaluated results of the medium 1 in the first example. With respect to the noise levels, no increase of noise was observed up to about 80° C. by heating both during and after the thin-film deposition, and the increase of noise was observed from about 100° C. due to the thermal deformation of grooves of the substrate or the increase of the "warp" of the substrate. When the temperature exceeded 120° C. being the thermal deformation temperature of polycarbonate although it was not plotted in the figure, the "warp" was remarkably increased. Thus, the alignment to the counter substrate was not good, or it was not possible to obtain stable servo signals even if the alignment was good, so that it was not possible to evaluate the discs.

The CNR was clearly high from the as-deposited first-recording operation when the recording film is heated during or after the thin-film deposition in accordance with this preferred embodiment. The temperature zone for heating the recording film was preferably in the range of from 70 to 110° C., more preferably in the range of from 75 to 105° C., most preferably about 85° C. Comparing the heating during the thin-film deposition (medium 1) with the heating after the thin-film deposition (medium 2), the CNR was better in the case of the heating during the thin-film deposition. It is considered that the reason for this is that although the phase change recording film formed by this preferred embodiment has the structure wherein the fine nuclei are scattered in the amorphous network as described above, the short-range order is more easily formed when heating is carried out to promote migration while sputter particles migrate on the surface of the substrate during the thin-film deposition, than when heating is carried out to promote the diffusion of a solid phase after the thin-film deposition, i.e., after the migration of sputter particles is completed to solidify the sputter particles.

SECOND EXAMPLE

In this example, the infrared ray lamp 612 was used for heating the recording film without the need of the resistance heater 603 in the construction of FIG. 27. Lamp heating was not continuously carried out. In order to avoid the temperature rise of the substrate holder, "cycle heating" operations for turning the lamp off after the temperature reaches a set temperature and for cooling the temperature to about 50° C. to heat again to the set temperature were repeated three times. By this method, the time for the recording layer to be heated to the set temperature was several seconds to about ten seconds.

In addition, in this example, a substrate holder 602 of a typical SUS member shown in FIG. 27, and a substrate holder of a member absorbing substantially no infrared ray were used.

Figure 29:
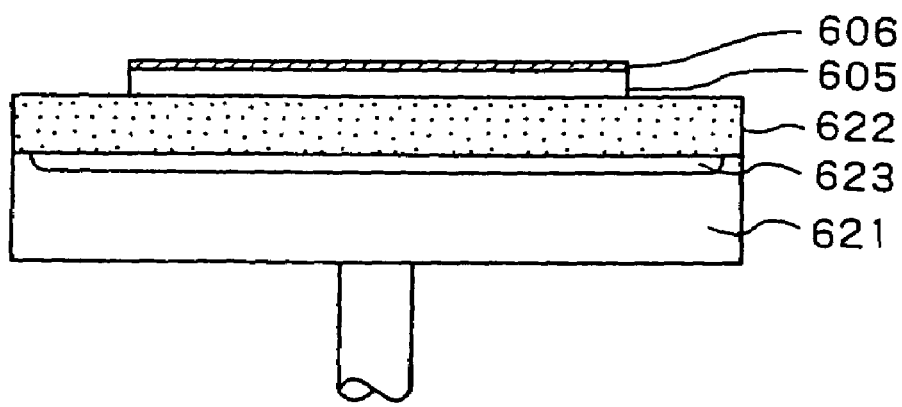
FIG. 29 is a conceptual diagram showing an example of a substrate holder which does not absorb lamp rays.

FIG. 29 is a conceptual diagram showing an example of a substrate holder which does not absorb lamp rays. In this figure, reference number 621 denotes a structural member of SUS, 622 denoting a member of a material which is transparent to infrared rays and which has low absorptivity, 623 denoting an air gap for preventing the heat of the structural member 621, which absorbs infrared rays to be heated, from be transmitted to the transparent member 622, 605 denoting a disc substrate which contacts the transparent member 622 to be mounted thereon, and 606 denoting a predetermined film provided on the substrate 605. The transparent member 622 may be made of a glass member having good workability, such as polycrystalline glass which can be suitable for cutting and sharing process, quartz, alumina, or the like.

Similar to the first example, the temperature of the substrate was set so as to locally work the peripheral portion of the substrate, and the recording layer of the substrate was arranged on the opposite side to the target. In the case of lamp heating, the thermocouple itself directly absorbs lamp rays to be heated so as not to be able to correctly measure temperature. Therefore, a thin-film for substantially reflecting all of lamp rays was provided so as to face the target, in which the thermocouple was inserted. Thus, it is possible to correctly measure the temperature of the recording film.

In order to carry out evaluation, the reflectance of the recording film was first measured. As a result, it was revealed that the value of reflectance was about 30% and the recording film was crystallized when the lamp heating temperature was 140° C. or higher. When the heating temperature was 130° C. or less, the value of reflectance was about 10%, and the state of the recording film was an amorphous state. When the lamp heating temperature was in the range of from 130 to 140° C., the reflectance reflected in partial crystallization was obtained.

Figure 30:
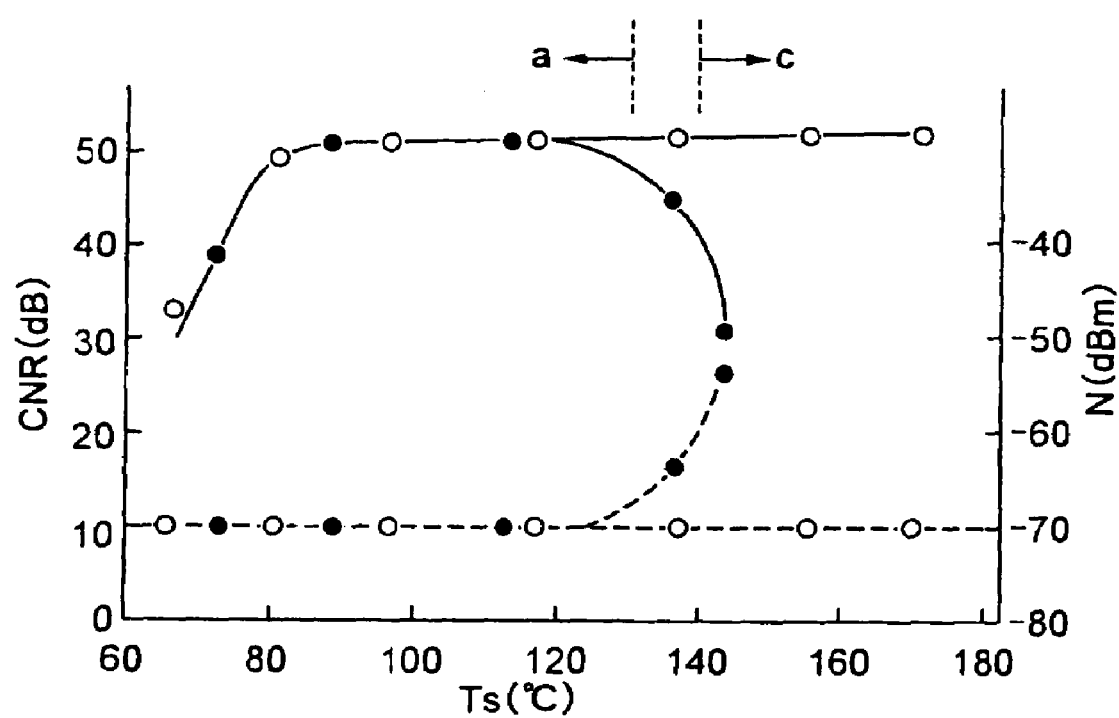
FIG. 30 is a graph showing the evaluated results of the values of CNR and noise levels.

FIG. 30 is a graph showing the evaluated results of the values of CNR and noise levels. In this figure, black circles denote the results when the substrate holder 602 of FIG. 27 was used, and white circles denote the results when the substrate holder shown in FIG. 29 was used. In this example, the noise level tends to rise when the heating temperature is 130° C. or higher. Comparing with data shown in FIG. 28, i.e., with the case where heating is carried out by the resistance heater, is can be seen that the heating temperature for raising the noise level in this example is shifted to a higher temperature.

In the resistance heating, the substrate holder is heated to heat the substrate to heat the recording film. Thus, the thermal deformation of the substrate occurs from a low temperature. On the other hand, since the recording film is directly heated in this example, the thermal deformation of the substrate is remarkably suppressed when heating and cooling are cyclically carried out even if the SUS substrate holder of FIG. 27 is used. Moreover, it can be seen that the thermal deformation of the substrate is remarkably suppressed when only the recording film is selectively heated using the holder of FIG. 29 and when the substrate is not heated (a polycarbonate substrate typically used for an optical disc is transparent to infrared rays).

When the holder of FIG. 27 was used, the increase of the noise level and the decrease of the first CNR due to the deformation of the substrate by heating at 120° C. or higher were observed. When the holder of FIG. 29 was used, the noise level was not increased by heating at 170° C. Similar to the resistance heating shown in FIG. 28, the first CNR was a high value unless the noise level was produced at a temperature of 80° C. or higher, so that the effect of this preferred embodiment was verified.

While the examples of this preferred embodiment have been described, this preferred embodiment should not be limited thereto.

For example, while the four-layer structure, wherein the ZnS—SiO$_2$/GeSbTe/ZnS—SiO$_2$/Al alloy film was deposited on the substrate by sputtering, has been used as the film structure of Rc<Ra of the medium in the above described example, a five-layer structure, wherein an Au semitransparent film is inserted in the four-layer structure, may be used.

In addition, the film material and thickness of the respective layers, and the methods and conditions for depositing films other than the recording film should not be limited, except that the condition for heating the recording layer is important for the application of this preferred embodiment. For example, the material of the recording layer may be selected from chalcogen metal compounds, such as Ge—Sb—Te and Ag—In—Sb—Te, and materials suitably containing a very small amount of Cr, V, N or the like, in place of the above described materials.

In addition, in the case of the five-layer film structure, the semitransparent layer may be formed of silver (Ag), copper (Cu), silicon (Si) or a film having a structure wherein fine metal particles are dispersed in a dielectric matrix, in place of Au. In addition, the material of the interference layer may be suitably selected from dielectric film materials, such as Ta$_2$O$_5$, Si$_3$N$_4$, SiO$_2$, Al$_2$O$_3$ and AlN, in place of ZnS—SiO$_2$, and the material of the recording layer may be suitably selected from chalcogen film materials, such as InSbTe, AgInSbTe and GeTeSe, in place of GeSbTe. Moreover, the material of the reflective layer may be suitably selected from Al alloy film materials, such as AlCr and AlTi, in place of AlMo.

Moreover, while the optical disc has been used as an optical recording medium in the above described example, this preferred embodiment should not be limited thereto. For example, this preferred embodiment may be applied to any one of various phase change optical recording media, such as an optical recording card, to obtain the same advantages as those of this preferred embodiment.

As described in detail above, according to this preferred embodiment, it is possible to carry out a recording operation at a high CNR immediately from an as-deposited state, so that it is possible to remove an initial crystallizing step from a process for producing a phase change recording medium. As a result, it is possible to reduce the producing costs and to cause phase change recording media to spread widely.

SEVENTH PREFERRED EMBODIMENT

The seventh preferred embodiment of the present invention will be described below.

In this preferred embodiment, there is provided a method and system for producing a phase change recording medium, which can increase the storage capacity and stably acquire address signals and servo signals by providing a plurality of recording layers and which can prevent the productivity form being lowered by the initial crystallizing step.

As techniques for improving the recording density of a phase change medium, there are techniques for decreasing the wavelength of a light source, for increasing the NA of an objective lens, for applying a super resolution thin-film and so forth.

As means for improving the storage capacity without the need of the improvement of the recording density, a single-sided double-layer disc is proposed. The single-sided double-layer disc is designed to record and reproduce data on two recording layers, which are apart from the same plane of light beam incidence by about tens μm, by only adjusting the focal point of the light beam, and has substantially the same performance as a single-sided single-layer disc having substantially a double recording density when being viewed from the user, since it is not required to turn the disc over. As a reproduction only DVD, there is known a single-sided double-layer disc which is known as a common name DVD-9. However, it has been considered that since the transmittance of a rewritable DVD is insufficient by one recording layer, light does not sufficiently reach the recording layer arranged at the bottom with respect to the incident side of light beams, so that it is difficult to record and reproduce data.

However, in ISOM (International Symposium optical Memory) '98, Technical Digest, pp. 144-145 (Th—N-05), it has been suggested that it is possible to form a single-sided double-layer even in the case of a rewritable phase change medium. The points of this technique are that the transmittance of a first recording layer part is increased to about 50% so that light sufficiently reaches a second recording layer part arranged at the bottom when the first recording layer part and the second recording layer part are arranged in that order from the incident side of light beams, that the reflectance of the second recording layer part is set to be higher, i.e., the transmittance thereof is set to be lower, in order to maintain the balance of servo signals and regenerative signals from the first and second recording layer parts, and that the absorptivity Ac of the crystal part is set to be higher than the absorptivity Aa of the amorphous part in both of the first and second recording layer parts in order to reduce overwrite jitters.

In order to satisfy the above described setting, the first recording layer part has a three-layer construction which has a so-called HtoL structure, wherein the reflectance Rc of the crystal part is higher than the reflectance Ra of the amorphous part, and which has no reflective film, and the second recording layer part has a five-layer construction which has a thin Au semitransparent film below a so-called LtoH structure, wherein the reflectance Rc of the crystal part is lower than the reflectance Ra of the amorphous part, a thin Au semitransparent film underlying the LtoH structure, and a thin Al—Cr reflective film above the LtoH structure.

In this construction, with respect to the reflectance of each recording layer part viewed from the incident side of light beams, the reflectance of the first recording layer part is 9% of that of the crystal part and 2% of that of the amorphous part, and the reflectance of the second recording layer part is about 3% of that of the crystal part and about 9% of that of the amorphous part. Therefore, if the single-sided double-layer phase change medium is initial-crystallized in accordance with the conventional producing process, the initial reflectance of the address part and data part is about 9% in the first recording layer and about 3% in the second recording layer. This initial reflectance is far lower than, e.g., 15% to 25% of a single-sided single-layer DVD-RAM standard. At the initial reflectance of the first recording layer, it is possible to reproduce address signals and servo signals of the data part somehow if the reproducing power is increased. However, the reflectance of the second recording part is too low, so that it is difficult to reproduce both of address signals and servo signals.

In addition, the common problem of single-sided double-layer media, which are not limited to the above described rewritable media, is that the initial crystallizing step is complicated. That is, if each of the first and second recording layer parts is initial-crystallized, it is required to carry out double steps to obstruct the productivity and producing costs.

This preferred embodiment has been made in view of the above described problems on conventional single-sided double-layer media, and it is an object of this preferred embodiment to provide a method and system for producing a phase change recording medium, which can reproduce good address signals and servo signals and which can solve the problem that the initial crystallizing step is complicated to damage the productivity.

In order to the above described object, according to this preferred embodiment, there is provided a phase change recording medium, which comprises: a first recording layer part for causing a phase change between a crystalline state and an amorphous state by irradiation with light; a separation layer formed on the first recording layer part; and a second recording layer part, formed on the separation layer, for causing a phase change between the crystalline state and the amorphous state by irradiation with light, wherein the state of an address part of at least one of the first and second recording layer parts is an amorphous state having substantially the same randomness as that of an amorphous recording mark of a data part.

Alternatively, there is provided a phase change recording medium, which comprises: a first recording layer part including a first substrate, a first lower interference layer formed on the first substrate, a first recording layer, formed on the first lower interference layer, for causing a phase change between a crystalline state and an amorphous state by irradiation with light, and a first upper interference layer formed on the first recording layer; a separation layer formed on the first upper interference layer; and a second recording layer part including a second lower interference layer formed on the separation layer, a second recording layer, formed on the second lower interference layer, for causing a phase change between the crystalline state and the amorphous state by irradiation with light, a second upper interference layer formed on the second recording layer, and a reflective layer formed on the second upper interference layer, wherein the state of an address part of at least one of the first and second recording layer parts is an amorphous state having substantially the same randomness as that of an amorphous recording mark of a data part.

Moreover, there is provided a method for producing a phase change recording medium, which comprises a first substrate, a first recording layer part, formed on the first substrate, for causing a phase change between a crystalline state and an amorphous state by irradiation with light, a separation layer formed on the first recording layer part, and a second recording layer part, formed on the separation layer, for causing a phase change between the crystalline state and the amorphous state by irradiation with light, wherein the initial crystallization of the first recording layer part and the initial crystallization of the second recording layer part are substantially simultaneously carried out.

In addition, according to this preferred embodiment, there is provided a system for producing a phase change recording medium, which comprises: a first holding part for holding a first substrate, on which a first recording layer part for causing a phase change between a crystalline state and an amorphous state by irradiation with light is deposited; a second holding part for holding a second substrate, on which a second recording layer part for causing a phase change between the crystalline state and the amorphous state by irradiation with light is deposited; a light irradiation part for irradiating the first and second recording layer parts with initial crystallizing light beams for initial-crystallizing the first and second recording layer parts; and an optical system for condensing the initial crystallizing light beams passing through the first recording layer part to irradiate the second recording layer part with the condensed initial crystallizing light beams.

The preferred examples of a phase change recording medium in this preferred embodiment will be described below.
(1) The thermal conductivity of the address part having the amorphous state having substantially the same randomness as that of the amorphous recording marks of the data part is in the range of from 0.8 to 6 W/mK.
(2) In the crystal space of the data part of the recording layer having the address part having a thermal conductivity of 0.8 to 6 W/m, there is the maximum value at each of at least two different grain sizes, in the distribution of the number of crystal particles with respect to the grain sizes.
(3) The amorphous recording marks of the data part in (2) are aligned in a narrower crystal space than the width of a track, each of the aligned marks having a smaller width than the crystal space, and the width of the track being narrower than a laser spot diameter determined by an operating wavelength and the numerical aperture of an objective lens.

The preferred examples of a method for producing a phase change recording medium in this preferred embodiment will be described below.
(1) The initial crystallization is carried out by irradiation with the initial crystallizing light beams, and part of the initial crystallizing light beams for irradiating the first recording layer part is used for initial-crystallizing the second recording layer part.
(2) The method comprises the steps of depositing the first recording layer part on the first substrate, depositing the second recording layer part on the second substrate, and sticking the first and second substrates together via the separation layer, on the sides of the first and second substrates on which the first and second recording layers are deposited, after the initial crystallizing step.

First, a phase change recording medium in this preferred embodiment will be described below.

When the initial state is an as-deposited state, it is generally difficult to carry out a recording operation (formation of a crystal space), so that it is not possible to obtain significant regenerative signals unless the same track is repeatedly overwritten. However, if the technique described in detail in, e.g., the third preferred embodiment, is used, it is possible to obtain significant regenerative signals from the first recording operation even in the as-deposited amorphous state.

If the gist of the technique proposed in the third preferred embodiment is briefly described, it is possible to obtain significant regenerative signals from the first overwrite operation without the need of the initial crystallizing step by causing the as-deposited amorphous state to approach the amorphous recording mark formed by the optical recording operation using laser beams.

In this preferred embodiment, if the above described technique in the third preferred embodiment is applied to a recording layer having the LtoH structure of single-sided double-layer structures, the qualities of address signals and servo signals are greatly improved, and it is not required to carry out the initial crystallizing step, so that the productivity is improved.

By the way, since any data do not written on the address part of the medium by the user, the as-deposited state is maintained even after the overwrite operation. It has been revealed by the inventor's study that the thermal conductivity of the amorphous state in the address part of at least one of the first and second recording layer parts in this preferred embodiment is in the range of from 0.8 to 6 W/mK.

It has also been revealed that the crystal space of the data part has the maximum value in each of at least two different grain particles in the distribution of the number of crystal grains with respect to grain sizes, and the amorphous recording marks are aligned in the crystal space, each of the aligned marks having a width which is not greater than that of the crystal space, the width of a track being narrower than a laser spot diameter determined by an operating wavelength and the numerical aperture of an objective lens.

When a single-sided double-layer phase change recording medium disclosed in the above described ISOM (International Symposium on Optical Memory) '98, Technical Digest, pp. 144-145 (Th—N-05) is applied to this preferred embodiment, only the application to the second recording layer part is effective, and the first recording layer part passes through the initial crystallizing step similar to the conventional method. However, this preferred embodiment should not be limited thereto. For example, there can be applied a producing method, wherein when the first recording layer part uses a medium having the LtoH structure having high transmittance, the initial state of the first recording layer part can also be an amorphous state, and when the first recording layer part uses the LtoH structure having high transmittance and when the second recording layer part uses the HtoL structure having high transmittance, only the initial state of the first recording layer part can be an amorphous state, and the second recording layer part passes through the initial crystallizing step similar to the conventional method.

In either case, the stability of address signals and servo signals of the recording layer part having the LtoH structure is not only ensured. When only one of the first and second recording layer parts has the LtoH structure, the initial crystallizing step is also the same as that of the conventional single-sided single-layer disc, and when both the first and second recording layer parts have the LtoH structure, the producing process is more simplified than the conventional process, so that the productivity it improved to reduce the producing costs.

Although the recording layer having the as-deposited amorphous state in this preferred embodiment is particularly effective in the recording layer having the LtoH structure, it may be applied to the recording layer having the HtoL structure.

A method and system for producing a phase change recording medium in this preferred embodiment will be described below. In this preferred embodiment, the producing method is characterized by the initial crystallization of a phase change recording medium. In particular, in the case of the HtoL structure, there is an advantage in that if the initial crystallization is carried out, the reflectance of the initial state of the address part and data part is enhanced so that the stability of servo is good.

First, the first recording layer part is deposited on the first substrate, and the second recording layer part is separately deposited on the second substrate. The first and second substrates are held in the first and second holding parts in the producing system in this preferred embodiment.

The producing system for carrying out the initial crystallization has a light irradiation part for irradiating with initial crystallizing light beams, and an optical system for condensing the initial crystallizing light beams passing through the first recording layer part to irradiate the second recording layer part with the condensed initial crystallizing light beams. Although the light beams emitted form the light irradiation part are first incident on the first recording layer part to initial-crystallize the first recording layer part, part of the beams passes through the first recording layer part to diverge. The diverging beams are condensed again by the optical system, and the second recording layer part is irradiated with the condensed beams, so that the second recording layer part is initial-crystallized substantially at the same time that the first recording layer part is initial-crystallized.

After the initial crystallization is completed, the first recording layer part deposited side of the first substrate is stuck on the second recording layer part deposited side of the second substrate via the separation layer to accomplish a phase change recording medium.

By adopting such an initial crystallizing step, it is enough to carry out only one initial crystallizing step, so that the producing process is simplified and the productivity is not damaged.

Furthermore, a producing method and system in this preferred embodiment may be applied to both the HtoL structure and the LtoH structure.

Referring to the accompanying drawings, the examples of this preferred embodiment will be described below.

FIRST AND SECOND EXAMPLES

FIGS. 31 and 32 are schematic sectional views showing two examples of a phase change optical disc serving as a phase change recording medium in the first and second examples in this preferred embodiment. In FIGS. 31 and 32, the same reference numbers are used for members having the same functions.

In FIGS. 31 and 32, the recording and/or reproducing light beams are radiated from the lower side of the figures. In both FIGS. 31 and 32, reference number 701 denotes a first recording layer part, 702 denoting a second recording layer part, 731 denoting a first substrate, 732 denoting a second substrate, and 704 denoting a separation layer for separating the first recording layer part from the second recording layer part.

The film structures of the first recording layer part 701 and the second recording layer part 702 in FIG. 31 are different from those in FIG. 32.

In FIG. 31, the films constituting the first recording layer part 701 include a first lower interference layer 711, a first recording layer 712 and an upper interference layer 713, in that order from the light beam incident side, and the films constituting the second recording layer part 702 include a semitransparent layer 721, a second lower interference layer 722, a second recording layer 723, a second upper interference layer 724 and a reflective layer 725, in that order from the light beam incident side.

On the other hand, in FIG. 32, the films constituting the first recording layer part 701 include a first lower interference layer comprising three layers of a lower interference layer 714, a lower interference layer 715 and a lower interference layer 716, a first recording layer 717 and a first upper interference layer 718, and the films constituting the second recording layer part 702 include a second lower interference layer 726, a second recording layer 727, a second upper interference layer 728 and a reflective layer 729.

In the disc of FIG. 31, the first recording layer part 701 has the HtoL structure, and the second recording layer part 702 has the LtoH structure. In the disc of FIG. 32, the first recording layer part 701 has the LtoH structure, and the second recording layer part 702 has the HtoL structure.

The discs of FIGS. 31 and 32 were produced by, e.g., the following procedure.

The first substrate 731 of polycarbonate having tracking grooves and a pre-pit header part and having a thickness of, e.g., 0.58 mm, and the second substrate 732 of polycarbonate having a thickness of, e.g., 0.6 mm, can be produced by a typical optical disc substrate producing process.

The formation of films on the first substrate 731 is carried out by, e.g., the following procedure.

In the disc of FIG. 31, the first substrate 731 is mounted in a substrate holder of a magnetron sputtering system, and evacuation is carried out. Then, in a sputter chamber wherein a ZnS—$SiO_2$ target is mounted in a sputter source, the target is sputtered in, e.g., an atmosphere of Ar gas plasma at 0.4 Pa, to form the first lower interference layer 711 having a mean thickness of, e.g., 80 nm. Subsequently, in a sputter chamber having a GeSbTe target, the target is sputtered in, e.g., an atmosphere of Ar gas plasma at 0.4 Pa, to form the first recording layer 712 having a mean thickness of 7 nm. Then, in the sputter chamber wherein the ZnS—$SiO_2$ target is mounted in the sputter source, the target is sputtered in, e.g., an atmosphere of Ar gas plasma at 0.4 Pa, to form the first upper interference layer 713 having a mean thickness of 30 nm to eject the substrate from the sputtering system.

Subsequently, the second substrate 732 is mounted in a sputtering system to form the reflective layer 725 of Au having a mean thickness of 10 nm in, e.g., an atmosphere of Ar gas plasma at 0.4 Pa. Subsequently, the second upper interference layer 724 of ZnS—$SiO_2$ having a mean thickness of 25 nm is formed in, e.g., Ar gas plasma at 0.1 Pa. Then, the recording layer 723 of GeSbTe having a mean thickness of 12 nm is formed in, e.g., an atmosphere of Kr gas plasma at 4 Pa. Subsequently, the second lower interference layer 722 of ZnS—$SiO_2$ having a mean thickness of 85 nm is formed in, e.g., an atmosphere of Ar gas plasma at 0.1 Pa. Finally, the semitransparent layer 721 of Au having a mean thickness of 8 nm is formed in, e.g., an atmosphere of Ar gas plasma at 0.4 Pa. Then, the substrate is ejected from the sputtering system.

The first and second substrates 731 and 732, on which the films have been thus formed, are stuck together so that the first and second recording layer parts 701 and 702 formed on the first and second substrates 731 and 732, using a transparent adhesive sheet or a UV-curing adhesive layer at a spacing of 40 μm to form the separation layer 704 to obtain the disc of FIG. 31 in the first example.

The disc of FIG. 32 was produced by, e.g., the following procedure.

The first substrate 731 is mounted in a substrate holder of a magnetron sputtering system, and evacuation is carried out. Then, in a sputter chamber wherein a ZnS—SiO$_2$ target is mounted in a sputter source, the target is sputtered in, e.g., an atmosphere of Ar gas plasma at 0.4 Pa, to form the lower interference layer 714 having a mean thickness of, e.g., 60 nm. Subsequently, in a sputter chamber wherein a SiO$_2$ target is mounted, the target is sputtered in, e.g., an atmosphere of Ar gas plasma at 0.4 Pa, to form the lower interference layer 715 having a mean thickness of 100 nm. Then, in the sputter chamber wherein the ZnS—SiO$_2$ target is mounted in the sputter source, the target is sputtered in, e.g., an atmosphere of Ar gas plasma at 0.1 Pa, to form the lower interference layer 716 having a mean thickness of 60 nm. Thus, the first lower interference layer comprising the lower interference layer 714, the lower interference layer 715 and the lower interference layer 716 is produced. Subsequently, in a sputter chamber wherein a GeSbTe target is mounted, the target is sputtered in, e.g., an atmosphere of Kr gas plasma at 8 Pa, to form the second recording layer 717 having a mean thickness of 8 nm. Then, in a sputter chamber wherein a ZnS—SiO$_2$ target is mounted in a sputter source, the target is sputtered in, e.g., an atmosphere of Ar gas plasma at 0.1 Pa, to form the first upper interference layer 718 having a mean thickness of 40 nm to eject the substrate from the sputtering system.

On the second substrate 732, the reflective layer 729 of Au having a mean thickness of 10 nm is formed in, e.g., an atmosphere of Ar gas plasma at 0.4 Pa. Subsequently, the second upper interference layer 728 of ZnS—SiO$_2$ having a mean thickness of 25 nm is formed in, e.g., Ar gas plasma at 0.4 Pa. Then, the second recording layer 727 of GeSbTe having a mean thickness of 12 nm is formed in, e.g., an atmosphere of Ar gas plasma at 0.4 Pa. Subsequently, the second lower interference layer 722 of ZnS—SiO$_2$ having a mean thickness of 85 nm is formed in, e.g., an atmosphere of Ar gas plasma at 0.4 Pa to eject the substrate from the sputtering system.

The first and second substrates 731 and 732, on which the films have been thus formed, are stuck together so that the first and second recording layer parts 701 and 702 formed on the first and second substrates 731 and 732, using a transparent adhesive sheet or a UV-curing adhesive layer at a spacing of 40 μm to form the separation layer 704 to obtain the disc of FIG. 32 in the second example.

PROCESS IN FIRST AND SECOND EXAMPLES

The above described thin-film deposition process is characterized by a process for depositing the upper and lower interference layers, between which the recording layer having the LtoH structure and the recording layer are sandwiched. As described above, the high pressure sputtering of the recording layer with the heavy rare gas and the low pressure sputtering of the upper and lower interference layers are important in order to ensure the recording characteristic from the first recording operation while the initial state of the recording film is maintained to be an as-deposited amorphous state. These thin-film deposition processes are basically characterized by the control of the cooling rate when the sputter particles are cooled on the surface of the substrate.

With respect to a technique for recording on the as-deposited amorphous state without the need of the initializing step, a basic idea will be described below. This amorphous state is a substantially amorphous state, and means an optically amorphous state. For example, this state means a state wherein the light reflectance, which is important as the characteristic of the recording medium, is closer to the reflectance of the amorphous mark than the reflectance of the crystal space.

The recording layer for use in a phase change recording operation is typically deposited by a sputtering method, and the state of the recording layer is an amorphous state immediately after the deposition thereof. The sputtering method is a technique for producing a predetermined film by allowing gaseous-phase sputter particles, which are sputter-emitted from the surface of a target by a high-energy Ar ion bombardment, to arrive at the surface of a substrate at random to migrate the surface in a liquid-phase random state, and thereafter, by allowing the state of the phase to be a solid phase serving as a film.

The transition rate of a sputter particle from a gaseous phase to a solid phase is typically about $10^{12}$ K/sec. That is, it is guessed that the time required for a random state of several eV (tens of thousands K) to be changed to a solid phase at room temperature is about 10 nanoseconds, and that the time required to pass through a temperature zone between a melting point and a crystallizing temperature is about 1 nanosecond at the most.

On the other hand, the time to crystallize a GeSbTe or InSbTe recording film is tens nanoseconds. The condition for allowing a film to be crystallized is that the time to crystallize the film is shorter than the crystallization holding time, so that the state of the recording layer immediately after the sputter deposition is an amorphous state.

This amorphous state immediately after the thin-film deposition is different from the amorphous state formed by the optical recording operation. Because the cooling rate during the optical recording operation is typically about $10^{10}$ K/sec, which is smaller than the cooling rate in a sputter deposition process by about two digits, although it depends on the linear velocity and the layer structure of the disc. If the amorphous state immediately after the sputter deposition has the same quality as that of the amorphous state formed by the optical recording operation, it is possible to carry out the recording and/or reproducing operation without passing through the initial crystallizing step. Since the amorphous state immediately after the sputter deposition is actually different from the amorphous state formed by the optical recording operation due to the difference in cooling rate, it is difficult to carry out a recording operation from the first time unless the initial crystallizing step is carried out, in the case of both the disc of Rc>Ra and the disc of Rc<Ra.

A method for forming a phase change recording medium of Rc<Ra in the first and second examples, i.e., a phase change recording medium having a LtoH disc, is a method capable of recording from the first recording operation without passing through the initial crystallizing step.

A concrete method for achieving this method is to lower the cooling rate of sputter particles in the sputter process to cause the amorphous state immediately after the thin-film deposition to approximate to the amorphous state formed by the optical recording operation, or to apply a compressive stress to the recording layer immediately after the sputter deposition to allow the recording layer to be easily crystallized, or a combination thereof.

In order to cause the amorphous state immediately after sputtering to approximate to the amorphous state formed by the optical recording operation, there may be used a method for increasing the energy of sputter particles being incident on the substrate, or a method for increasing the time for surface migration. According to the inventor's study, the difference in cooling rates from a molten state is reflected in randomness. That is, as the cooling rate is higher, randomness is higher to form a completely amorphous state. However, when the cooling rate is low, there is provide a structure wherein fine nuclei are scattered and which microscopically has a short-range order although it is macroscopically random. That is, the cooling rate of the amorphous state formed during the optical recording operation is low, such a fine crystal structure is provided. Also in the as-deposited amorphous state, if it is possible to form such a fine crystal structure, i.e., if it is possible to form substantially the same randomness as that of the amorphous recording marks formed by the optical recording operation, it is possible to carry out a recording operation from the first time. The reason for this is that fine nuclei serve as seeds for crystal growth, so that crystallization sufficiently proceeds unlike a pure amorphous state having no seed for crystal growth.

Furthermore, the expression "substantially the same randomness" means randomness that particularly significant crystal peaks are not detected by a typical X-ray diffraction for evaluating crystallinity and crystal structure, and the size distribution of fine nuclei providing a regular atomic arrangement of less than several nm, typically about 0.5 to 4 nm, is defined in the range of about ±50%. The "size distribution" is expressed by the mean grain size and grain size dispersion. In addition, the "grain size" means a mean of the longest diameter and shortest diameter of a crystal grain.

As a method for examining the distribution of fine nuclei, there is adopted, e.g., a method for sampling a recording layer part of a disc from the surface of the disc at random to observe a region several μm square by a high resolution electron microscope.

In addition, the "short-range order" means the order of regular atomic arrangement existing in a region of less than several nm, typically about 0.5 to 4 nm.

As a method for forming such a randomness, there is first mentioned a method for decreasing energy of sputter particles being incident on a substrate. In this method, there are a plurality of methods. Each of these methods will be described below.

The first method is a method for causing the relationship between a voltage Vdc applied to a target and a sputter threshold voltage Vth of a target constituting element to meet the condition of Vth<Vdc≦10 Vth when a recording layer is deposited on a substrate by sputtering. By meeting this condition, a fine crystal structure is also formed in an as-deposited amorphous state.

The detailed description of this point is omitted since it has been described in detail with respect to the above described fifth preferred embodiment.

The second method will be described below. While or after a recording layer is deposited on a substrate, if the recording film is heated to a higher temperature than room temperature while the temperature of the substrate is maintained to a lower temperature than the thermal deformation temperature thereof, the surface migration time increases, so that fine nuclei are produced in the recording film.

This point has been described in detail in the above described sixth preferred embodiment.

EVALUATION OF FIRST AND SECOND EXAMPLES

Referring to FIGS. 31 and 32 again, descriptions will continue. The phase change optical discs shown in FIGS. 31 and 32 were evaluated by an optical disc tester after the HtoL structure part was treated by a typical initial crystallizing process while the as-deposited amorphous state of the LtoH structure part is maintained. The evaluation conditions include a laser wavelength of 650 nm, a NA of an objective lens of 0.6, a linear velocity of 8.2 m/s, a shortest bit length of 0.31 μm/bit, and a track pitch of 0.6 μm as described above.

In both discs of FIGS. 31 and 32, the reflectance of two recording layer parts in an unrecorded state was about 10%. Although this reflectance is slightly smaller than that of the current DVD-RAM standard, practically sufficient address signals and servo signals were obtained by setting regenerative signals to be slightly high or the like. In addition, the jitter value after an overwrite operation was a good value, about 10%, in both the two recording layers of the discs of FIGS. 31 and 32.

COMPARATIVE EXAMPLES WITH FIRST AND SECOND EXAMPLES

For comparison, media obtained by forming the LtoH parts of FIGS. 31 and 32 by a typical sputtering process were prepared, and the same evaluation as the above described evaluation was carried out. Although a high reflectance of about 10% was obtained from the LtoH parts of both media, the jitter value after the overwrite operations tens times was 15% which was not a practical value. It is considered that the recording layer formed by a typical sputter process does not have fine nuclei having a high randomness and a short-range order, so that it is difficult to form a crystal space and it is not possible to obtain a significant jitter characteristic by carrying out overwrite operations only tens times. In addition, for comparison, the LtoH part formed by the above described typical sputter process was initial-crystallized. As a result, the initial reflectance was a very low value of about 2 to 3, so that the quality of address signals and the stability of servo were considerably deteriorated.

MODIFIED EXAMPLES OF FIRST AND SECOND EXAMPLES

In modified examples of a phase change optical disc which has a LtoH recording layer formed by the sputtering process in the first and second examples and which is simply produced at lower producing costs, the LtoH recording layer parts of FIGS. 31 and 32 have a two-layer laminated structure. That is, both the first and second recording layers are most preferably produced by the sputtering process in the first and second examples to carry out a recording operation on both layers from the as-deposited amorphous state without passing through the initial crystallizing step.

The disc having the LtoH recording layer parts as the first and second recording layer parts can be obtained by, e.g., combining the LtoH recording layer parts of FIGS. 31 and 32. In this case, after the first and second recording layer parts are deposited, both the recording layer parts can be actually operated without passing through the initial crystallizing step.

The experimentally manufactured discs having the LtoH recording layer parts as both the recording layer parts were evaluated at a laser wavelength of 650 nm, a NA of an objective lens of 0.6, a linear velocity of 8.2 m/s and a shortest bit length of 0.31 μm/bit. The track pitch is 0.6 μm similar to the above described case. The reflectance of two recording layer parts in an unrecorded state was about 10%. Although this reflectance is slightly smaller than that of the current DVD-RAM standard, practically sufficient address signals and servo signals were obtained by setting regenerative signals to be slightly high or the like. In addition, the jitter value after an overwrite operation was a good value, about 10%, in both the two recording layers.

Third Example

The third example of this preferred embodiment will be described below. This example relates to a method for initial-crystallizing a phase change optical disc having recording layer parts having the HtoL structure as first and second recording layer parts, and a producing system for carrying out the initial crystallization. Although this example is technically different from the above described examples, there are the same advantages in that it is possible to improve the stability of address signals and servo signals and it is possible to prevent the producing process from being complicated to reduce the producing costs.

Figure 33:
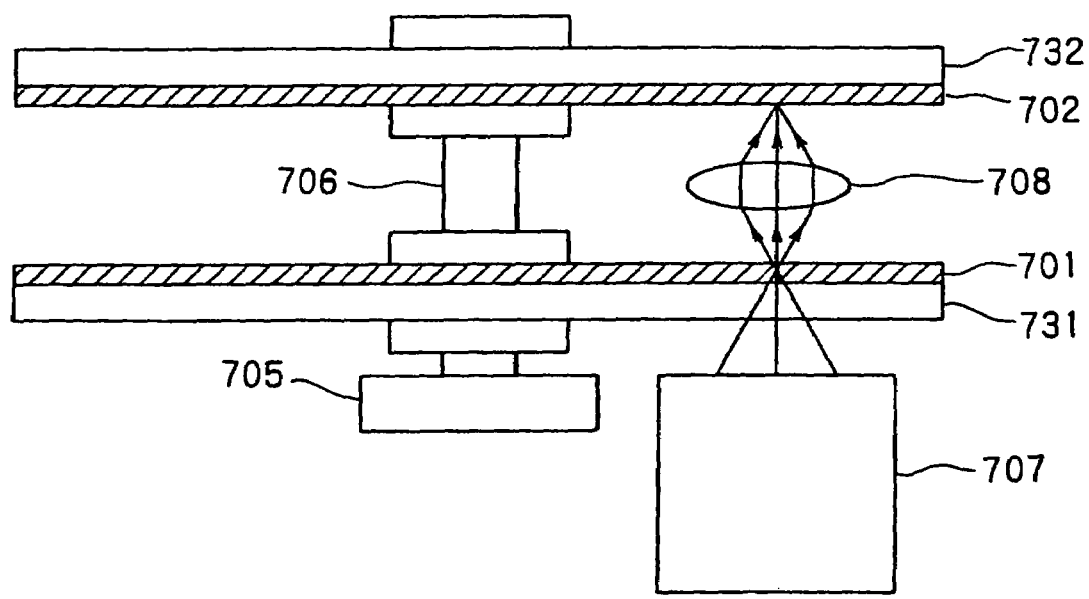
FIG. 33 is a schematic sectional view of a producing system for initial-crystallizing a third example of the seventh preferred embodiment of a phase change optical disc according to the present invention.

FIG. 33 is a schematic sectional view of a producing system for initial-crystallizing a third example of a phase change optical disc in this preferred embodiment.

In FIG. 33, reference number 701 denotes a first recording layer part deposited on a first substrate 731, 702 denoting a second recording layer part deposited on a second substrate 732, 705 denoting a spindle motor serving as first and second holding parts for holding the first and second substrates for rotating a disc, 706 denoting a motor shaft of the spindle motor 705, 707 denoting a light irradiation part for irradiating with an initial crystallizing light beam, and 708 denoting a convergent lens as an optical system. The light irradiation part 707 is usually called an initializing system. The first and second holding parts may be separately provided.

The first recording layer part 701 and the second recording layer part 702 preferably have the HtoL structure. For example, the first recording layer part 701 may be the first recording layer part 701 of FIG. 31, and the second recording layer part 702 may be the second recording layer part 702 of FIG. 32. The first substrate 731 and the second substrate 732 may be the same as those in the first and second examples.

Using the system of FIG. 33, a disc may be produced by the following procedure. First, the first substrate 731 having the first recording layer part 701 produced by the typical sputtering process, and the second substrate 732 having the second recording layer part 702 produced by the typical sputtering process are coaxially mounted on the shaft 706 of the spindle motor 705 of the system of FIG. 33.

Then, the spindle motor 705 is driven to rotate the first and second substrates 731 and 732 at a linear velocity of, e.g., about 2 m/s, and the light irradiation part 707 is driven to irradiate the first recording layer part 701 with initial crystallizing light beams extending in a radial direction of the disc. About 50% of the irradiation beam passes through the first recording layer part 701 to diverge. This diverging beam has not been utilized in the conventional initial crystallizing step. According to this example, the beam passing through the first recording layer part 701 to diverge is condensed again by the convergent lens 708 provided between the first and second substrates 731 and 732 to irradiate the second recording layer part 702 with the condensed beam.

The initial crystallizing light beam is an elliptical broad beam having a length of hundreds μm in a radial direction of the disc and a length of several μm in a circumferential direction of the disc. Therefore, even if the first and second substrates 731 and 732 are warped, it is possible to apply sufficiently high initial crystallizing energy.

The focal length of the convergent lens 708 is set to be about half of the distance between the first substrate 731 and the second substrate 732. Although the shape of the lens may be a typical point-symmetrical convex lens shape, it is preferably a semicylindrical shape wherein the curvature of an initial crystallizing light beam in a direction of the major axis is smaller than the curvature thereof in a direction of the minor axis, in order to cause the beam profile on the first recording layer part 701 to be coincident with the beam profile on the second recording layer part 702.

If necessary, the convergent lens 708 may be moved vertically by means of a voice coil motor or the like.

After both of the recording layer parts are thus substantially simultaneously initial-crystallized by the same light beam, if both are stuck together by the above described typical sticking process, the disc in this example is obtained. Of course, the reflectance of the disc surface and the recording characteristics are the same as those of the HtoL recording layer parts in the above described first and second examples.

MODIFIED EXAMPLE OF THIRD EXAMPLE

Another method for substantially simultaneously initial-crystallizing both of the recording layer parts is a method for providing two light heads having different focal points serving as the light irradiation part in the system. The first recording layer part is irradiated with an initial crystallizing light beam emitted from the first head to be initial-crystallized, and the second recording layer part is irradiated with an initial crystallizing light beam emitted from the second head to be initial-crystallized.

While the examples of this preferred embodiment have been described, this preferred embodiment should not be limited thereto.

For example, while the material of the recording layer has been GsSbTe in the above described examples, the material of the recording layer may be selected from InSbTe, AgInSbTe, GeTeSe, SnSeTe, GeSeSn and InSeTl, in place of GeSbTe. In addition, a very small amount of at least one selected from the group consisting of Co, Pt, Pd, Au, Ag, Ir, Nb, Ta, V, W, Ti, Cr and Zr may be added to the above described materials to obtain good characteristics as a recording layer. Moreover, a very small amount of a reducing gas, such as nitrogen, may be added thereto.

The mean thickness $t_0$ of the first recording layer is preferably in the range of from 5 nm to 20 nm in order to ensure the minimum light absorption and the light transmittance of the second recording layer and subsequent recording layers. In addition, the mean thickness $T_n$ of the second recording layer and subsequent recording layers preferably meets the relationship of $T_n \geq T_{n-1}$ in order to maintain the same advantages.

In addition, the separation layer is preferably made of a transparent material having an extinction coefficient k of 0.1 or less with respect to a light source wavelength, in order to cause the energy loss of the light beam to be minimum. Such materials may be suitably selected from resin materials, such as polymethyl methacrylate and polycarbonate, oxides, such as $SiO_2$, $Al_2O_3$, TaO, $V_2O_5$, CaO, $ZrO_2$, $Pb_2O_3$, $SnO_2$, CoO, CuO, $Cu_2O$, AgO, ZnO and $Fe_2O_3$, nitrides, such as $Si_3N_4$, SiON and SiAlON, and fluorides, such as $MgF_2$ and $CaF_2$, in addition to UV-curing resins. In order to separate the recording layer at a greater depth than the focal depth of the light beam, the mean thickness of the separation layer must be 10 μm or more. Therefore, an application type resin material suitable for the production of a film having such thickness is more preferably selected. If necessary, these materials may be used as a mixture or lamination. In addition, if the mean thickness of the separation layer is too great, the transmittance of the separation layer and the focal depth with respect to two or more recording layers are not desired, so that the mean thickness of the separation layer is preferably 50 μm or less.

In addition, the semitransparent film may be formed of Ag, Cu, Si or a film having a structure wherein fine metal particles are dispersed in a dielectric matrix. Similar to the above described Au, in the case of Ag or Cu, the mean thickness of the semitransparent film is preferably in the range of from 3 to 20 nm, more preferably in the range of from 5 to 15 nm, with respect to an operating wavelength of, e.g., 650 nm. In the case of Si, the mean thickness of the semitransparent film is preferably in the range of from 10 to 80 nm, more preferably in the range of from 30 to 60 nm. In the case of the film having the structure wherein the fine metal particles are dispersed in the dielectric matrix, the mean thickness of the semitransparent film is preferably set to be (5-20)/q (nm) in the range of $0.25 \leq q \leq 0.75$ assuming that the content of the fine metal particles by volume in the film is q. By adopting the above described mean thickness, it is possible to improve the efficiency for light utilization of the second recording layer part, so that it is possible to carry out a high sensitive recording operation even by a low intensity of light passing through the first recording layer part. In addition, since the ratio of the light absorption coefficient of the crystal space in the second recording layer part to the light absorption coefficient of the amorphous recording mark can be set to be in the range of from 1 to 1.5, the overwrite jitter can be effectively reduced. In addition, since the reflectance of the second recording layer part can be set to be high, there is also an advantage in that the quantity of light passing through the first recording layer part to be reflected on the second recording layer part is increased.

The reflective layer may be formed of, e.g., AlTi, TiN, AlMo, AlCu, Ag, Cu, Pt, Pd or Ir. The mean thickness of the reflective layer is preferably in the range of from 20 to 200 nm in order to ensure the reflectance thereof and the cooling rate.

The extinction coefficient k of the interference layer is preferably 0.5 or less in order to cause light to be absorbed by the recording layer. The material of the interference layer may be selected from $ZnO$, $Ta_2O_5$, $SiO$, $Al_2O_3$, $Cu_2O$, $CuO$, $TaO$, $Y_2O_3$, $ZrO_2$, $CaF_2$, $MgF_2$, $Si_3N_4$, $AlN$ and mixtures thereof. In order to ensure the transmittance, the mean thickness of the interference layer is preferably 300 nm or less.

In addition, while the phase change optical disc has been described in the above described examples, this preferred embodiment should not be limited thereto, but it may be applied to any one of various phase change recording media, such as an optical recording card and an optical magnetic tape.

As described in detail above, according to this preferred embodiment, it is possible to provide a phase change recording medium capable of reproducing good address signals and servo signals, and it is possible to provide a method and system for producing a phase change recording medium, which can solve the problem that the initial crystallizing step is complicated to deteriorate the productivity.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

The entire disclosure of Japanese Patent Applications No. H10-181156 filed on Jun. 26, 1988 and No. H11-088010 filed on Mar. 30, 1999 including specifications, claims, drawings and summaries are incorporated herein by reference in their entirely.

What is claimed is:

1. A phase change recording medium comprising:
   a substrate;
   a first recording layer disposed on the substrate is in the as-deposited states with areas of recording marks formed by as-deposited recording and crystalline areas which have undergone erasure and configured to undergo a reversible phase change between written amorphous and crystalline states due to light irradiation and thereby change an optical characteristic,
   wherein said first recording layer includes in the amorphous state and in an as-deposited state an amorphous medium without crystalline order and has dispersed therein a plurality of fine nuclei having an average size of 0.5 nm to 4 nm, and
   wherein said first recording layer in an irradiation area exposed to an erasing light beam is in the crystalline state and has a crystal part including a plurality of first crystal grains surrounded by second crystal grains that result from growing the plurality of fine nuclei and having a size of 20 to 100 nm, the first crystal grains being relatively larger than the second crystal grains, the second crystal grains having a size of 4 to 20 nm, and the first crystal grains being evenly distributed throughout said erased areas of said first recording layer among the second crystal grains.

2. A phase change recording medium according to claim 1, wherein in the irradiation area exposed to the erasing light, the crystal part has a crystal grain size distribution having at least two maxima.

* * * * *